(12) United States Patent
Subramanian et al.

(10) Patent No.: US 12,248,848 B2
(45) Date of Patent: Mar. 11, 2025

(54) SCALABLE GATE CONTROL IN QUANTUM CIRCUIT ASSEMBLIES

(71) Applicant: Intel Corporation, Santa Clara, CA (US)

(72) Inventors: Sushil Subramanian, Hillsboro, OR (US); Stefano Pellerano, Beaverton, OR (US); Ravi Pillarisetty, Portland, OR (US); Jong Seok Park, Hillsboro, OR (US); Todor M. Mladenov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 17/340,173

(22) Filed: Jun. 7, 2021

(65) Prior Publication Data

US 2022/0391738 A1    Dec. 8, 2022

(51) Int. Cl.
*G06N 10/00* (2022.01)
*H03M 1/66* (2006.01)

(52) U.S. Cl.
CPC .............. *G06N 10/00* (2019.01); *H03M 1/66* (2013.01)

(58) Field of Classification Search
CPC ....................................................... G06N 10/00
USPC ......................................................... 716/118
See application file for complete search history.

(56) References Cited

U.S. PATENT DOCUMENTS 10,635,990 B1 * 4/2020 Park ....................... G06N 10/00

OTHER PUBLICATIONS

Park, Jong-Seok et al, "A Fully Integrated Cryo-CMOS SoC for Qubit Control in Quantum Computers Capable of State Manipulation, Readout and Hihg-Speed Gate Pulsing of Spin Qubits in Intel 22nm FFL FinFET Technology", 2021 IEEE International Solid-State Circuits Convention, ISSCC 2021/Session 13/ Cryo-CMOS for Quantum Computing, Digest of Technical Papers, pp. 208-210.
Patra, Bishnu et al, "A Scalable Cryo-CMOS 2-to-20GHz Digitally Intensive Controller for 4x32 Frequency Multiplexed Spin Qubits/ Transmons in 22nm FinFET Technology for Quantum Computers", 2020 IEEE International Solid-State Circuits Convention, ISSCC 2020/Session 10/Cryo-CMOS for Quantum Technologies / 19.1/ Digest of Technical Papers, pp. 304-306.

(Continued)

*Primary Examiner* — Eric D Lee
(74) *Attorney, Agent, or Firm* — Akona IP PC

(57) ABSTRACT

Quantum circuit assemblies that employ active pulse shaping in order to be able to control states of a plurality of qubits with signal pulses propagated over a shared signal propagation channel are disclosed. An example quantum circuit assembly includes a quantum circuit component that includes a first qubit, associated with a first frequency to control the state of the first qubit, and a second qubit, associated with a second frequency to control the state of the second qubit. A shared transmission channel is coupled to the first and second qubits. The assembly further includes a signal pulse generation circuit, configured to generate a signal pulse to be propagated over the shared transmission channel to control the state of the first qubit, where the signal pulse has a center frequency at the first frequency, a bandwidth that includes the second frequency, and a notch at the second frequency.

20 Claims, 31 Drawing Sheets

(56) References Cited

OTHER PUBLICATIONS

Pauka, S.J., et al "A Cryogenic Interface for Controlling Many Qubits", ARC Centre of Excellence for Engineered Quantum Systems, School of Physics, The University of Syndey, Sydney, NSW 2006, Australia, Dec. 4, 2019, 7 pages.
Ruffino, A. et al, "Integrated multiplexed microwave readout of silicon quantum dots in a cryogenic CMOS chip", Advanced Quantum Architecture Laboratory, Neuchatel, Switzerland, Jan. 20, 2010, pp. 1-14.
Xu, Y. et al, "On-Chip Integration of Si/SiGe-based Quantum Dots and Switced-capacitor Circuits", QuTech and Kavli Institute of Nanoscience, Delft University of Technology, Delft, the Netherlands, May 11, 2020, pp. 1-5.
Degenhardt, C et al "Systems Engineering of Cryogenic CMOS Electronics for Scalable Quantum Computers", 2019 IEEE International Symposium On Circuits and Systems (ISCAS), IEEE, May 26, 2019 (May 26, 2019), pp. 1-5.
Extended European Search Report in EP Patent Application No. 22163922.2 dated Sep. 9, 2022, 10 pages.
Li, Dong et al "Improved dual-capacitive arrays DAC architecture for SAR ADC", Electronics Letters, The Institution of Engineering and Technology, GB, vol. 52, No. 12, Jun. 9, 2016 (Jun. 9, 2016), pp. 1013-1015.
Liangbo, Xie et al "Energy-efficient hybrid capacitor switching scheme for SAR ADC", Electronics Letters, The Institution of Engineering and Technology, GB,vol. 50, No. 1, Jan. 2, 2014 (Jan. 2, 2014), pp. 22-23.
Rahimi, E et al "Energy-Efficient high-accuracy switching method for SAR ADCs", Electronics Letters, The Institution Ofengineering and Technology, GB, vol. 50, No. 7, Mar. 27, 2014 (Mar. 27, 2014), pp. 499-501.
Yazdani, A et al "Low-power DAC with charge redistribution sampling method for SAR ADCs", Electronics Letters, The Institution of Engineering and Technology, GB, vol. 52, No. 3, Feb. 4, 2016 (Feb. 4, 2016), pp. 187-188.
Yuan, C et al "Low-energy and area-efficient tri-level switching scheme for SAR ADC", Electronics Letters, The Institution of Engineering and Technology, GB, vol. 48, No. 9, Apr. 26, 2012 (Apr. 26, 2012), pp. 482-483.

* cited by examiner

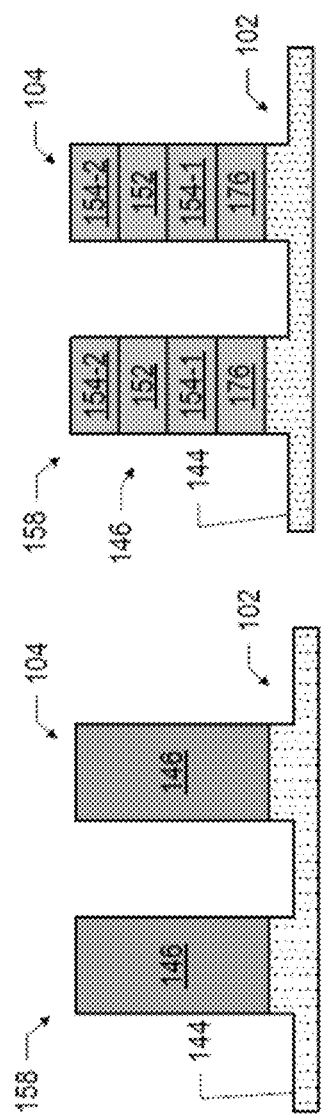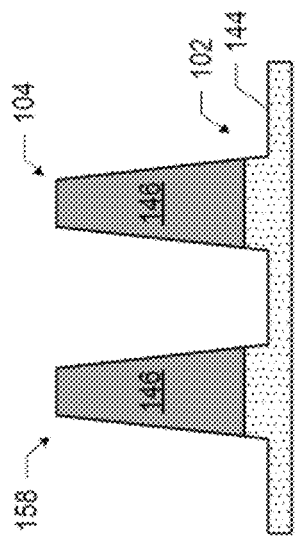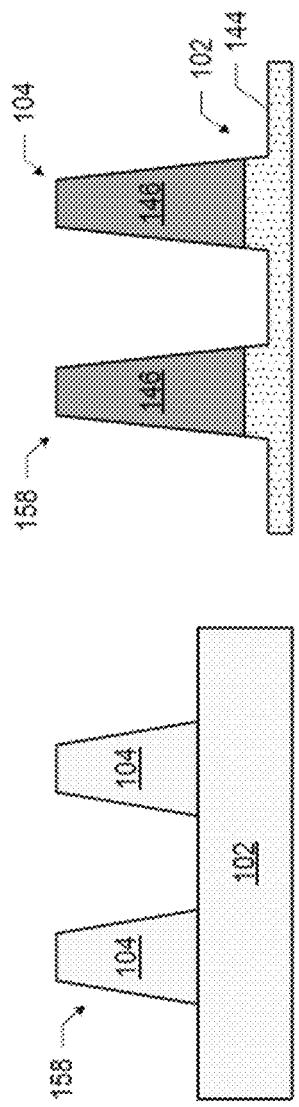
FIG. 16
FIG. 17
FIG. 18
FIG. 19

US 12,248,848 B2

SCALABLE GATE CONTROL IN QUANTUM CIRCUIT ASSEMBLIES

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 13-19 illustrate example base/fin arrangements that may be used in a quantum dot device with fins, in accordance with various embodiments.

DETAILED DESCRIPTION

Overview

Figure 1:
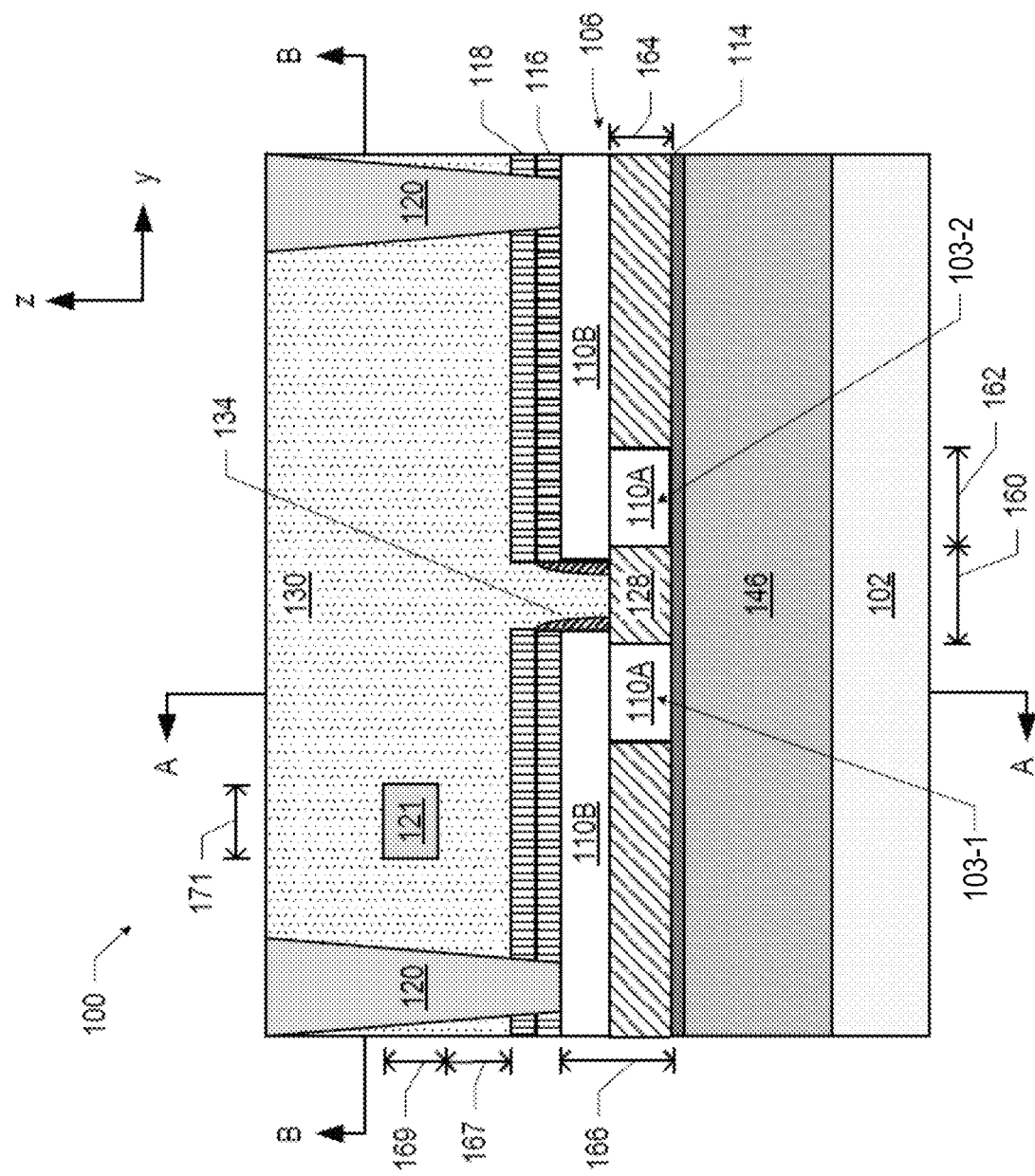
FIGS. 1-4 are cross-sectional and top-down views of an example quantum dot device with trenches, in accordance with various embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating quantum circuit assemblies with scalable gate control, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon.

Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc.

Qubit devices implementing quantum dot qubits (such qubit devices referred to herein as "quantum dot devices") are particularly promising for large-scale qubit implementation. Therefore, some descriptions of scalable gate control in quantum circuit assemblies are provided with reference to quantum dot devices as one example of qubit devices. However, descriptions of scalable gate control in quantum circuit assemblies, provided herein, are also applicable to qubit devices other than quantum dot devices, such as, but not limited to, superconducting qubits, photon polarization qubits, single trapped ion qubits, etc.

In general, quantum dot devices enable formation of quantum dots to serve as quantum bits (i.e., as qubits) in a quantum computing device. To that end, quantum dot devices implement multiple terminals, such as gate terminals of various types of gates (e.g., barrier gates, plunger gates, and accumulation gates) as well as terminals for making electrical contact with doped regions (which may be referred to as "source terminals" and "drain terminals"). DC bias control signals and AC pulses applied to various terminals may be used to control formation of quantum dots in such devices. However, providing signals to various terminals of quantum dot devices maintained at cryogenic temperatures can be very challenging, especially as quantum dot devices are scaled to include larger number of qubits. For example, in some implementations, a quantum dot device configured to implement a linear array of N qubits may include a total of 4N+8 controllable terminals. All of these terminals may require DC bias control, and at least 3N+1 of these terminals (e.g., a certain combination of plunger and barrier gates) may, additionally, require AC pulse control. Thus, a combination of a DC bias voltage and an AC pulse may need to be applied to each of 3N+1 of plunger and barrier gates of a quantum dot device implementing N quantum dot qubits. One digital-to-analog converter (DAC) may be used to apply a DC bias voltage to a gate and another DAC may be used to apply an AC pulse to a gate. The two DACs may be differentiated based on their functionality in that the former DAC may be referred to as a "DC DAC" and the latter DAC may be referred to as an "AC DAC." However, using two designated DACs (i.e., one DC DAC and one AC DAC) for each plunger and each barrier gate is not scalable in terms of costs, area of the overall assembly, complexity, and power consumption. For example, for an array of 7 quantum dot qubits, would require 36 DC DACs (4N+8=36 when N=7) and 22 AC DACs (3N+1=22 when N=7).

Quantum circuit assemblies that allow sharing DC and AC DACs between a plurality of gates have been proposed. One problem with such assemblies is that they only allow applying AC pulses to different gates sequentially (i.e., they do not allow applying AC pulses to various gates substantially simultaneously).

Embodiments of the present disclosure provide pulse control assemblies for implementing scalable gate control of multiple gates (or, more generally, terminals) of a qubit device such as, but not limited to, a quantum dot device. Pulse control assemblies presented herein include two separate capacitors per single signal path to a gate of a qubit device, where the first capacitor is used to store charge indicative of a bias voltage to be applied to the gate (the bias voltage may be provided by any signal source, e.g., a first DAC that may be referred to herein as a "DC DAC"), while the second capacitor is used to store charge indicative of a voltage pulse to be applied to the gate (the charge for applying said voltage pulse may be provided by any signal source, e.g., by a second DAC that may be referred to herein as an "AC DAC" and the voltage pulse may be referred to herein as an "AC voltage pulse" or simply as an "AC voltage"). These two capacitors may be differentiated based on such functionality in that the first capacitor may be referred to as a "DC capacitor" and the second capacitor may be referred to as an "AC capacitor." Using two separate capacitors (i.e., a DC capacitor and an AC capacitor) per a single path to a gate of a qubit device allows sharing at least some DC DACs and AC DACs among a plurality of gates, thus advantageously reducing the total number of DACs used to apply signals to a qubit device, in a manner that allows applying AC voltage pulses to various gates substantially simultaneously. Thus, pulse control assemblies described herein provide scalable gate control in quantum circuit assemblies in that they may enable scaling qubit devices of quantum circuit assemblies to include larger number of qubits in an efficient manner, e.g., in terms of costs, area of the overall assembly, complexity, and power consumption.

In various embodiments, quantum circuit assemblies with scalable gate control as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular various gates and conductive vias described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, some schematic illustrations of cross-sectional and top-down views of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., scanning electron microscopy (SEM) images or transmission electron microscope (TEM) images. In such images of real structures, possible processing defects could also be visible, such as not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B), and the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Quantum Dot Formation Regions of Quantum Dot Devices

As described above, quantum dot devices are particularly promising for large-scale qubit implementation, such devices including a plurality of rows of a quantum dot formation region. In various embodiments, rows of quantum dot formation regions may be formed in different manners. In a first embodiment (where a quantum dot device may be referred to as a trench-based device), a row of a quantum dot formation region may be defined by an insulating material provided over a continuous quantum well stack, the insulating material including a trench corresponding to the row (i.e., multiple trenches if there are multiple rows of quantum dot formation regions), the trench extending toward the continuous quantum well stack, and portions of gate metals of different gates being at least partially in the trench. In such an embodiment, even though the quantum well stack is continuous along a portion of a plane, i.e., continuous in a two-dimensional plane, confinement of the quantum dot formation region to a row (i.e., confinement of the quantum dots formed in a region that is a row), i.e., confinement to substantially one direction, is achieved by the confinement to substantially one direction of the trench in the insulating material, the trench at least partially filled with one or more gate metals. Such embodiments of quantum dot devices are described below with reference to FIGS. 1-4. In a second embodiment (where a quantum dot device may be referred to as a fin-based device), a row of a quantum dot formation region may be defined by at least a portion of a quantum well stack being formed as a fin corresponding to the row (i.e., multiple fins if there are multiple rows of quantum dot formation regions), and portions of gate metals of different gates being over the fin. In such an embodiment, confinement of the quantum dot formation region to a row is achieved by the confining the quantum well stack to the fin. Thus, in contrast to the second embodiment, at least portions of the quantum well stack may not be horizontally continuous across different fins. Such embodiments are described below with reference to FIGS. 10-12. In various embodiments, the quantum dot devices disclosed herein may provide two-dimensional arrays of quantum dots (e.g., quantum dots 142) during operation, with the quantum dots constrained in "rows" by the quantum dot formation regions (e.g., quantum dot formation regions 111) and "columns" by the gates (e.g., gates 106/108), as discussed below. In some embodiments, individual ones of the gates (e.g., of the gates 106/108) may be shared between multiple quantum dot formation regions. Quantum circuit assemblies with scalable gate control as described herein may be implemented with qubit devices implemented as trench-based quantum dot devices or as fin-based quantum dot devices (i.e., implemented as quantum dot devices with rows of quantum dot formation regions defined by either trenches or fins).

Example Trench-Based Quantum Dot Devices

One type of quantum dot devices includes devices having a base, a continuous quantum well layer extending over the base, an insulating material over the quantum well layer, one or more trenches in the insulating material, and one or more gates with gate metals at least partially disposed in the trenches. In such devices, the quantum well layer is not etched into fins, as in fin-based devices. A quantum dot formed in such a device may be constrained in the x-direction by the one or more gates, in the y-direction by the trench, and in the z-direction by the quantum well layer, as discussed in detail herein. Unlike previous approaches to quantum dot formation and manipulation, quantum dot devices with trenches provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as a first example of a qubit device that may be controlled using scalable gate control provided by any of the pulse control assemblies as described herein.

Figure 2:
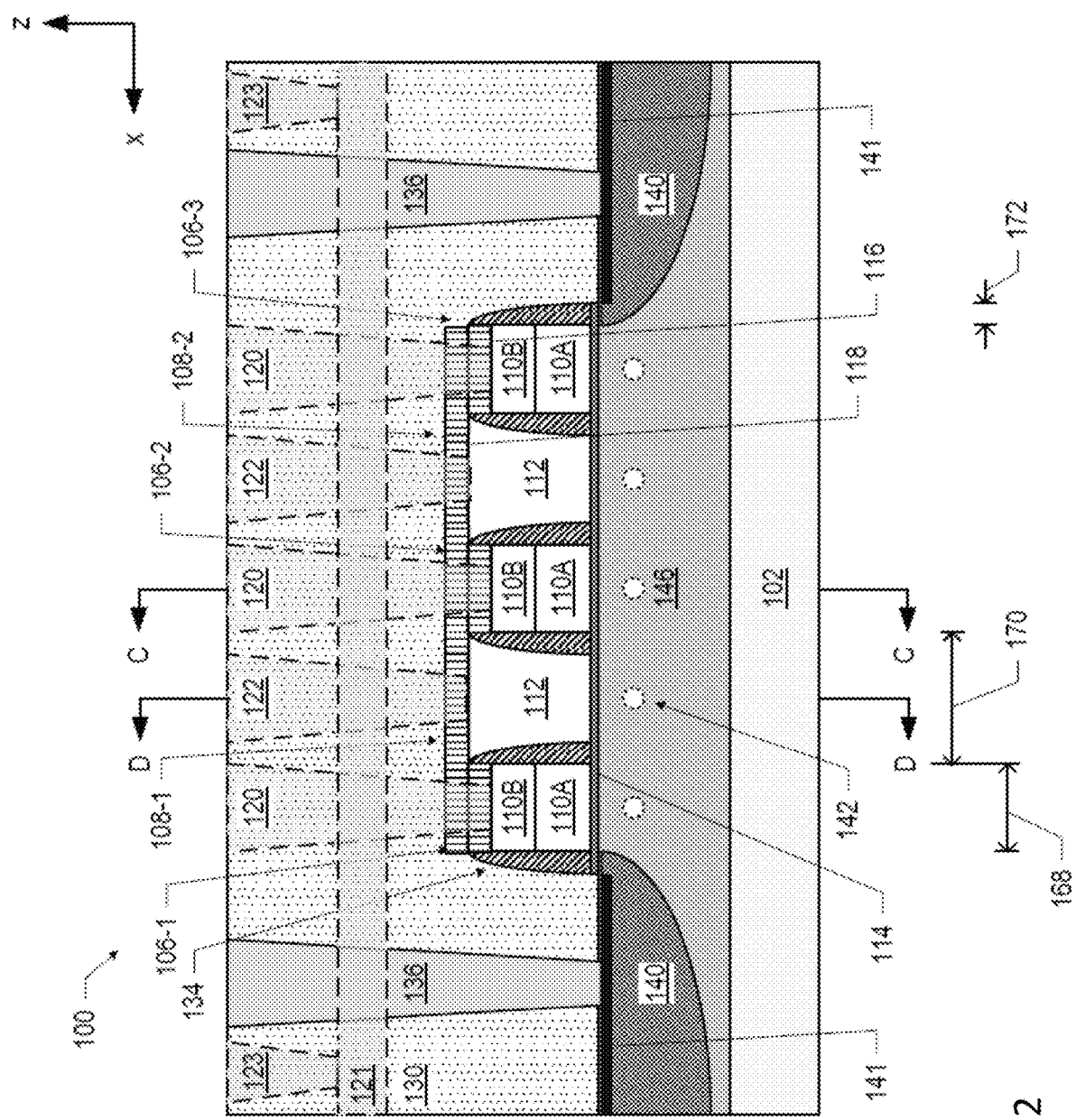
Figure 3:
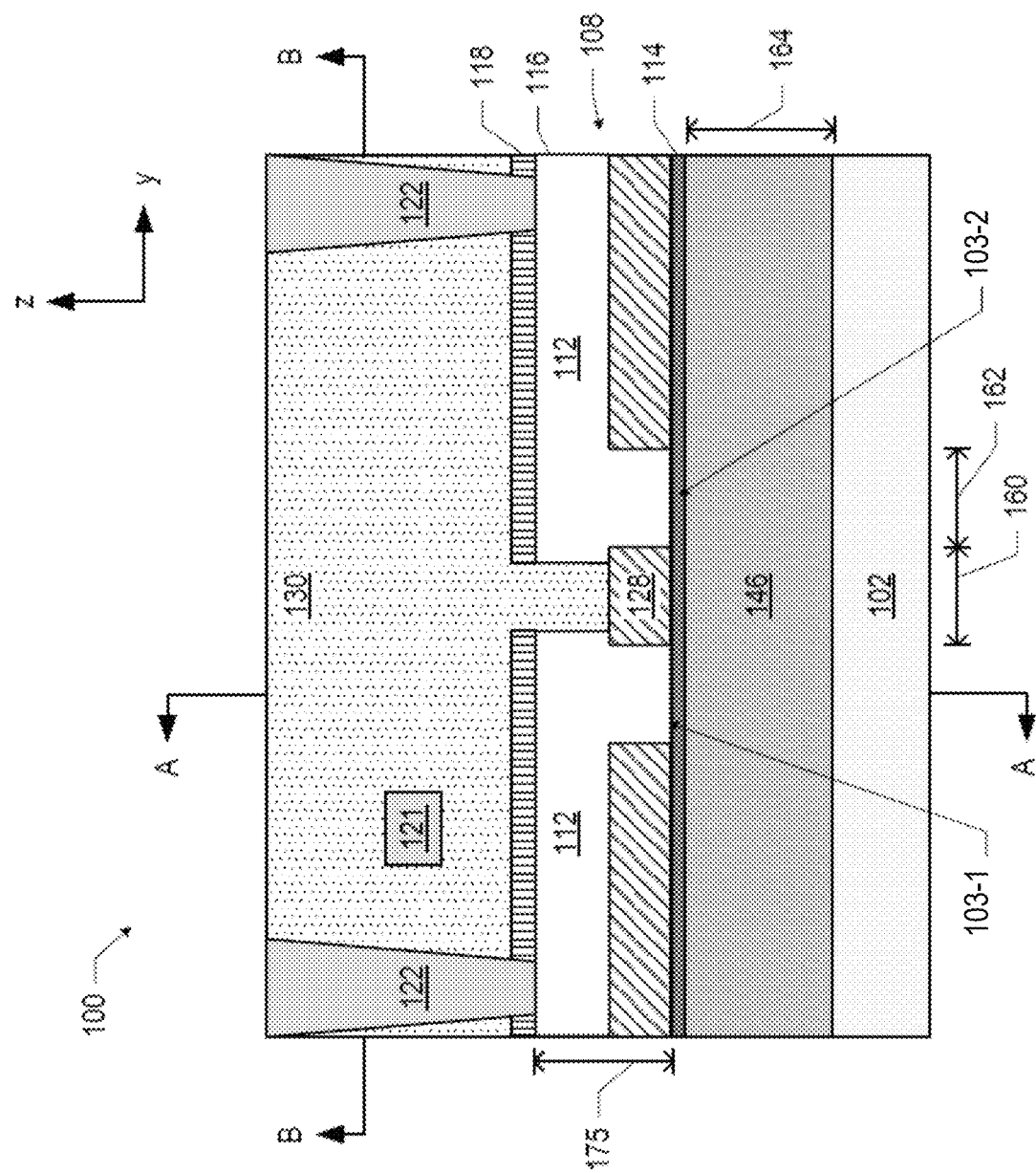
Figure 4:
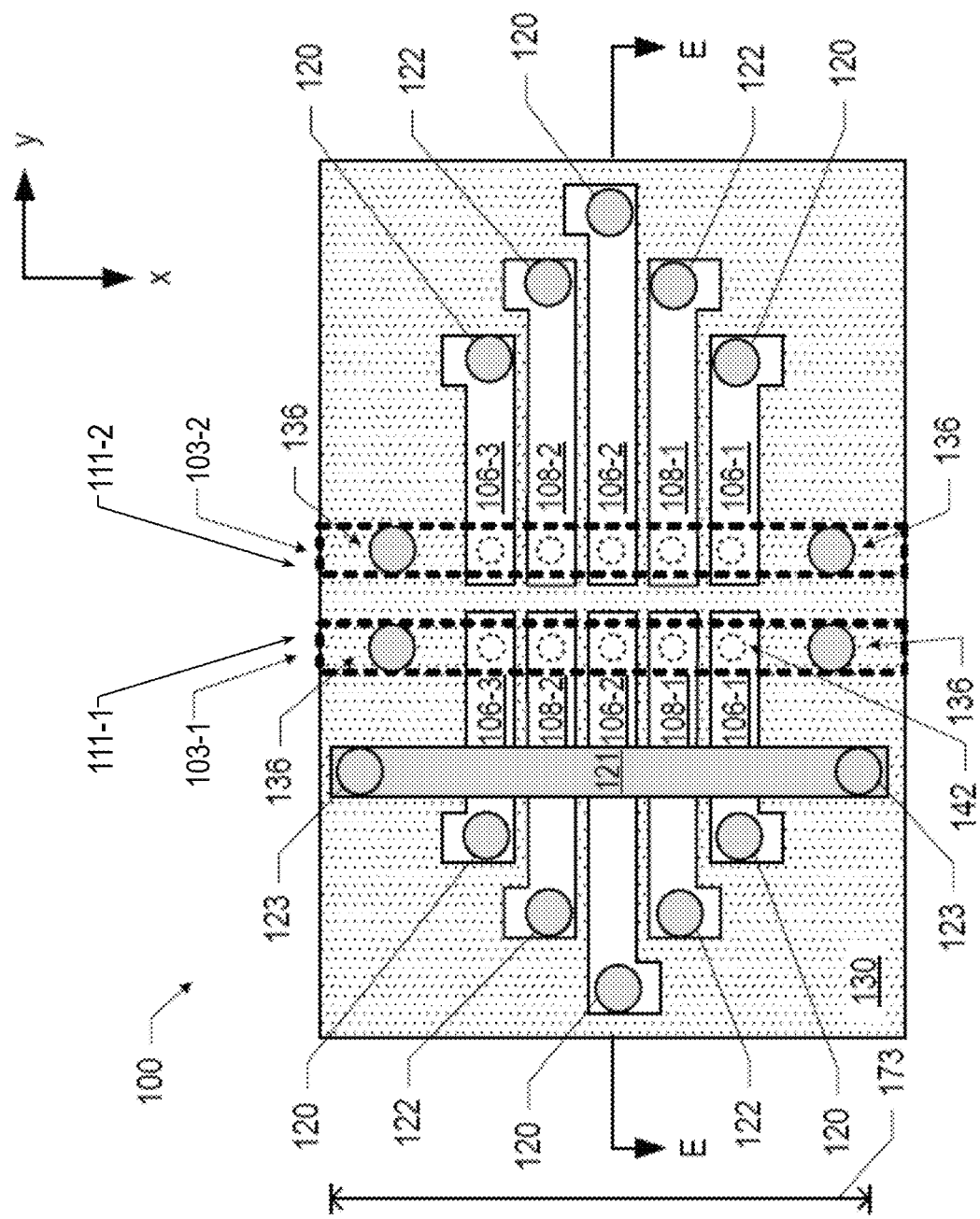

FIGS. 1-4 are cross-sectional and top-down views of a quantum dot device 100, in accordance with various embodiments. In particular, FIGS. 1-3 provide cross-sectional views of the quantum dot device 100, where FIG. 2 illustrates the quantum dot device 100 taken along the section A-A of FIG. 1 (while FIG. 1 illustrates the quantum dot device 100 taken along the section C-C of FIG. 2) and FIG. 3 illustrates the quantum dot device 100 taken along the section D-D of FIG. 2 (while FIG. 2 illustrates the quantum dot device 100 taken along the section A-A of FIG. 3), while FIG. 4 illustrates a top-down view of the quantum dot device

100 (i.e., a view taken along the section B-B of FIG. 1 with a number of components not shown to more readily illustrate how the gates 106/108 and the magnet line 121 may be patterned). FIG. 1 illustrates the quantum dot device 100 taken along the section E-E of FIG. 4. Although FIG. 1 indicates that the cross-section illustrated in FIG. 2 is taken through the trench 103-1, an analogous cross-section taken through the trench 103-2 may be identical, and thus the discussion of FIG. 2 refers generally to the "trench 103."

The quantum dot device 100 may include a quantum well stack 146 disposed on a base 102. An insulating material 128 may be disposed above the quantum well stack 146, and multiple trenches 103 in the insulating material 128 may extend toward the quantum well stack 146. In the embodiment illustrated in FIGS. 1-4, a gate dielectric 114 may be disposed between the quantum well stack 146 and the insulating material 128 so as to provide the "bottom" of the trenches 103. A number of examples of quantum well stacks 146 are discussed below with reference to FIGS. 5-7.

Although only two trenches, 103-1 and 103-2, are shown in FIGS. 1-4, this is simply for ease of illustration, and more than two trenches 103 may be included in the quantum dot device 100. In some embodiments, the total number of trenches 103 included in the quantum dot device 100 is an even number, with the trenches 103 organized into pairs including one active trench 103 and one read trench 103, as discussed in detail below. When the quantum dot device 100 includes more than two trenches 103, the trenches 103 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). As illustrated in FIGS. 1, 3, and 4, in some embodiments, multiple trenches 103 may be oriented substantially in parallel. The discussion herein will largely focus on a single pair of trenches 103 for ease of illustration, but all the teachings of the present disclosure apply to quantum dot devices 100 with more trenches 103. Further, the use of the term "trench" should not be interpreted to require that the insulating material 128 is deposited first and then a portion of that insulating material 128 is excavated to form the trench 103 prior to depositing material in the trench 103; in various embodiments, the insulating material 128 may be deposited before or after deposition of the material that will ultimately be disposed in the trench 103.

The quantum dot device 100 of FIGS. 1-4 may include multiple quantum dot formation regions 111 (labeled in FIG. 4), defined by the parallel trenches 103 in the insulating material 128 disposed on top of the quantum well stack 146. These quantum dot formation regions 111 may be portions of the quantum well stack 146 in which quantum dots 142 may form during operation. The quantum dot formation regions 111 may be arranged as multiple parallel rows defined by the trenches 103, and the gates 106/108 may each extend over multiple ones of the quantum dot formation regions 111.

The quantum well stack 146 may include a quantum well layer (not shown in FIGS. 1-4 but discussed below with reference to the quantum well layer 152 of FIGS. 5-7). The quantum well layer included in the quantum well stack 146 may be arranged normal to the z-direction, and may provide a layer in which a two-dimensional electron gas (2DEG) may form to enable the generation of one or more quantum dots during operation of the quantum dot device 100, as discussed in further detail below. The quantum well layer itself may provide a geometric constraint on the z-location of quantum dots in the quantum well stack 146. To control the x- and y-location of quantum dots in the quantum well stack 146, voltages may be applied to gates disposed at least partially in the trenches 103 above the quantum well stack 146 to adjust the energy profile along the trenches 103 in the x- and y-direction and thereby constrain the x- and y-location of quantum dots within quantum wells (discussed in detail below with reference to the gates 106/108). The dimensions of the trenches 103 may take any suitable values. For example, in some embodiments, the trenches 103 may each have a width 162 between about 5 nanometers and 50 nanometers. In some embodiments, the trenches 103 may each have a depth 164 between about 40 nanometers and 400 nanometers (e.g., between about 50 nanometers and 350 nanometers, or equal to about 100 nanometers). The insulating material 128 may be a dielectric material (e.g., an interlayer dielectric), such as silicon oxide. In some embodiments, the insulating material 128 may be a chemical vapor deposition (CVD) or flowable CVD oxide. In some embodiments, the trenches 103 may be spaced apart by a distance 160 between about 30 nanometers and 300 nanometers.

Multiple gates may be disposed at least partially in each of the trenches 103. In the embodiment illustrated in FIG. 2, three gates 106 and two gates 108 are shown as distributed at least partially in a single trench 103. This particular number of gates is simply illustrative, and any suitable number of gates may be used. Additionally, in some embodiments, multiple groups of gates (like the gates illustrated in FIG. 2) may be disposed at least partially in the trench 103.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material disposed between the quantum well stack 146 and the insulating material 128. In other embodiments, the gate dielectric 114 for each of the gates 106/108 may be provided by separate portions of gate dielectric 114 (i.e., the gate dielectric 114 may not be continuous across multiple ones of the gates 106/108). In some embodiments, the gate dielectric 114 may be a multilayer gate dielectric (e.g., with multiple materials used to improve the interface between the trench 103 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 (including multiple layers of gate metal) and a hardmask 116. In particular, a first gate metal layer 110A may be disposed in the trench 103, and a second gate metal layer 110B may be disposed above the gate metal 110-1 and above the insulating material 128, as shown. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the quantum well stack 146. As shown in FIG. 1, in some embodiments, the gate metal 110 of a gate 106 may extend over the insulating material 128 and into a trench 103 in the insulating material 128. Only one portion of the hardmask 116 is labeled in FIG. 2 for ease of illustration.

In some embodiments, the gate metal 110 may be a superconductor, such as aluminum, titanium nitride, or niobium titanium nitride; any of these materials may be included in the first gate metal layer 110A and/or the second gate metal layer 110B. In some embodiments, the first gate metal layer 110A may have a different material composition than the second gate metal layer 110B. For example, the first gate metal layer 110A may be titanium nitride, while the second gate metal layer 110B may be a material different from titanium nitride, or vice versa. In some embodiments, the first gate metal layer 110A and the second gate metal layer 110B may have the same material composition but a different microstructure. These different microstructures may arise, for example, by different deposition and/or patterning techniques used to form the first gate metal layer 110A and the second gate metal layer 110B. For example, in some embodiments, the first gate metal layer 110A may have a microstructure including columnar grains (e.g., when the first gate metal layer 110A is initially blanket-deposited and then etched as part of a subtractive patterning process), while the second gate metal layer 110B may not exhibit a columnar grain structure. In some embodiments, a seam delineating the interface between the top surface of the first gate metal layer 110A and the bottom surface of the second gate metal layer 110B may be present in the quantum dot device 100.

In some embodiments, the hardmask 116 may not be present in the quantum dot device 100 (e.g., a hardmask like the hardmask 116 may be removed during processing). The sides of the gate metal 110 may be substantially parallel, as shown in FIG. 2, and insulating spacers 134 may be disposed on the sides of the gate metal 110 and the hardmask 116 along the longitudinal axis of the trench 103. As illustrated in FIG. 2, the spacers 134 may be thicker closer to the quantum well stack 146 and thinner farther away from the quantum well stack 146. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). As illustrated in FIG. 1, no spacer material may be disposed between the gate metal 110 and the sidewalls of the trench 103 in the y-direction.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the quantum well stack 146. As shown in FIG. 3, in some embodiments, the gate metal 112 of a gate 108 may extend over the insulating material 128 and into a trench 103 in the insulating material 128. In the embodiment illustrated in FIG. 2, the hardmask 118 may extend over the hardmask 116 (and over the gate metal 110 of the gates 106), while in other embodiments, the hardmask 118 may not extend over the gate metal 110. In the embodiment of FIGS. 1-3, the gate metal 112 of the gates 108 may be provided by a single continuous layer of material (and may not, for example, include multiple different layers of gate metal, as was discussed above with reference to the gate metal 110 of the gates 106). In other embodiments, however, the gate metal 112 of the gates 108 may include multiple layers of gate metal, e.g., multiple layers similar to the first gate metal layer 110A and the second gate metal layer 110B. In some embodiments, the gate metal 112 may be a different metal from the first gate metal layer 110A and/or the second gate metal layer 110B; in other embodiments, the gate metal 112 and the first gate metal layer 110A and/or the second gate metal layer 110B may have the same material composition. In some embodiments, the gate metal 112 may be a superconductor, such as aluminum, titanium nitride, or niobium titanium nitride. In some embodiments, the hardmask 118 may not be present in the quantum dot device 100 (e.g., a hardmask like the hardmask 118 may be removed during processing).

The gate 108-1 may extend between the proximate spacers 134 on the sides of the gate 106-1 and the gate 106-2 along the longitudinal axis of the trench 103, as shown in FIG. 2. In some embodiments, the gate metal 112 of the gate 108-1 may extend between the spacers 134 on the sides of the gate 106-1 and the gate 106-2 along the longitudinal axis of the trench 103. Thus, the gate metal 112 of the gate 108-1 may have a shape that is substantially complementary to the shape of the spacers 134, as shown in FIG. 2. Similarly, the gate 108-2 may extend between the proximate spacers 134 on the sides of the gate 106-2 and the gate 106-3 along the longitudinal axis of the trench 103. In some embodiments in which the gate dielectric 114 is not a layer shared commonly between the gates 108 and 106, but instead is separately deposited in the trench 103 between the spacers 134, the gate dielectric 114 may extend at least partially up the sides of the spacers 134 (and up the proximate sidewalls of the trench 103), and the gate metal 112 may extend between the portions of gate dielectric 114 on the spacers 134 (and the proximate sidewalls of the trench 103). As illustrated in FIG. 3, in some embodiments, no spacer material may be disposed between the gate metal 112 and the sidewalls of the trench 103 in the y-direction; in other embodiments (not shown in the present drawings), spacers 134 may also be disposed between the gate metal 112 and the sidewalls of the trench 103 in the y-direction.

The dimensions of the gates 106/108 may take any suitable values. For example, in some embodiments, the z-height 166 of the gate metal 110 in the trench 103 may be between about 100 nanometers and 400 nanometers (e.g., approximately about 200 nanometers); the z-height 175 of the gate metal 112 may be in about the same range. This z-height 166 of the gate metal 110 in the trench 103 may represent the sum of the z-height of the first gate metal layer 110A (e.g., between about 40 nanometers and 300 nanometers) and the thickness of the second gate metal layer 110B (e.g., between about 25 nanometers and 100 nanometers, or approximately 50 nanometers). In embodiments like the ones illustrated in FIGS. 1-3, the z-height 175 of the gate metal 112 may be greater than the z-height 166 of the gate metal 110 (as can be seen in, e.g., FIG. 2). In some embodiments, the length 168 of the gate metal 110 (i.e., in the x-direction) may be between about 20 nanometers and 50 nanometers (e.g., about 30 nanometers). Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 2) may have a greater length 168 than the "inner" gates 106 (e.g., the gate 106-2 in the embodiment illustrated in FIG. 2).

Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140.

In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between about 40 nanometers and 100 nanometers (e.g., about 50 nanometers). In some embodiments, the thickness 172 of the spacers 134 may be between about 1 nanometer and 10 nanometers (e.g., between about 3 nanometers and 5 nanometers, between about 4 nanometers and 6 nanometers, or between about 4 nanometers and 7 nanometers). The length of the gate metal 112 (i.e., in the x-direction) may depend on the dimensions of the gates 106 and the spacers 134, as illustrated in FIG. 2. As indicated in FIGS. 1 and 3, the gates 106/108 in one trench 103 may extend over the insulating material 128 between that trench 103 and an adjacent trench 103, but may be isolated from their counterpart gates by the intervening insulating material 130 and spacers 134.

As shown in FIG. 2, the gates 106 and 108 may be alternatingly arranged in the x-direction. During operation of the quantum dot device 100, voltages may be applied to the gates 106/108 to adjust the potential energy in the quantum well stack 146 to create quantum wells of varying depths in which quantum dots 142 may form. Only one quantum dot 142 is labeled with a reference numeral in FIGS. 2 and 4 for ease of illustration, but five are indicated as dotted circles below each trench 103. The location of the quantum dots 142 in FIGS. 2 and 4 is not intended to indicate a particular geometric positioning of the quantum dots 142. The spacers 134 (and the insulating material 128) may themselves provide "passive" barriers between quantum dots under the gates 106/108 in the quantum well stack 146, and the voltages applied to different ones of the gates 106/108 may adjust the potential energy under the gates 106/108 in the quantum well stack 146; decreasing the potential energy under a gate 106/108 may enable the formation of a quantum dot under that gate 106/108, while increasing the potential energy under a gate 106/108 may form a quantum barrier under that gate 106/108.

The quantum well stack 146 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide. In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well stack 146 under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the doped regions 140, to enable electrical connection to the gates 106/108 and the doped regions 140 to be made in desired locations. As shown in FIGS. 1-4, the gates 106 may extend both "vertically" and "horizontally" away from the quantum well stack 146, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may similarly extend away from the quantum well stack 146, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140 and through a quantum well layer of the quantum well stack 146 (discussed in further detail below with reference to FIGS. 5-7). When the doped regions 140 are doped with an n-type material, this voltage may be positive; when the doped regions 140 are doped with a p-type material, this voltage may be negative. The magnitude of this bias voltage may take any suitable value (e.g., between about 0.25 volts and 2 volts).

In some embodiments, the quantum dot device 100 may include one or more magnet lines 121. For example, a single magnet line 121 is illustrated in FIGS. 1-4, proximate to the trench 103-1. The magnet line 121 may be formed of a conductive material and may be used to conduct current pulses that generate magnetic fields to influence the spin states of one or more of the quantum dots 142 that may form in the quantum well stack 146. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIGS. 1-4 is non-coplanar with the trenches 103, and is also non-coplanar with the gates 106/108. In some embodiments, the magnet line 121 may be spaced apart from the gates 106/108, in the direction of the z-axis of the example coordinate system shown, by a distance 167. The distance 167 may take any suitable value (e.g., based on the desired strength of magnetic field interaction with particular quantum dots 142); in some embodiments, the distance 167 may be between about 25 nanometers and 1 micron (e.g., between about 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between about 25 nanometers and 100 nanometers. The magnet line 121 may have a width 171 between about 25 nanometers and 100 nanometers. In some embodiments, the width 171 and thickness 169 of a magnet line 121 may be substantially equal to, respectively, the width and thickness of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIGS. 1-4 is substantially linear, but this need not be the case; in general, the magnet lines 121 of the quantum dot devices 100 may take any suitable shape. In other embodiments, micro-magnets may be used instead or in addition to the magnet line 121. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of IC manufacturing, conductive vias and lines may be formed in an iterative process in which layers of structures are formed on top of each other. In some embodiments, the conductive vias 120/122/136/123 may have a width that is about 20 nanometers or greater at their widest point (e.g., about 30 nanometers), and a pitch of about 80 nanometers or greater (e.g., about 100 nanometers). In some embodiments, conductive lines (not shown) included in the quantum dot device 100 may have a width that is about 100 nanometers or greater, and a pitch of about 100 nanometers or greater. The particular arrangement of conductive vias shown in FIGS. 1-4 is simply illustrative, and any electrical routing arrangement may be implemented.

As discussed above, the structure of the trench 103-1 may be the same as the structure of the trench 103-2; similarly, the construction of gates 106/108 in and around the trench 103-1 may be the same as the construction of gates 106/108 in and around the trench 103-2. The gates 106/108 associated with the trench 103-1 may be mirrored by corresponding gates 106/108 associated with the parallel trench 103-2, and the insulating material 130 may separate the gates 106/108 associated with the different trenches 103-1 and 103-2. In particular, quantum dots 142 formed in the quantum well stack 146 under the trench 103-1 (under the gates 106/108) may have counterpart quantum dots 142 in the quantum well stack 146 under the trench 103-2 (under the corresponding gates 106/108). In some embodiments, the quantum dots 142 under the trench 103-1 may be used as "active" quantum dots in the sense that these quantum dots 142 act as qubits and are controlled (e.g., by voltages applied to the gates 106/108 associated with the trench 103-1) to perform quantum computations. The quantum dots 142 associated with the trench 103-2 may be used as "read" quantum dots in the sense that these quantum dots 142 may sense the quantum state of the quantum dots 142 under the trench 103-1 by detecting the electric field generated by the charge in the quantum dots 142 under the trench 103-1, and may convert the quantum state of the quantum dots 142 under the trench 103-1 into electrical signals that may be detected by the gates 106/108 associated with the trench 103-2. Each quantum dot 142 under the trench 103-1 may be read by its corresponding quantum dot 142 under the trench 103-2. Thus, the quantum dot device 100 enables both quantum computation and the ability to read the results of a quantum computation.

As discussed above, the quantum well stack 146 may include a quantum well layer in which a 2DEG may form during operation of the quantum dot device 100. The quantum well stack 146 may take any of a number of forms, several of which are illustrated in FIGS. 5-7. The various layers in the quantum well stacks 146 discussed below may be grown on the base 102 (e.g., using epitaxial processes).

Although the singular term "layer" may be used to refer to various components of the quantum well stacks 146 of FIGS. 5-7, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 5:
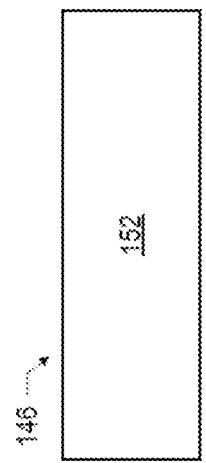
FIGS. 5-7 are cross-sectional views of various examples of quantum well stacks that may be used in a quantum dot device with either trenches or fins, in accordance with various embodiments.

FIG. 5 is a cross-sectional view of a quantum well stack 146 including only a quantum well layer 152. The quantum well layer 152 may be disposed on the base 102, and may be formed of a material such that, during operation of the quantum dot device 100, a 2DEG may form in the quantum well layer 152 proximate to the upper surface of the quantum well layer 152. The gate dielectric 114 of the gates 106/108 may be disposed on the upper surface of the quantum well layer 152. In some embodiments, the quantum well layer 152 of FIG. 5 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 5 is formed of intrinsic silicon may be particularly advantageous for electron-type quantum dot devices 100. In some embodiments, the quantum well layer 152 of FIG. 5 may be formed of intrinsic germanium, and the gate dielectric 114 may be formed of germanium oxide; in such an arrangement, during use of the quantum dot device 100, a two-dimensional hole gas (2DHG) may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 5 may take any suitable values. For example, in some embodiments, the thickness of the quantum well layer 152 (e.g., intrinsic silicon or germanium) may be between about 0.8 microns and 1.2 microns.

Figure 6:
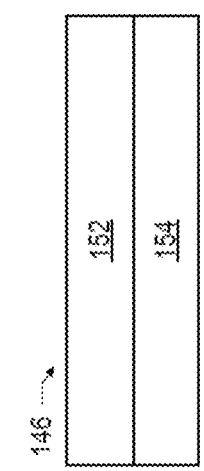

FIG. 6 is a cross-sectional view of a quantum well stack 146 including a quantum well layer 152 and a barrier layer 154. The quantum well stack 146 may be disposed on the base 102 (e.g., as discussed above with reference to FIG. 6) such that the barrier layer 154 is disposed between the quantum well layer 152 and the base 102. The barrier layer 154 may provide a potential barrier between the quantum well layer 152 and the base 102. As discussed above with reference to FIG. 5, the quantum well layer 152 of FIG. 6 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 6 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 6 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 7:
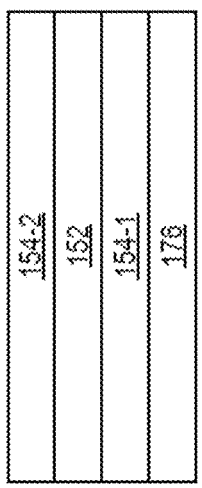

FIG. 7 is a cross-sectional view of a quantum well stack 146 including a quantum well layer 152 and a barrier layer 154-1, as well as a buffer layer 176 and an additional barrier layer 154-2. The quantum well stack 146 may be disposed on the base 102 such that the buffer layer 176 is disposed between the barrier layer 154-1 and the base 102. The buffer layer 176 may be formed of the same material as the barrier layer 154, and may be present to trap defects that form in this material as it is grown on the base 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. The thicknesses (i.e., z-heights) of the layers in the quantum well stack 146 of FIG. 7 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 6, the quantum well layer 152 of FIG. 7 may be formed of a material such that, during operation of the quantum dot device 100, a 2DEG may form in the quantum well layer 152 proximate to the upper surface of the quantum well layer 152. For example, in some embodiments in which the base 102 is formed of silicon, the quantum well layer 152 of FIG. 7 may be formed of silicon, and the barrier layer 154-1 and the buffer layer 176 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the silicon base 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 7 may be formed of germanium, and the buffer layer 176 and the barrier layer 154-1 may be formed of silicon germanium. In some such embodiments, the silicon germanium of the buffer layer 176 may have a germanium content that varies from the base 102 to the barrier layer 154-1; for example, the silicon germanium of the buffer layer 176 may have a germanium content that varies from zero percent at the base 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 7, the buffer layer 176 and/or the barrier layer 154-2 may be omitted.

Figure 9:
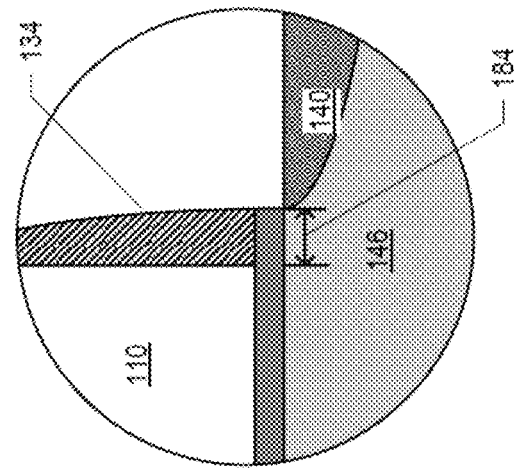
FIGS. 8-9 illustrate detail views of various embodiments of a doped region in a quantum dot device with either trenches or fins, in accordance with various embodiments.
Figure 8:
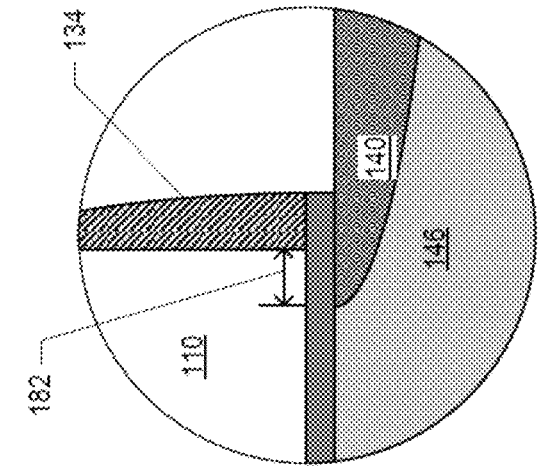

The outer spacers 134 on the outer gates 106, shown, e.g., in FIG. 2, may provide a doping boundary, limiting diffusion of the dopant from the doped regions 140 into the area under the gates 106/108. In some embodiments, the doped regions 140 may extend past the outer spacers 134 and under the outer gates 106. For example, as illustrated in FIG. 8, the doped region 140 may extend past the outer spacers 134 and under the outer gates 106 by a distance 182 between about 0 nanometers and 10 nanometers. In some embodiments, the doped regions 140 may not extend past the outer spacers 134 toward the outer gates 106, but may instead "terminate" under the outer spacers 134. For example, as illustrated in FIG. 9, the doped regions 140 may be spaced away from the interface between the outer spacers 134 and the outer gates 106 by a distance 184 between about 0 nanometers and 10 nanometers. The interface material 141 is omitted from FIGS. 8 and 9 for ease of illustration.

Example Fin-Based Quantum Dot Devices

Another type of quantum dot devices includes devices having a base, a fin extending away from the base, where the fin includes a quantum well layer, and one or more gates disposed on the fin. A quantum dot formed in such a device may be constrained in the x-direction by the one or more gates, in the y-direction by the fin, and in the z-direction by the quantum well layer, as discussed in detail herein. Similar to the quantum dot devices with trenches, described above, and unlike previous approaches to quantum dot formation and manipulation, quantum dot devices with fins provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices. Therefore, this type of a quantum dot device is described as another example of a qubit device that may be controlled using scalable gate control provided by any of the pulse control assemblies as described herein.

Figure 10:
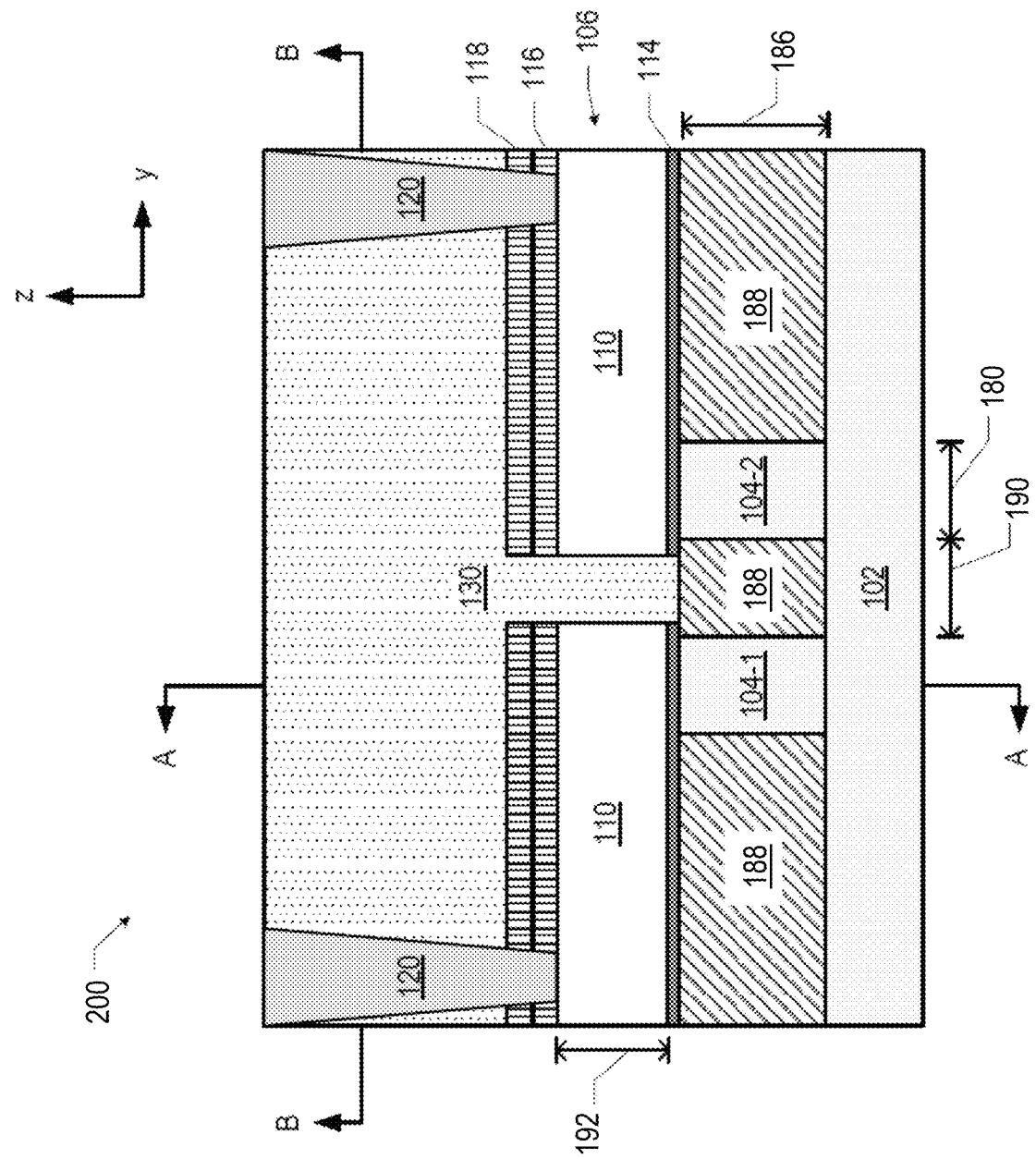
FIGS. 10-12 are cross-sectional and top-down views of an example quantum dot device with fins, according to some embodiments of the present disclosure.
Figure 11:
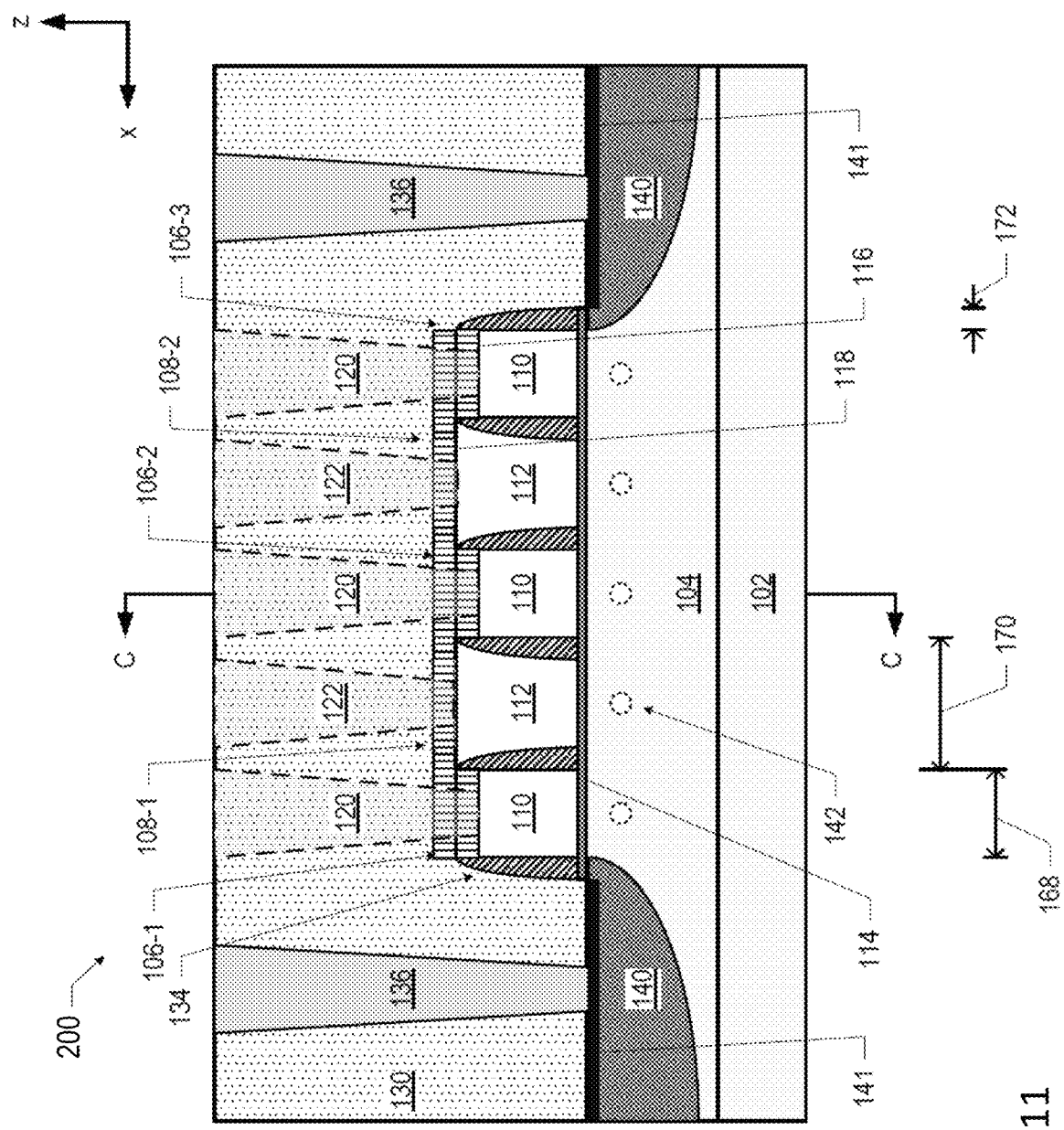
Figure 12:
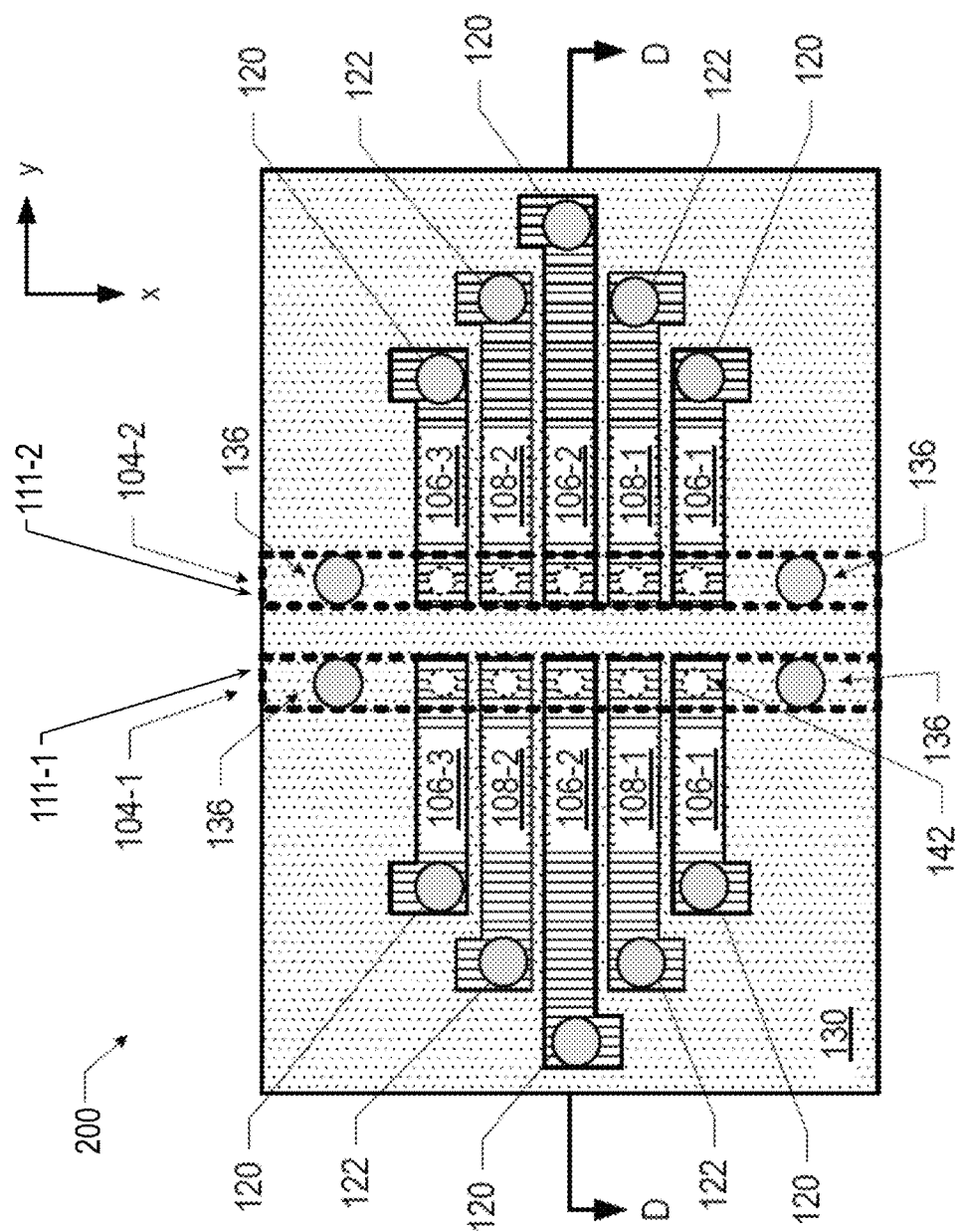

FIGS. 10-12 are cross-sectional views of an example quantum dot device 200 implementing quantum dot qubits, in accordance with various embodiments. In particular, FIG. 11 illustrates the quantum dot device 200 taken along the section A-A of FIG. 10 (while FIG. 10 illustrates the quantum dot device 200 taken along the section C-C of FIG. 11), and FIG. 12 illustrates the quantum dot device 200 taken along the section B-B of FIG. 10 (while FIG. 10 illustrates a quantum dot device 200 taken along the section D-D of FIG. 12). Although FIG. 10 indicates that the cross-section illustrated in FIG. 11 is taken through the fin 104-1, an analogous cross-section taken through the fin 104-2 may be identical, and thus the discussion of FIGS. 10-12 refers generally to the "fin 104."

As shown in FIGS. 10-12, the quantum dot device 200 may include a base 102, similar to the base 102 of the quantum dot device 200 shown in FIGS. 1-4, and multiple fins 104 extending away from the base 102. The base 102 and the fins 104 may include a semiconductor substrate and a quantum well stack (not shown in FIGS. 10-12 but discussed below with reference to the semiconductor substrate 144 and the quantum well stack 146), distributed in any of a number of ways between the base 102 and the fins 104. The base 102 may include at least some of the semiconductor substrate, and the fins 104 may each include a quantum well layer, e.g., a quantum well layer as discussed above with reference to the quantum well layer 152 of FIGS. 5-7. Examples of base/fin arrangements are discussed below with reference to the base fin arrangements 158 of FIGS. 13-19.

Although only two fins, 104-1 and 104-2, are shown in FIGS. 10-12, this is simply for ease of illustration, and more than two fins 104 may be included in the quantum dot device 200. In some embodiments, the total number of fins 104 included in the quantum dot device 200 is an even number, with the fins 104 organized into pairs including one active fin 104 and one read fin 104, as discussed in detail below. When the quantum dot device 200 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). As illustrated in FIGS. 10 and 12, in some embodiments, multiple fins 104 may be oriented substantially in parallel. The discussion herein will largely focus on a single pair of fins 104 for ease of illustration, but all the teachings of the present disclosure apply to quantum dot devices 200 with more fins 104.

The quantum dot device 200 of FIGS. 10-12 may include multiple quantum dot formation regions 111 (labeled in FIG. 12), defined by the fins 104. These quantum dot formation regions 111 may be portions of the quantum well stack 146 in which quantum dots 142 may form during operation. The quantum dot formation regions 111 may be arranged as multiple parallel rows defined by the insulating material 188, and the gates 106/108 may each extend over multiple ones of the quantum dot formation regions 111. In the embodiments discussed with reference to FIGS. 10-12, the quantum dot formation regions 111 may be defined by fins 104 separated by portions of insulating material 188; these fins 104 may provide parallel rows of portions of quantum well layers 152 in which quantum dots 142 may form. Thus, the quantum dot formation regions 111 of the quantum dot device 200 of FIGS. 10-12 and of the quantum dot device 100 of FIGS. 1-4 illustrate two different ways of defining the quantum dot formation regions 111.

As noted above, each of the fins 104 may include a quantum well layer (not shown in FIGS. 10-12 but discussed above with reference to the quantum well layer 152). The quantum well layer included in the fins 104 may be arranged normal to the z-direction, and may provide a layer in which a 2DEG may form to enable the generation of a quantum dot during operation of the quantum dot device 200, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 180 between about 5 and 80 nanometers. In some embodiments, the fins 104 may each have a height 186 between about 100 and 400 nanometers (e.g., between about 150 and 350 nanometers, or equal to about 300 nanometers).

The fins 104 may be arranged in parallel, as illustrated in FIGS. 10 and 12, and may be spaced apart by an insulating material 188, which may be disposed on opposite faces of the fins 104. The insulating material 188 of the quantum dot device 200 may be a dielectric material, such as silicon oxide, similar to the insulating material 128 of the quantum dot device 100. For example, in some embodiments, the fins 104 may be spaced apart by a distance 190 between about 100 and 250 microns.

Multiple gates may be disposed on each of the fins 104. In the embodiment illustrated in FIG. 11, three gates 106 and two gates 108 are shown as distributed on the top of the fin 104. This particular number of gates is simply illustrative, and any suitable number of gates may be used. Additionally, multiple groups of gates like the gates illustrated in FIG. 11 may be disposed on the fin 104.

Similar to the quantum dot device 100, in the quantum dot device 200, as shown in FIG. 11, the gate 108-1 may be disposed between the gates 106-1 and 106-2, and the gate 108-2 may be disposed between the gates 106-2 and 106-3, and each of the gates 106/108 may include a gate dielectric 114. In the embodiment illustrated in FIG. 11, the gate dielectric 114 for all of the gates 106/108 is provided by a common layer of gate dielectric material. In other embodiments, the gate dielectric 114 for each of the gates 106/108 of the quantum dot device 200 may be provided by separate portions of gate dielectric 114. Descriptions provided with respect to materials of the gate dielectric 114 of the quantum dot device 100 are applicable to the gate dielectric 114 of the quantum dot device 200 and, therefore, are not repeated.

In the quantum dot device 200, each of the gates 106 may include a gate metal 110 and a hardmask 116, similar to those of the quantum dot device 100. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 11 for ease of illustration. In some embodiments, the hardmask 116 may not be present in the quantum dot device 200 (e.g., a hardmask like the hardmask 116 may be removed during processing). In the quantum dot device 200, the sides of the gate metal 110 may be substantially parallel, as shown in FIG. 11, and insulating spacers 134 may be disposed on the sides of the gate metal 110 and the hardmask 116, similar to the insulating spacers 134 of the quantum dot device 100. As illustrated in FIG. 11, the spacers 134 may be thicker closer to the fin 104 and thinner farther away from the fin 104. In some embodiments, the spacers 134 may have a convex shape. Descriptions provided with respect to materials of the gate metal 110, the hardmask 116, and the spacers 134 of the quantum dot device 100 are applicable to those of the quantum dot device 200 and, therefore, are not repeated.

In the quantum dot device 200, each of the gates 108 may include a gate metal 112 and a hardmask 118, similar to those of the quantum dot device 100. The gate metal 112 may be disposed between the hardmask 118 and the gate dielectric 114, and the gate dielectric 114 may be disposed between the gate metal 112 and the fin 104. In the embodiment illustrated in FIG. 11, the hardmask 118 may extend over the hardmask 116 (and over the gate metal 110 of the gates 106), while in other embodiments, the hardmask 118 may not extend over the gate metal 110. In some embodiments, the gate metal 112 may be a different metal from the gate metal 110; in other embodiments, the gate metal 112 and the gate metal 110 may have the same material composition. In some embodiments, the hardmask 118 may not be present in the quantum dot device 200 (e.g., a hardmask like the hardmask 118 may be removed during processing). Descriptions provided with respect to materials of the gate metal 112 and the hardmask 118 of the quantum dot device 100 are applicable to those of the quantum dot device 200 and, therefore, are not repeated.

The gate 108-1 may extend between the proximate spacers 134 on the sides of the gate 106-1 and the gate 106-2 along the longitudinal axis of the fin 104, as shown in FIG. 11. In some embodiments, the gate metal 112 of the gate 108-1 may extend between the spacers 134 on the sides of the gate 106-1 and the gate 106-2 along the longitudinal axis of the fin 104. Thus, the gate metal 112 may have a shape that is substantially complementary to the shape of the spacers 134, as shown in FIG. 11. Similarly, the gate 108-2 may extend between the proximate spacers 134 on the sides of the gate 106-2 and the gate 106-3 along the longitudinal axis of the fin 104. In some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 in the quantum dot device 200 may take any suitable values. For example, in some embodiments, the z-height 192 of the gate metal 110 may be between about 40 and 75 nanometers (e.g., approximately about 50 nanometers); the z-height of the gate metal 112 may be in the same range. In embodiments like the ones illustrated in FIG. 11, the z-height of the gate metal 112 may be greater than the z-height of the gate metal 110. In some embodiments, the length 168 of the gate metal 110 (i.e., in the x-direction) in the quantum dot device 200 may be substantially the same as in the quantum dot device 100, e.g., between about 20 and 40 nanometers (e.g., about 30 nanometers). In some embodiments, the distance 170 and/or the thickness 172 shown for the quantum dot device 200 of FIG. 11 may be substantially the same as those shown for the quantum dot device 100 of FIG. 2. The length of the gate metal 112 (i.e., in the x-direction) may depend on the dimensions of the gates 106 and the spacers 134, as illustrated in FIG. 11. As indicated in FIG. 10, the gates 106/108 on one fin 104 may extend over the insulating material 188 beyond their respective fins 104 and towards the other fin 104, but may be isolated from their counterpart gates by the intervening insulating material 130.

In the embodiment of the quantum dot device 200 illustrated in FIG. 11, the z-height of the gate metal 112 of the gates 108 may be approximately equal to the sum of the z-height of the gate metal 110 and the z-height of the hardmask 116, as shown. Also, in the embodiment of FIG. 11, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction.

As shown in FIG. 11, the gates 106 and 108 may be alternatingly arranged along the fin 104 in the x-direction. During operation of the quantum dot device 200, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 11 and 12 for ease of illustration, but five are indicated as dotted circles in each fin 104, forming what may be referred to as a "quantum dot array." The location of the quantum dots 142 in FIG. 11 is not intended to indicate a particular geometric positioning of the quantum dots 142. Similar to the quantum dot device 100, in the quantum dot device 200, the spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 200. Descriptions of the n-type doped region 140, the p-type doped region 140, the interface material 141, how the voltages may be applied to the gates 106/108 to form quantum wells/barriers, how the gates 108 may be used as plunger gates while the gates 106 may be used as barrier gates, and of conductive vias and lines that may make contact with the gates 106/108 and with the doped regions 140, provided with respect to the quantum dot device 100 are applicable to the quantum dot device 200 and, therefore, are not repeated. As shown in FIGS. 10-12, the gates 106 may extend away from the fins 104, and conductive vias 120 may contact the gates 106 (and are drawn in dashed lines in FIG. 11 to indicate their location behind the plane of the drawing). The gates 108 may similarly extend away from the fins 104, and conductive vias 122 may contact the gates 108 (also drawn in dashed lines in FIG. 11 to indicate their location behind the plane of the drawing). The quantum dot device 200 may include further conductive vias and/or lines (not shown) to make electrical contact to the gates 106/108 and/or the doped regions 140, as desired. Descriptions of the bias voltage that may be applied to the doped regions 140 and of the conductive vias 120, 122, and 136, provided with respect to the quantum dot device 100 are applicable to the quantum dot device 200 and, therefore, are not repeated. Furthermore, although not shown in FIGS. 10-12, in some embodiments, the quantum dot device 200 may include one or more magnet lines such as the magnet line 121 described with reference to the quantum dot device 100.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 200 enables both quantum computation and the ability to read the results of a quantum computation.

As discussed above, the base 102 and the fin 104 of a quantum dot device 200 may be formed from a semiconductor substrate 144 and a quantum well stack 146 disposed on the semiconductor substrate 144. The quantum well stack 146 may include a quantum well layer in which a 2DEG may form during operation of the quantum dot device 200. The quantum well stack 146 may take any of a number of forms, several of which were illustrated in FIGS. 5-7 and were discussed above, which descriptions are, therefore, not repeated here.

The semiconductor substrate 144 and the quantum well stack 146 may be distributed between the base 102 and the fins 104 of the quantum dot device 200, as discussed above. This distribution may occur in any of a number of ways. For example, FIGS. 13-19 illustrate example base/fin arrangements 158 that may be used in a quantum dot device 200, in accordance with various embodiments.

Figure 13:
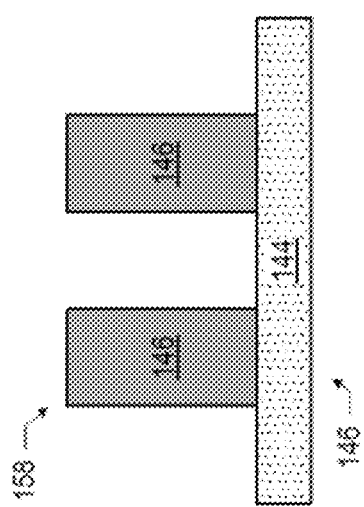

In the base/fin arrangement 158 of FIG. 13, the quantum well stack 146 may be included in the fins 104, but not in the base 102. The semiconductor substrate 144 may be included in the base 102, but not in the fins 104. Manufacturing of the base/fin arrangement 158 of FIG. 13 may include fin etching through the quantum well stack 146, stopping when the semiconductor substrate 144 is reached.

Figure 14:
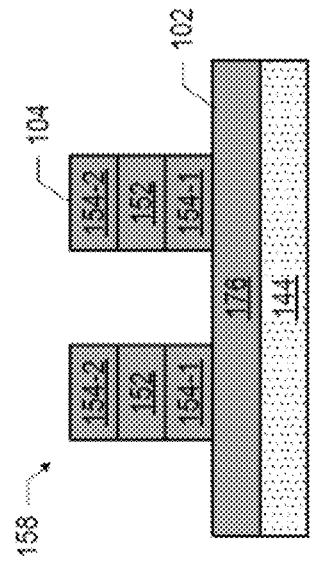
Figure 15:
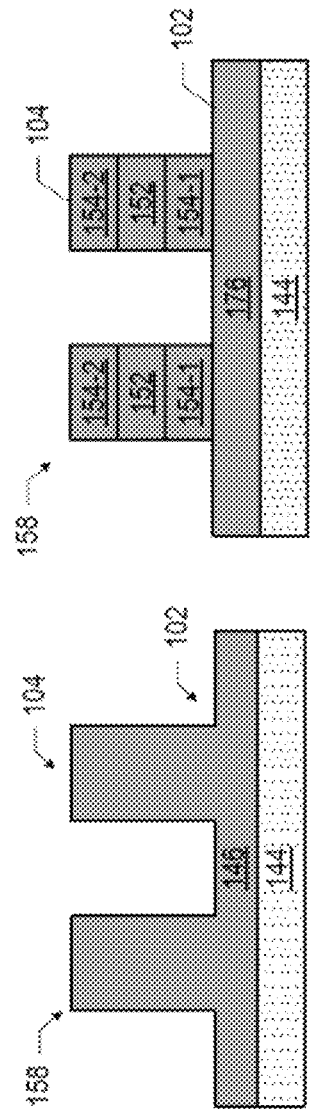

In the base/fin arrangement 158 of FIG. 14, the quantum well stack 146 may be included in the fins 104, as well as in a portion of the base 102. A semiconductor substrate 144 may be included in the base 102 as well, but not in the fins 104. Manufacturing of the base/fin arrangement 158 of FIG. 14 may include fin etching that etches partially through the quantum well stack 146, and stops before the semiconductor substrate 144 is reached. FIG. 15 illustrates a particular embodiment of the base/fin arrangement 158 of FIG. 14. In the embodiment of FIG. 15, the quantum well stack 146 of FIG. 7 is used; the fins 104 include the barrier layer 154-1, the quantum well layer 152, and the barrier layer 154-2, while the base 102 includes the buffer layer 176 and the semiconductor substrate 144.

In the base/fin arrangement 158 of FIG. 16, the quantum well stack 146 may be included in the fins 104, but not the base 102. The semiconductor substrate 144 may be partially included in the fins 104, as well as in the base 102.

Manufacturing the base/fin arrangement 158 of FIG. 16 may include fin etching that etches through the quantum well stack 146 and into the semiconductor substrate 144 before stopping. FIG. 17 illustrates a particular embodiment of the base/fin arrangement 158 of FIG. 16. In the embodiment of FIG. 17, the quantum well stack 146 of FIG. 7 is used; the fins 104 include the quantum well stack 146 and a portion of the semiconductor substrate 144, while the base 102 includes the remainder of the semiconductor substrate 144.

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 18, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 18. FIG. 19 illustrates a particular embodiment of the base/fin arrangement 158 of FIG. 18. In FIG. 19, the quantum well stack 146 is included in the tapered fins 104 while a portion of the semiconductor substrate 144 is included in the tapered fins and a portion of the semiconductor substrate 144 provides the base 102.

Scalable Gate Control

Figure 20:
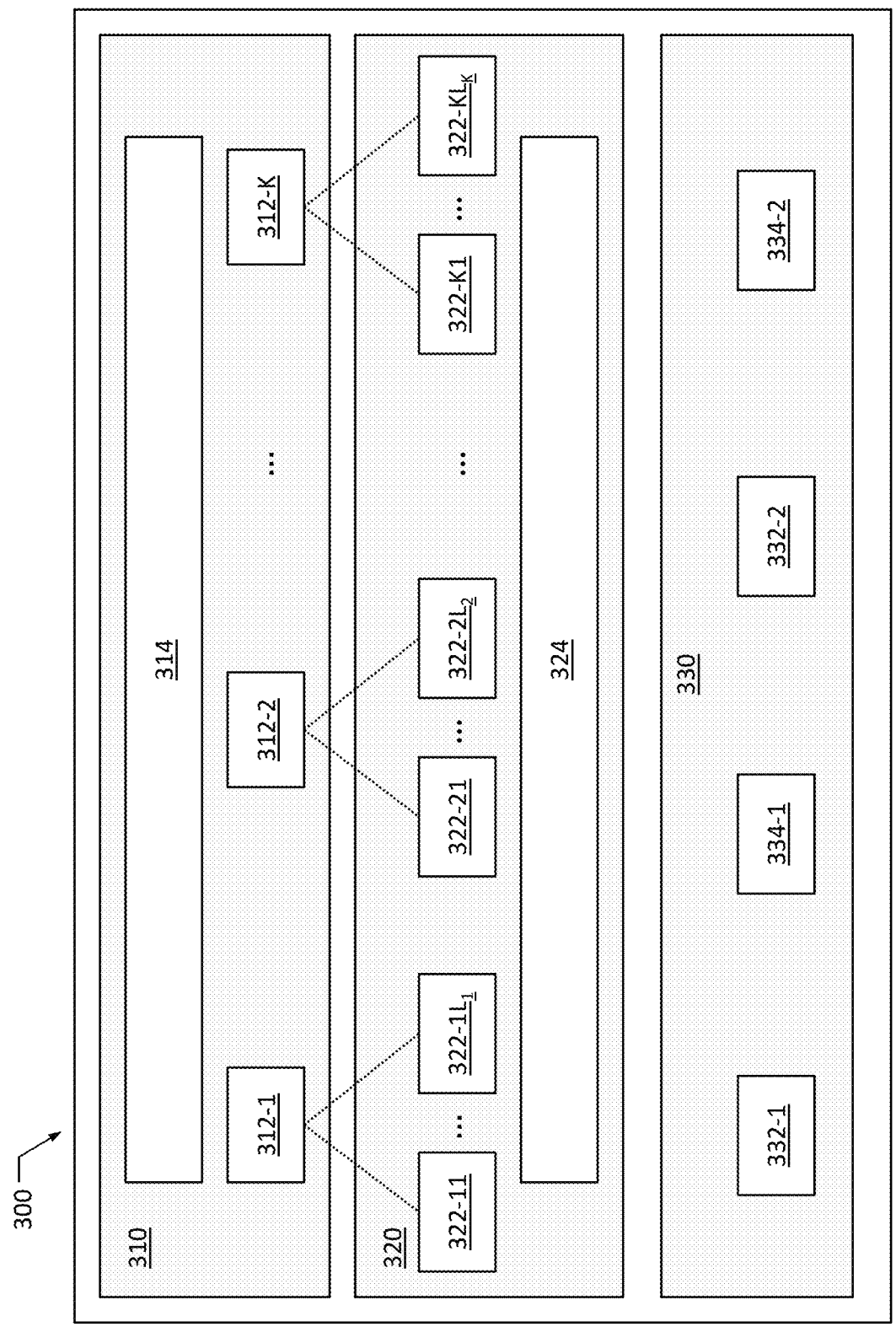
FIG. 20 is a block diagram of an example quantum circuit assembly in which scalable gate control as described herein may be implemented, in accordance with some embodiments.

FIG. 20 is a block diagram of an example quantum circuit assembly 300 in which scalable gate control as described herein may be implemented, in accordance with some embodiments. As shown in FIG. 20, a quantum circuit assembly 300 may include a qubit device 310, a pulse control assembly 320, and a signal source assembly 330.

The qubit device 310 may include a plurality of terminals 312, shown in FIG. 20 as K terminals 312, labeled as terminals 312-1 through 312-K, where K may be any integer greater than 1. In some embodiments, the qubit device 310 may be the quantum dot device 100 or the quantum dot device 200 as described above, in which case the terminals 312 may be the gates 106/108 and/or the magnet lines 121 as described above. For example, if the qubit device 310 is a quantum dot device implementing an array of N qubits, then K may be equal to 3N+1 if the terminals 312 are gates of the quantum dot device to which AC signal pulses are to be applied. The qubit device 310 may further include one or more qubit components 314. For example, if the qubit device 310 is the quantum dot device 100 or the quantum dot device 200 as described above, then the one or more qubit components 314 may include one or more rows of quantum dot formation regions 111 as described above. For example, in some embodiments, the qubit device 310 may include a quantum well stack structure that includes one or more rows of quantum dot formation regions, and further comprising a plurality of terminals 312 in the form of the gates 106/108 extending to the one or more rows. The rows of quantum dot formation regions of the one or more qubit components 314 may either be defined by trenches (e.g., trenches 103 as described above) or by fins (e.g., fins 104 as described above). In case of the former, the one or more qubit components 314 may include a continuous quantum well stack that includes one or more rows of the quantum dot formation region, and the qubit device 310 may further include an insulating material provided over the continuous quantum well stack, the insulating material including a trench corresponding to each of the rows, the trench extending toward the continuous quantum well stack, and a portion of a gate metal of individual ones of the plurality of gates being at least partially in the trench, as described with reference to the quantum dot device 100. In case of the latter, the one or more qubit components 314 may include a quantum well stack shapes as one or more fins, each fin corresponding to, or including, a row of the quantum dot formation region, and the qubit device 310 may further include a gate metal of individual ones of the plurality of gates is provided over the fin, as described with reference to the quantum dot device 200.

The pulse control assembly 320 may be configured to control operation of the qubit device 310. To that end, the pulse control assembly may include a plurality of signal paths 322 and a switch arrangement 324.

The signal paths 322 are configured to apply signals (e.g., AC pulses) to various ones of the terminals 312 by being coupled to respective terminals 312, and, as will be described in greater detail below, each signal path 322 may include a first capacitor and a second capacitor. The switch arrangement 324 may include a plurality of switches, configured to operate different signal paths 322 in one of a plurality of phases (which may also be referred to as "modes") to enable the signals paths 322 to apply signals to the respective terminals 312. For example, as will be described in greater detail below, the switch arrangement 324 may be configured to operate a given signal path 322, coupled to one of the terminals 312 (e.g., by having the first capacitor of the signal path 322 being coupled to one of the terminals 312), in one of a first phase, a second phase, and a third phase. In the first phase, the switch arrangement 324 may be configured to ensure that the second capacitor is decoupled from the first capacitor and the first capacitor is configured to charge to a first voltage (i.e., to store a first charge), the first voltage/charge indicative of a static DC signal to be applied to the terminal. In the second phase, following the first phase, the switch arrangement 324 may be configured to ensure that the second capacitor is decoupled from the first capacitor and the second capacitor is configured to charge to a second voltage (i.e., to store a second charge), the second voltage/charge indicative of the AC signal pulse to be applied to the terminal. In the third phase, following the second phase, the switch arrangement 324 may be configured to ensure that the second capacitor is coupled to the first capacitor to apply the AC signal pulse to the terminal by virtue of the first capacitor being coupled to the terminal. In some embodiments, the arrangements described herein allow applying different AC signal pulses to multiple gates substantially simultaneously. In some embodiments, the switch arrangement 324 may be implemented so that each of the signal paths 322 includes respective (i.e., different) set of switches configured to selectively couple and decouple first and second capacitors of the signal path 322 to each other and various further components as described herein. In such embodiments, a set of switches associated with a given signal path 322 may be configured to operate in a first state or in a second state. In the first state, the set of switches associated with a given signal path 322 may be configured to decouple the second capacitor and the first capacitor of the signal path 322 from one another, while, in the second set, the set of switches associated with a given signal path 322 may be configured to couple the first and second capacitors of the signal path 322. In the first state, the first capacitor of the signal path 322 may be configured to store a first charge (e.g., in the first phase of the signal path 322) and the second capacitor of the signal path 322 may be configured to store a second charge (e.g., in the second phase of the signal path 322). In the second state, at least a portion of the second charge stored in the second capacitor of the signal path 322 may be applied to the terminal 312 to which the signal path 322 is coupled to, thus applying a signal (e.g., a voltage pulse, referred to herein as an "AC signal pulse") to the terminal 312.

In general, a given terminal 312 may be associated with one or more signal paths 322 (i.e., one or more signal paths 322 may be used to provide signals to be used to a given terminal 312), the association illustrated in FIG. 20 with dotted lines between terminals 312 and individual of the signal paths 322. As shown in FIG. 20, each signal path 322 may be associated with only one terminal 312, although this may be different in other embodiments of the quantum circuit assembly 300. Furthermore, in general, different ones of the terminals 312 may be associated with same or different numbers of the signal paths 322. This is illustrated in FIG. 20 and some of the subsequent drawings with $L_1$ signal paths 322 being associated with the first terminal 312-1 (the $L_1$ signal paths 322 for the terminal 312-1 labeled in the present drawings as signal paths 322-11 through 322-1$L_1$), $L_2$ signal paths 322 being associated with the second terminal 312-2 (the $L_2$ signal paths 322 for the terminal 312-2 labeled in the present drawings as signal paths 322-21 through 322-2$L_2$), and so on to $L_K$ signal paths 322 being associated with the terminal 312-K (the $L_K$ signal paths 322 for the terminal 312-K labeled in the present drawings as signal paths 322-K1 through 322-K$L_K$). Thus, the signal paths 322 for different terminals 312 are labeled in FIG. 20 with a dash after the reference numeral "322" and with the first digit corresponding to the number k of the terminal 312 (where k is an integer between 1 and K) and the second digit corresponding to the number I of the signal path 322 for the terminal 312-$k$ (where I is an integer between 1 and $L_k$). Any of $L_1, \ldots, L_K$ may be any integer equal to or greater than 1, and, in general, any two or more of $L_1, \ldots, L_K$ may be the same, or all of $L_1, \ldots, L_K$ may be different integers.

The signal source assembly 330 may include one or more signal sources 332 and one or more multiplexers 334 for providing various signals to various ones of the signal paths 322 to enable the pulse control assembly 320 to apply signals to various ones of the terminals 312, thus providing scalable gate control of the terminals 312 of the qubit device 310. FIG. 20 and subsequent drawings illustrate embodiments where the signal source assembly 330 includes a first signal source 332-1 associated with a first multiplexer 334-1, and further includes a second signal source 332-2 associated with a second multiplexer 334-2, to provide signals to various signal paths 322 as described herein. For example, the first signal source 332-1 may be a DC DAC, configured to provide analog signals to various signal paths 322 (e.g., by means of the first multiplexer 334-1 selecting to which of the signal paths 322 the output of the first signal source 332-1 should be routed to), the analog signals indicative of the DC voltage or charge to be accumulated by the first capacitors of the signal paths 322, while the second signal source 332-2 may be an AC DAC, configured to provide analog signals to various signal paths 322 (e.g., by means of the second multiplexer 334-2 selecting to which of the signal paths 322 the output of the second signal source 332-2 should be routed to), the analog signals indicative of the AC voltage or charge to be accumulated by the second capacitors of the signal paths 322. However, in general, the signal source assembly 330 may include more or less of the signal sources 332 and/or multiplexers 334 to enable the scalable gate control as described herein. It should be noted that the terms "DC voltage" and "AC voltage" in context of voltages accumulated by the, respectively, first and second capacitors as described herein merely refer to different voltage values to which the capacitors are charged, and do not have anything to do with "DC signals" and "AC signals" as such.

A signal source 332 implemented as a DC DAC may be configured to apply bias signals (e.g., DC signals) to various terminals 312, e.g., to set the operating point of various circuit components of the qubit device 310. In some embodiments, a signal source 332 implemented as an AC DAC may be configured to apply microwave signals (e.g., signals with frequencies between about 1 and 1000 GHz), e.g., microwave pulses, to various terminals 312, e.g., to influence the spin states of the quantum dots 142 as described above, if the qubit device 310 is a quantum dot device 100 or 200. In some embodiments, a signal source 332 implemented as an AC DAC may be configured to apply baseband signals (e.g., signals with frequencies between about 0 and 300 MHz) e.g., baseband pulses, to various terminals 312, e.g., baseband signals may be sent through a directional coupler to a matching network attached to a source region of an SET detector of the qubit device 310. Any of the microwave or baseband signals may be applied as pulses or as continuous signals. For example, spin qubits may be controlled by sequences of microwave pulses and fast and slow square shaped voltage pulses. Signals applied to various terminals 312 of the qubit device 310 may represent atomic operations of quantum algorithms, quantum device calibration routines, status control and updates, state readout and detection. In various implementations, the state of the qubits of the qubit device 310 could be determined by current measurements and/or by reflectometry on a charge-coupled SET device. If the qubit device 310 is a quantum dot device 100 or 200 as described above, then, in some embodiments, some of the signal paths 322 may be configured to perform actions in the form of applying signals to various gates 106/108 (i.e., implemented as terminals 312) associated with the active row of the quantum dot formation region 111 to control formation of active quantum dots 142 in the active row of quantum dot formation region 111, while other signal paths 322 may be configured to perform actions in the form of applying signals to various gates 106/108 associated with the read row of the quantum dot formation region 111 to control formation of read quantum dots 142 in the read row of quantum dot formation region 111.

Figure 21:
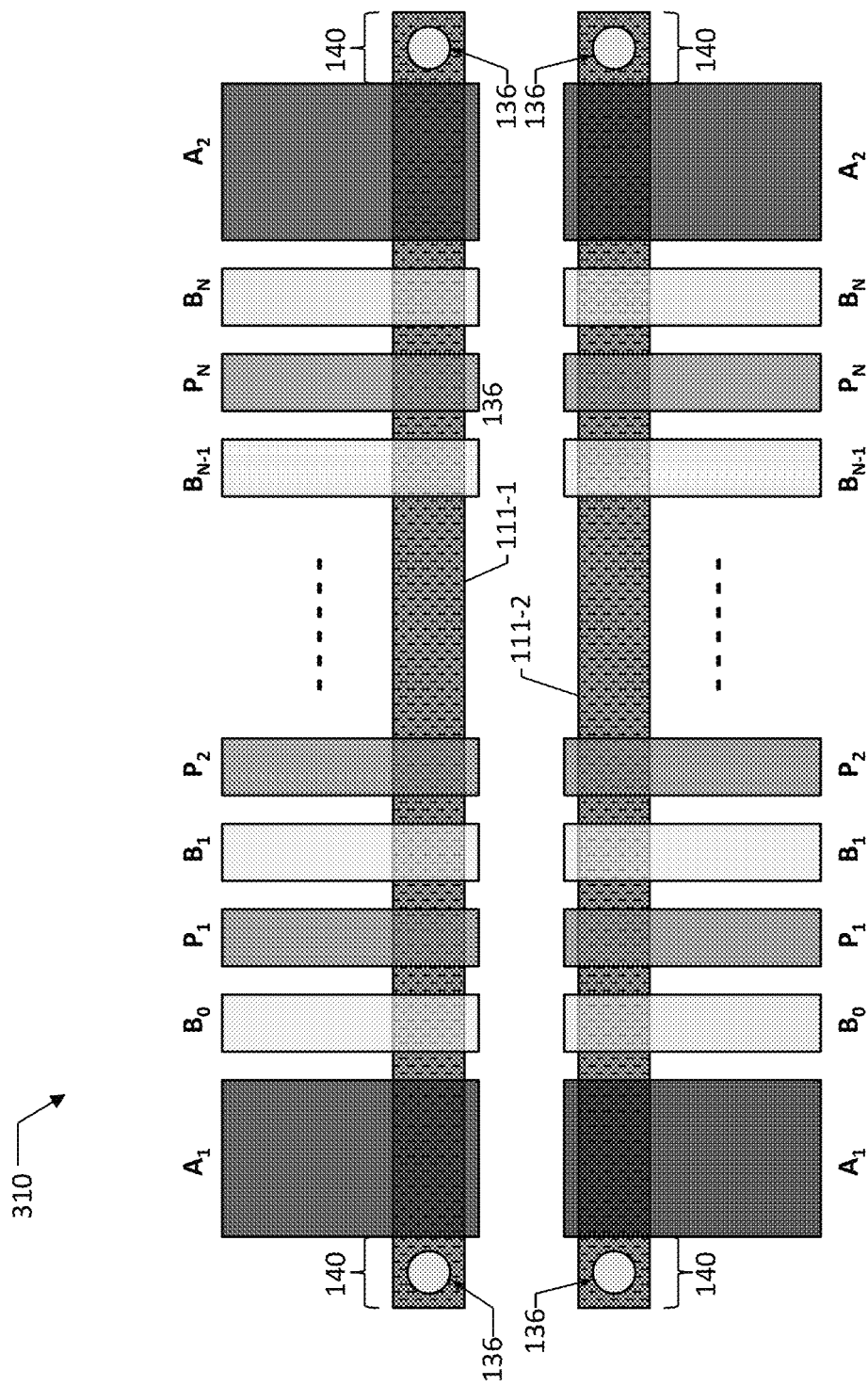
FIG. 21 provides a schematic illustration of an example qubit device for which scalable gate control as described herein may be implemented, according to some embodiments of the present disclosure.

FIG. 21 provides a schematic illustration of a top-down view of a qubit device 400, providing one example of the qubit device 310 for which scalable gate control as described herein may be implemented, according to some embodiments of the present disclosure. The qubit device 400 is a quantum dot device similar to the quantum dot devices 100 or 200, described above, and, therefore, the view of FIG. 21 is similar to the top-down views of FIGS. 4 and 12, except that the qubit device 400 provides an example of a quantum dot device with more gates than just the five gates for each of the two quantum dot formation regions 111 shown in the examples of FIGS. 4 and 12. Similar to FIGS. 4 and 12, the qubit device 400 includes two quantum dot formation regions 111— a quantum dot formation region 111-1 for the active gates and a quantum dot formation region 111-2 for the read gates. In particular, FIG. 21 illustrates an example with the active gates, i.e., the gates over the quantum dot formation region 111-1, including N+1 barrier gates, labeled as gates Bo through $B_N$, N plunger gates, labeled as gates $P_1$ through $P_N$, and two accumulation gates, labeled as gates $A_1$ and $A_2$. Similarly, FIG. 21 illustrates an example with the read gates, i.e., the gates over the quantum dot formation region 111-2, including N+1 barrier gates, labeled as gates B0 through $B_N$, N plunger gates, labeled as gates $P_1$ through $P_N$, and two accumulation gates, labeled as gates $A_1$ and $A_2$. In such a device N quantum dots 142 may be formed (e.g., under the N active plunger gates $P_1$ through $P_N$), thus implementing an N-qubit array. Various gates of the qubit device 400 may be examples of different terminals 312. In particular, 3N+1 of the gates of the qubit device 400 may benefit from having AC pulses applied to them using scalable gate control as described herein. Such 3N+1 gates may be composed of, e.g., all plunger gates of the qubit device 400 (i.e., a total of 2N plunger gates–N on the active side and N on the read side) and active barrier gates (i.e., a total of N+1 barrier gates on the active side of the qubit device 400). FIG. 21 further illustrates conductive vias 136 as examples of conductive contacts to the doped regions 140, as described above. Although illustrated in FIG. 21 as being adjacent to the outermost accumulation gates $A_1$ and $A_2$, in other embodiments, the doped regions 140 corresponding to the accumulation gates $A_1$ and $A_2$ may be not necessarily adjacent to these respective gates. Although FIG. 21 illustrates an implementation where barrier, plunger, and accumulation read gates have a one-to-one correspondence to the barrier, plunger, and accumulation active gates, this may be different in other embodiments of the qubit device 400.

Figure 22A:
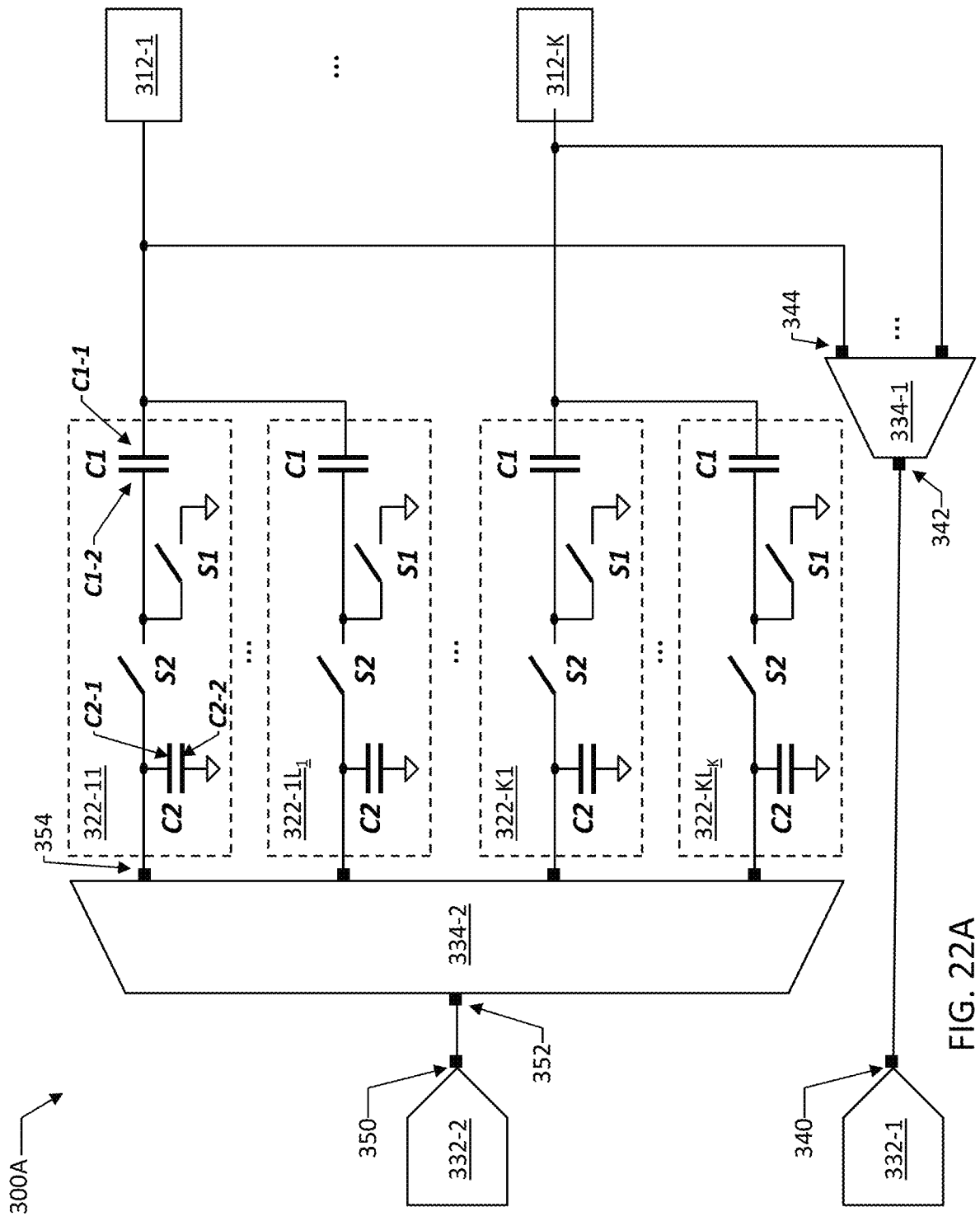
FIGS. 22A-22C provide schematic illustrations of quantum circuit assemblies with different implementations of a pulse control assembly configured to realize scalable gate control of multiple terminals of a qubit device, according to some embodiments of the present disclosure.
Figure 22B:
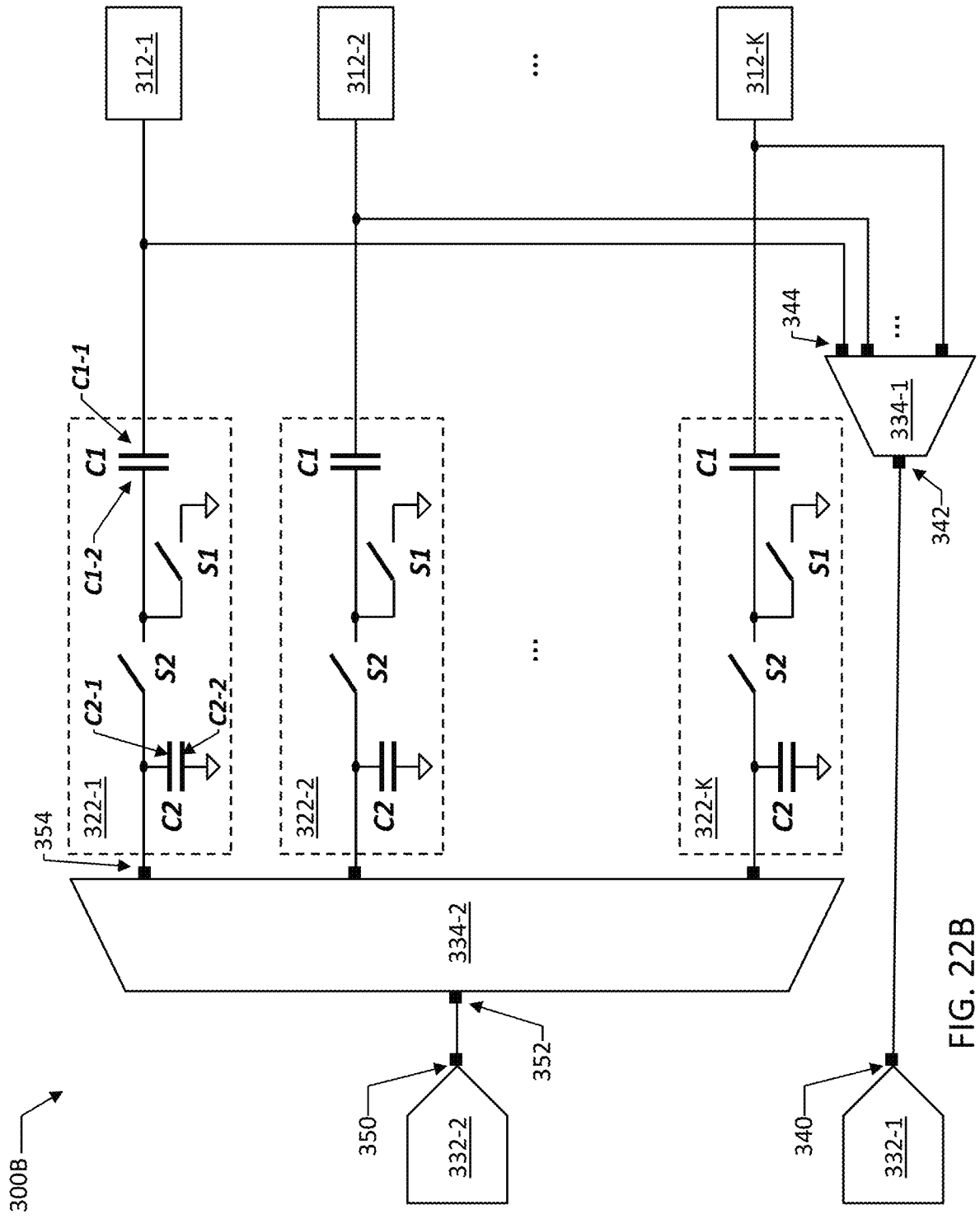
Figure 22C:
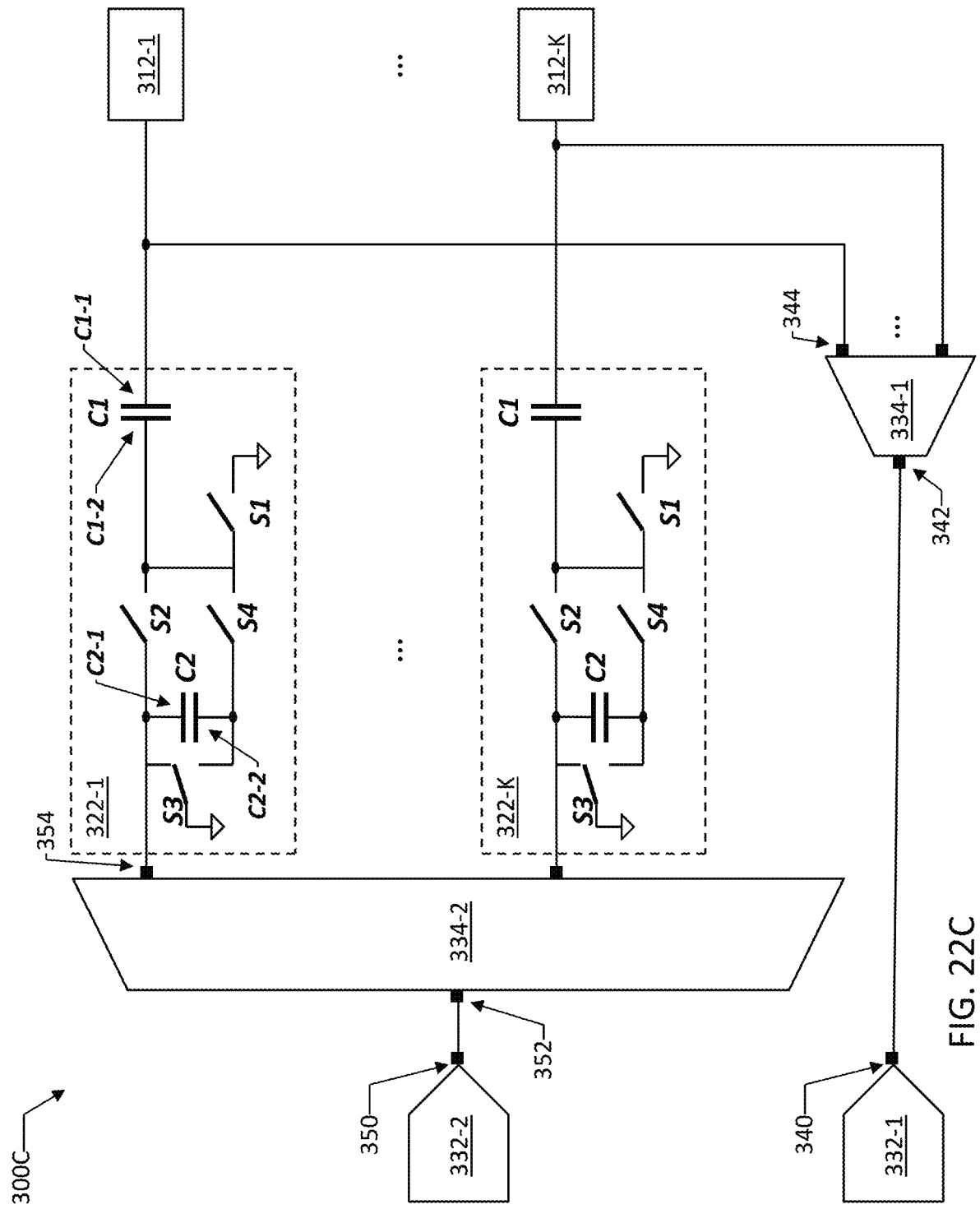

FIGS. 22A-22C provides schematic illustrations of quantum circuit assemblies 300 with different implementations of a pulse control assembly 320 configured to realize scalable gate control of multiple terminals 312 of a qubit device 310, according to some embodiments of the present disclosure.

FIG. 22A illustrates a quantum circuit assembly 300A, which provides a first example of the quantum circuit assembly 300 as described above. In particular, the quantum circuit assembly 300A illustrates multiple signal paths 322 per single terminal 312. Similar to the illustration of FIG. 20, FIG. 22A illustrates K terminals 312 and $L_k$ signal paths 322-$k$1.

FIG. 22A also illustrates a first signal source 332-1, which may be a DC DAC, having an output 340 coupled to an input 342 of a first multiplexer 334-1. The first multiplexer 334-1 may include a plurality of outputs 344, each of the outputs 344 coupled to different one of the terminals 312 (thus, the first multiplexer 334-1 of the quantum circuit assembly 300A has K outputs 344). The first multiplexer 334-1 may be configured to receive, at the input 342, a signal indicative of the output signal of the DC DAC, provided at the output 340, and to provide a signal indicative of the signal received at the input 342 to one of the first multiplexer outputs 344. In this manner, a single DC DAC 332-1 may be used to provide DC signals (e.g., bias signals) to multiple terminals 312, via the first multiplexer 334-1.

Furthermore, FIG. 22A illustrates a second signal source 332-2, which may be an AC DAC, having an output 350 coupled to an input 352 of a second multiplexer 334-2. The second multiplexer 334-2 may include a plurality of outputs 354, each of the outputs 354 coupled to different one of the signal paths 322 (thus, the second multiplexer 334-2 of the quantum circuit assembly 300A has a total of $L_1+ \ldots +L_k$ outputs 354). The second multiplexer 334-2 may be configured to receive, at the input 352, a signal indicative of the output signal of the AC DAC, provided at the output 350, and to provide a signal indicative of the signal received at the input 352 to one of the second multiplexer outputs 354. In this manner, a single AC DAC 332-2 may be used to provide AC pulse signals to multiple terminals 312, via the second multiplexer 334-2.

As shown in FIG. 22A, each signal path 322 includes a first capacitor (C1) coupled to one of the terminals 312 and a second capacitor (C2). Now, a single signal path 322-$k$1 of the quantum circuit assembly 300A will be described.

In a given signal path 322-$k$1, the first capacitor C1 may have a first capacitor electrode C1-1 and a second capacitor electrode C1-2, while, similarly, the second capacitor C2 may have a first capacitor electrode C2-1 and a second capacitor electrode C2-2 (these capacitor electrodes labeled in FIG. 22A only for the signal path 322-11 in order to not clutter the drawing, and not specifically labeled in the subsequent drawings illustrating analogous capacitors C1 and C2). The first capacitor electrode C1-1 may be coupled to the respective terminal 312-$k$ to which the signal path 322-$k$1 is supposed to apply a signal to. The second capacitor electrode C1-2 may be coupled to a first switch S1 that may selectively couple and decouple the capacitor C1 and a ground potential (or, more generally, a first reference potential), the first reference potential illustrated in FIG. 22A as a triangle that the switch S1 is coupled to. The first capacitor electrode C2-1 may be coupled to the respective one of output 354 of the second multiplexer 334-2, as well as to a second switch S2 that may selectively couple and decouple the capacitor C2 and the capacitor C1. More specifically, the second switch S2 may selectively couple and decouple the first capacitor electrode C2-1 of the capacitor C2 and the second capacitor electrode C1-2 of the capacitor C1. The second capacitor electrode C2-2 may be coupled and a ground potential (or, more generally, a second reference potential), the second reference potential illustrated in FIG. 22A as a triangle that the second capacitor electrode C2-2 is coupled to.

As also shown in FIG. 22A, for the first capacitors C1, the first capacitor electrodes C1-1 of multiple signal paths 322-$k$1 associated with a given terminal 312-$k$ are coupled to one another, which may provide provision of multiple AC pulses to the terminal 312-$k$, as will be described below. For the second capacitors C2, the first capacitor electrodes C2-1 of multiple signal paths 322-$k$1 are coupled to different outputs 354 of the second multiplexer 334-2, to receive signals to provide multiple AC pulses to the terminals 312-$k$, as will also be described below.

FIG. 22B illustrates a quantum circuit assembly 300B, which provides a second example of the quantum circuit assembly 300 as described above. In particular, the quantum circuit assembly 300B may be seen as a subset of the quantum circuit assembly 300A in that each terminal 312 is associated with only one signal path 322. In other words, the quantum circuit assembly 300B is substantially the same as the quantum circuit assembly 300A where $L_1=L_2= \ldots = L_k=1$. The rest of the descriptions of the quantum circuit assembly 300A are applicable to the quantum circuit assembly 300B and, therefore, in the interests of brevity, are not repeated.

FIG. 22C illustrates a quantum circuit assembly 300C, which provides a third example of the quantum circuit assembly 300 as described above. In particular, the quantum circuit assembly 300C is similar to that shown in FIG. 22B, except for the addition of switches S3 and S4 to each of the signal paths. The switches S3 and S4 allow applying both negative or positive AC voltages on the capacitor C1, if needed, while the charging phase would only apply a positive voltage on C2. After the charging phase, keeping the switch S2 closed and the switch S3 coupled to the second capacitor electrode C2-2 of the capacitor C2 allows applying a positive AC voltage on the capacitor C1. On the other hand, after the charging phase, keeping the switch S4 closed and the switch S3 coupled to the first capacitor electrode C2-1 of the capacitor C2 allows applying a negative AC voltage on the capacitor C1. The rest of the descriptions of the quantum circuit assembly 300A are applicable to the quantum circuit assembly 300C and, therefore, in the interests of brevity, are not repeated.

Figure 23:
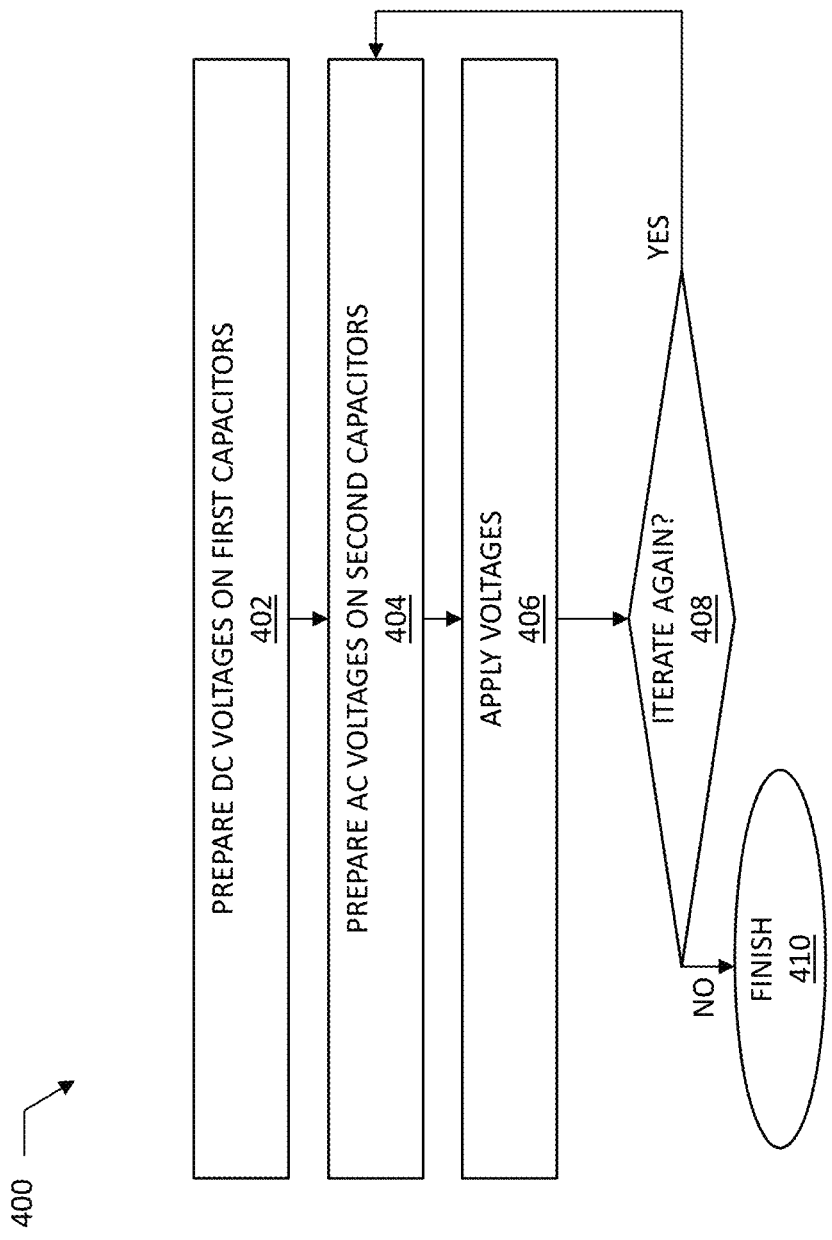
FIG. 23 provides a flow diagram of a method of operating a quantum circuit assembly with scalable gate control, according to some embodiments of the present disclosure.

FIG. 23 provides a flow diagram of a method 400 of operating a quantum circuit assembly with scalable gate control, according to some embodiments of the present disclosure. Although the method 400 is described with reference to the quantum circuit assembly 300, any quantum circuit assembly, configured to implement the processes of the method 400, in any order, is within the scope of the present disclosure. Furthermore, some of the processes of the method 400 are explained for the example of the quantum circuit assembly 300B with reference to FIGS. 24A-24C, showing coupling between various components of the quantum circuit assembly 300B, and with reference to FIGS. 25A-25C, showing various signals in the quantum circuit assembly 300B.

The method 400 may begin with a process 402, which includes the quantum circuit assembly 300, in particular, the pulse control assembly 320, preparing DC voltages on first capacitors C1. To that end, the switch arrangement 324 may be configured to ensure that the first capacitors C1 are decoupled from the second capacitors C2 (e.g., by having the switches S2 open), and that the second capacitor electrodes C1-2 of the first capacitors C1 are coupled to the first reference potential (e.g., by having the switches S1 closed). Such configuration of the switch arrangement 324 is illustrated for the quantum circuit assembly 300B in FIG. 24A. The illustration of FIG. 24A is the same as that of FIG. 22B, except that components involved in the process 402 are highlighted. With the switches S1 closed and the switches S2 open, the DC DAC 332-1 and the first multiplexer 334-1 may then apply respective DC voltages to each of the first capacitor electrodes C1-1 of the first capacitors C1, one at a time (i.e., sequentially), so that the first capacitors C1 are charged one at a time. Applying a DC voltage to a first capacitor C1 of a given signal path 322-$k$ charges the first capacitor C1 to a respective voltage, $V_{DC,k}$ (i.e., the first capacitor C1 stores a certain charge representative of the voltage $V_{DC,k}$) and the signal path 322-$k$ may then be described as being operated in a first phase. Thus, the process 402 includes sequentially operating different signals paths 322 in the first phase, where the first capacitors C1 of different signal paths 322 are charged to respective voltages $V_{DC,1}, \ldots, V_{DC,K}$. Because the first capacitor electrodes C1-1 of the capacitors C1 are coupled to respective terminals 312, this means that the process 402 includes sequentially applying respective DC voltages $V_{DC,1}, \ldots, V_{DC,K}$ to corresponding terminals 312.

Figure 25A:
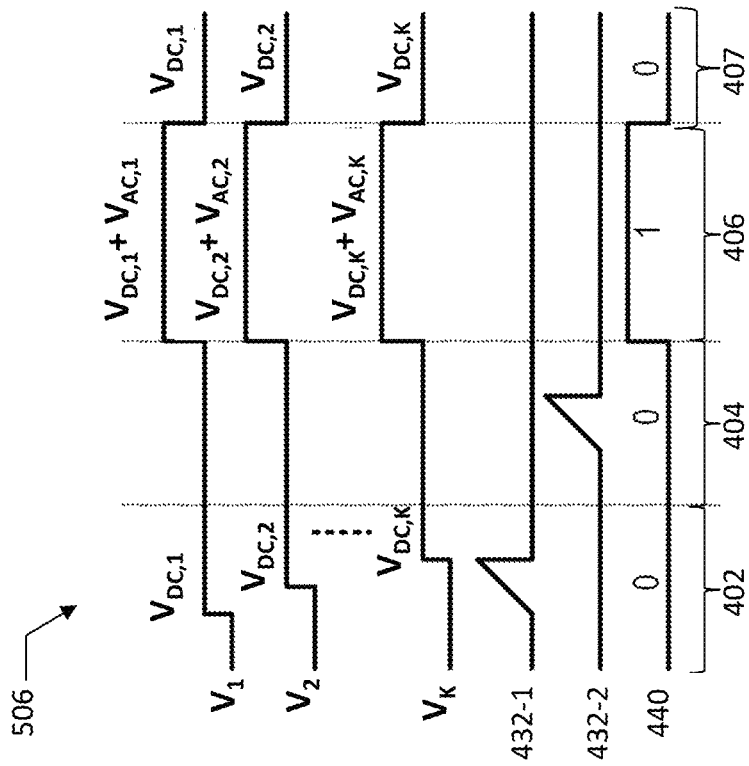
FIGS. 25A-25C illustrate various signals in the quantum circuit assembly of FIG. 22B at different points in time when operating according to the method of FIG. 23, according to some embodiments of the present disclosure.
Figures 25B, 25C:
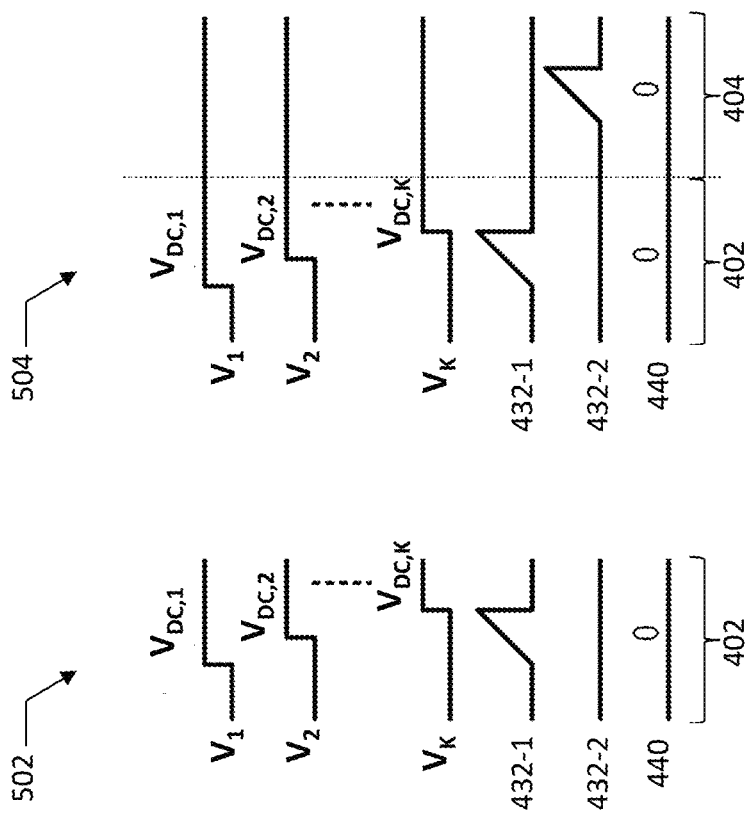

FIGS. 25A-25C illustrate various signals in the quantum circuit assembly of FIG. 22B at different points in time when operating according to the method of FIG. 23, according to some embodiments of the present disclosure. Each of FIGS. 25A-25C illustrates a diagram showing, starting from the top, a voltage $V_1$ on the terminal 312-1 of the quantum circuit assembly 300B, a voltage $V_2$ on the terminal 312-2 of the quantum circuit assembly 300B, and so on until a voltage $V_K$ on the terminal 312-K of the quantum circuit assembly 300B. FIGS. 25A-25C further show a code 432-1, that is used to control/instruct the multiplexer 334-1 (e.g., may be applied to said multiplexer) to select the desired capacitor C1 (i.e., to select the first capacitor C1 in one of the signal paths 322) to provide the signal to charge the first capacitors C1 to respective voltages so that the voltages $V_{DC,1}, \ldots,$ $V_{DC,K}$ are applied to, respectively, terminals 312-1, ..., 312-K. FIGS. 25A-25C further show a code 432-2, that is used to control/instruct the multiplexer 334-2 (e.g., may be applied to said multiplexer) to select the desired capacitor C2 (i.e., to select the second capacitor C2 in one of the signal paths 322) to provide the signal to charge the second capacitors C2 to respective voltages in the process 404 so that different voltages $V_{AC,1}, \ldots, V_{AC,K}$ can be applied to, respectively, terminals 312-1, ..., 312-K in the process 406. FIGS. 25A-25C also show a value 440 that may be indicative of the state of the switches S1 and S2 of the switch arrangement 324.

Figure 24A:
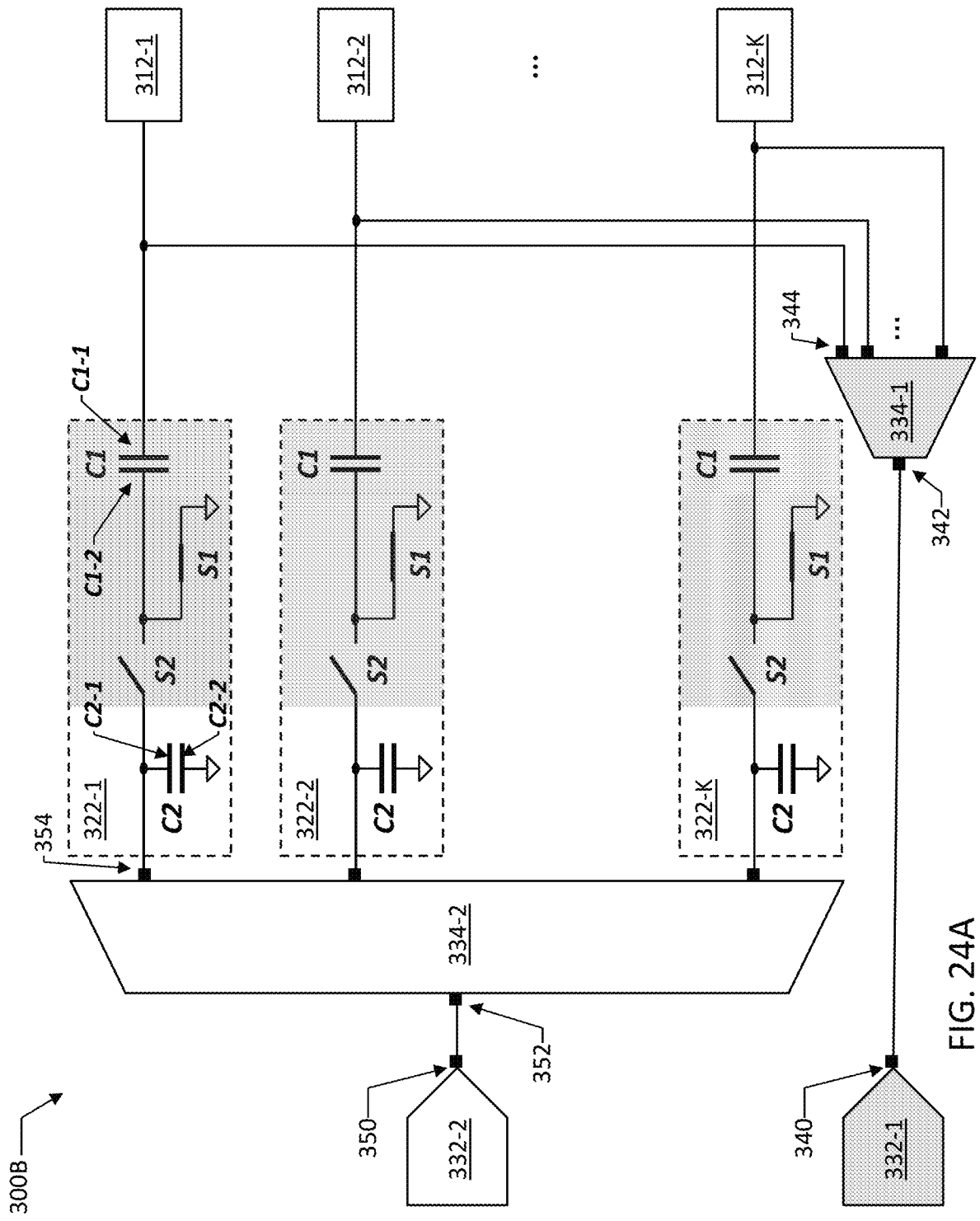
FIGS. 24A-24C provide schematic illustrations of the quantum circuit assembly of FIG. 22B at different points in time when operating according to the method of FIG. 23, according to some embodiments of the present disclosure.
Figure 24B:
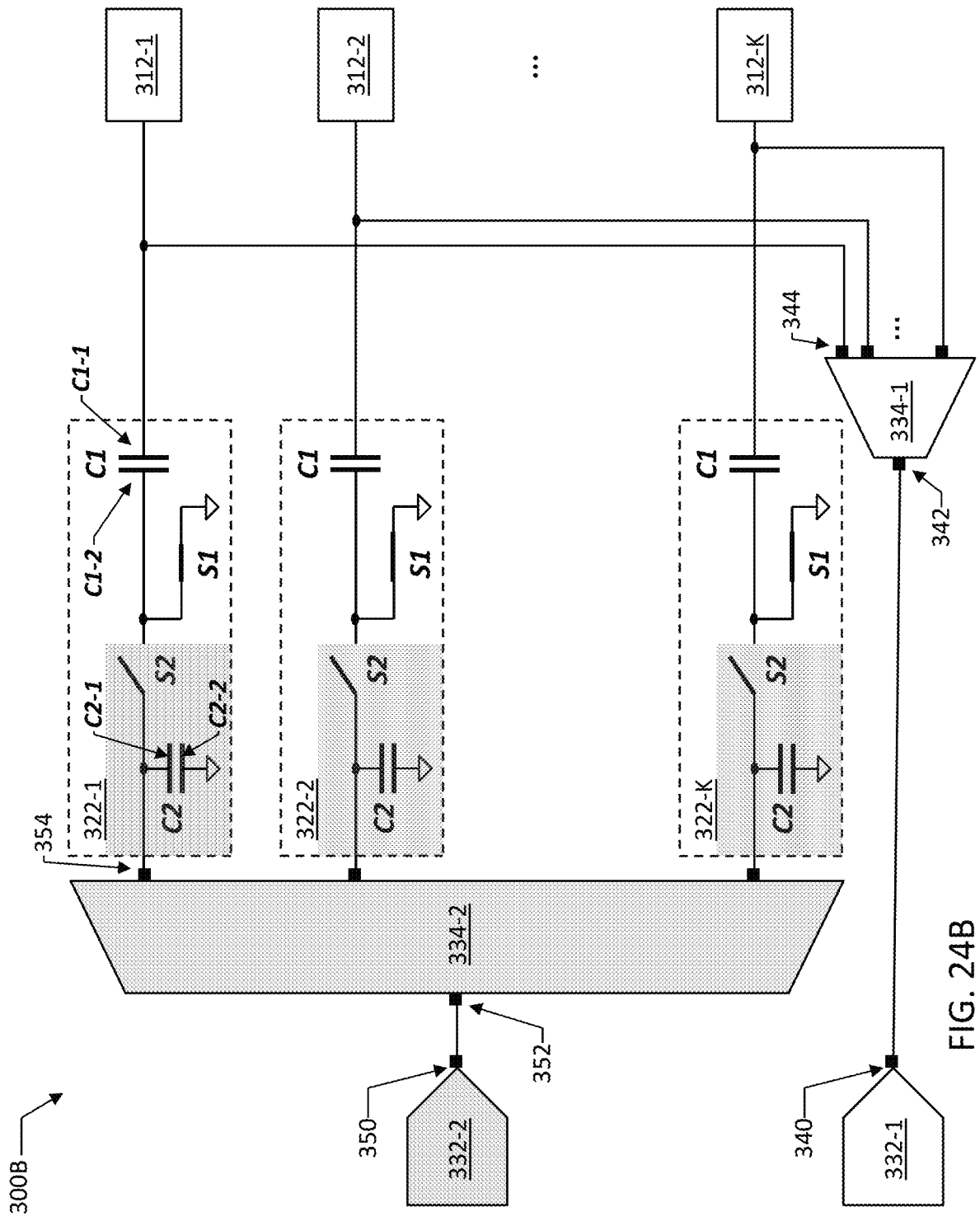
Figure 24C:
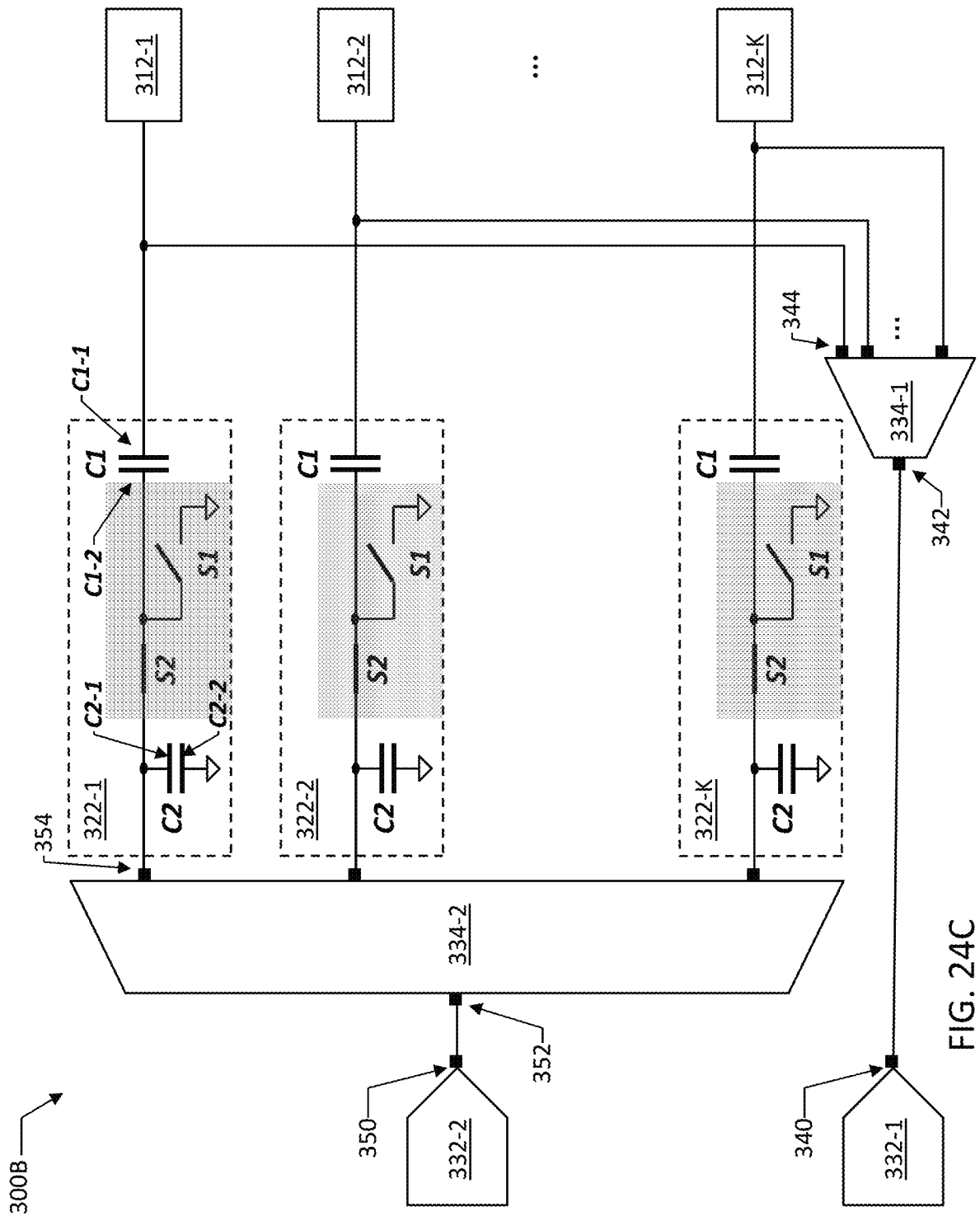

In particular, FIG. 25A provides a diagram 502 that corresponds to the process 402 for the configuration of the quantum circuit assembly 300B as shown in FIG. 24A. FIG. 25A illustrates that, in the process 402, the first capacitors C1 associated with different terminals 312 are sequentially charged, in accordance with the DC code 432-1, resulting in sequential application of the voltages $V_{DC,1}, \ldots, V_{DC,K}$ can be applied to, respectively, terminals 312-1, ..., 312-K. In some embodiments, sequential application of the voltages $V_{DC,1}, \ldots, V_{DC,K}$ to respective first capacitors C1 may be realized by a decoder of the quantum circuit assembly 300 (the decoder not specifically shown in the present drawings), providing control signals to the first multiplexer 334-1 indicating to which ones of the outputs 344 the first multiplexer 334-1 is supposed to route the signal received from the DC DAC 332-1 at its input 342, while the DC DAC 332-1 sequentially outputs voltage values that result in the first capacitors C1 of different signal paths 322 being charged to the target voltage/charge values. FIG. 25A further illustrates that, in the process 402, there is no AC code 432-2 applied to the AC DAC 332-2 (or an AC code may be applied but would have no effect on the rest of the assembly because, in the process 402, the second capacitors C2 are decoupled from the first capacitors C1). FIG. 25A further illustrates that the value 440 may be a first value, e.g., 0, indicating that, in the process 402, the second capacitors C2 are decoupled from the first capacitors C1.

The method 400 may then continue with a process 404, which includes the quantum circuit assembly 300, in particular, the pulse control assembly 320, preparing AC voltages on second capacitors C2. To that end, the switch arrangement 324 may be configured to ensure that the first capacitors C1 are decoupled from the second capacitors C2 (e.g., by having the switches S2 open). The second capacitor electrodes C1-2 of the first capacitors C1 may remain coupled to the first reference potential (e.g., by having the switches S1 closed). Such configuration of the switch arrangement 324 is illustrated for the quantum circuit assembly 300B in FIG. 24B. The illustration of FIG. 24B is the same as that of FIG. 22B, except that components involved in the process 404 are highlighted. In the process 404, the AC DAC 332-2 and the second multiplexer 334-2 may then apply respective AC voltages to each of the first capacitor electrodes C2-1 of the second capacitors C2, one at a time (i.e., sequentially), so that the second capacitors C2 are charged one at a time. Applying an AC voltage to a second capacitor C2 of a given signal path 322-$k$ charges the second capacitor C2 to a respective voltage, $V_{AC,k}$ (i.e., the second capacitor C2 stores a certain charge representative of the voltage $V_{AC,k}$) and the signal path 322-$k$ may then be described as being operated in a second phase. Thus, the process 404 includes sequentially operating different signals paths 322 in the second phase, where the second capacitors C2 of different signal paths 322 are charged to respective voltages $V_{AC,1}, \ldots, V_{AC,K}$. Because, in the process 404, the second capacitor C2 is decoupled from the first capacitor C1, accumulation of the charges on the second capacitors C2 in the process 404 does not have an effect on the voltages applied to corresponding terminals 312.

FIG. 25B provides a diagram 504 that corresponds to the process 404 (while also showing the previous instance of the process 402) for the configuration of the quantum circuit assembly 300B as shown in FIG. 24B. FIG. 25B illustrates that, in the process 404, the first capacitors C1 associated with different terminals 312 continue to hold their respective charges accumulated in the process 402, resulting in the voltages $V_{DC,1}, \ldots, V_{DC,K}$ being maintained at, respectively, the terminals 312-1, . . . , 312-K. FIG. 25B further illustrates that, in the process 404, there is no DC code 432-1 applied to the DC DAC 332-1 but there is an AC code 432-2 applied to the AC DAC 332-2. The application of the AC code 432-2 results in the second capacitors C2 of different signal paths 322 being sequentially charged to respective AC voltages $V_{AC,1}, \ldots, V_{AC,K}$. In some embodiments, sequential application of the voltages $V_{AC,1}, \ldots, V_{AC,K}$ to respective second capacitors C2 may be realized by a decoder of the quantum circuit assembly 300 (the decoder not specifically shown in the present drawings), providing control signals to the second multiplexer 334-2 indicating to which ones of the outputs 354 the second multiplexer 334-2 is supposed to route the signal received from the AC DAC 332-2 at its input 352, while the AC DAC 332-2 sequentially outputs voltage values that result in the second capacitors C2 of different signal paths 322 being charged to the target voltage/charge values. FIG. 25B further illustrates that the value 440 may be the first value, e.g., 0, indicating that, in the process 404, the second capacitors C2 are decoupled from the first capacitors C1. While application of the AC code 432-2 results in the second capacitors C2 of different signal paths 322 being charged to respective AC voltages $V_{AC,1}, \ldots, V_{AC,K}$, because the second capacitors C2 are decoupled from the first capacitors C1 in the process 402, the voltages applied to the terminals 312 are not affected by the voltages on the second capacitors C2.

Next, the method 400 may continue with a process 406, which includes the quantum circuit assembly 300, in particular, the pulse control assembly 320, applying the AC voltages stored on second capacitors C2 to the respective terminals 312. To that end, the switch arrangement 324 may be configured to ensure that the first capacitors C1 are coupled to the second capacitors C2 (e.g., by having the switches S2 closed) and that the first capacitors C1 are decoupled from the first reference potential (e.g., by having the switches S1 open). Such configuration of the switch arrangement 324 is illustrated for the quantum circuit assembly 300B in FIG. 24C. The illustration of FIG. 24C is the same as that of FIG. 22B, except that components involved in the process 406 are highlighted. In the process 406, in each signal path 322, the second capacitor C2 is coupled to the first capacitor C1 (i.e., the first and second capacitors C1 and C2 are connected in series, e.g., by the switch S2 coupling the first capacitor electrode C2-1 of the second capacitor C2 and the second capacitor electrode C1-2 of the first capacitor C1), resulting in the charge stored on the second capacitor C2 being applied to the respective terminal 312 in addition to the charge stored on the first capacitor C1, thus increasing the voltage applied to the terminal 312 so that it is a sum of a voltage from the charge stored on the first capacitor C1 and a voltage from the charge stored on the second capacitor C2. For the time that the first and second capacitors are coupled to one another in this manner, the signal path 322-k may be described as being operated in a third phase. Because this time period is relatively short, coupling the first and second capacitors in the third phase effectively applies a voltage pulse to the terminal 312. Thus, the process 406 includes operating different signals paths 322 in the third phase substantially at the same time, where the second capacitors C2 of different signal paths 322 apply to the different terminals 312 their respective voltages $V_{AC,1}, \ldots, V_{AC,K}$.

FIG. 25C provides a diagram 506 that corresponds to the process 406 (while also showing the previous instances of the processes 402 and 404) for the configuration of the quantum circuit assembly 300B as shown in FIG. 24C. FIG. 25C illustrates that, in the process 406, the value 440 may be the second value, e.g., 1, indicating that, in the process 406, the second capacitors C2 are coupled to the first capacitors C1, for all of the terminals 312 at substantially the same time. As a result, a combination of voltages of the first and second capacitors C1, C2 may be applied to different terminals 312. This is shown in FIG. 25C with the voltage $V_1$ on the terminal 312-1 being $V_{DC,1}+V_{AC,1}$, the voltage $V_2$ on the terminal 312-2 being $V_{DC,2}+V_{AC,2}$, and so on, with the voltage $V_K$ on the terminal 312-K being $V_{DC,K}+V_{AC,K}$. After the second capacitors C2 have been coupled to the first capacitors C1 to apply voltage pulses to the respective terminals 312, the second capacitors C2 may be decoupled from the first capacitors C1 (illustrated in FIG. 25C with a time period 407 during which the value 440 may be again the first value, e.g., 0, indicating that, after the process 406 ends, the second capacitors C2 are decoupled from the first capacitors C1). Because of the conservation of charge, the total charge on the first capacitor C1 and the total charge on the second capacitor C2 should be substantially the same before and after connecting and disconnecting these capacitors (charge leakage being disregarded). This means that, after the second capacitors C2 are decoupled from the first capacitors C1 (e.g., in the time period 407, shown in FIG. 25C), each of these capacitors return to their original values ($V_{AC}$ and $V_{DC}$, respectively) and, because then only the first capacitors C1 are still coupled to respective terminals 312, only voltages due to the charges on the first capacitors C1 are applied to the terminals 312. That is why for a given signal path, when the second capacitor C2 is coupled to the first capacitor C1 in the third phase (e.g., in the process 406), the voltage on the corresponding terminal 312 changes to a combination of the voltage due to the charge on the second capacitor C2 and the voltage due to the charge on the first capacitor C1, resulting in a voltage pulse applied to the terminal 312 for the duration that the second capacitor C2 is coupled, but then the second capacitor C2 is decoupled from the first capacitor C1 and the voltage on the terminal 312 goes back to the voltage due to the charge on the first capacitor C1 (e.g., in the time period 407, shown in FIG. 25C). This can be seen in FIG. 25C, illustrating that after the time period of the process 406 ends, in the time period 407 the voltages on the terminals 312 go back to the values they had during the process 404.

The method 400 may then proceed with a process 408, in which a decision is made whether to iterate the processes 404 and 406 again. If so, then the method 400 proceeds with going back to the process 404, as illustrated in FIG. 23 with an arrow from the positive branch of the decision of the process 408 to the process 404. Otherwise, the method 400 may proceed with a process 410 in which the method 400 is finished, as illustrated in FIG. 23 with an arrow from the negative branch of the decision of the process 408 to the process 410. Thus, the process 402 may be performed once during the method 400, while the sequence of the processes 404 and 406 may be iterated multiple times, resulting in multiple instances of applying AC pulse signals to the terminals 312.

Various descriptions of the switches S are provided herein with a given switch being either closed, in which case the switch couples two respective components as described herein, or open, in which case the switch decouples the components. However, in general, these descriptions are applicable to a given switch being in a first state, in which case the switch couples two respective components as described herein, or being a second state, in which case the switch decouples the components. Similarly, while various descriptions of the control signal providing the values 440 are provided herein with the values being either 0 or 1, in general, any suitable control signals, with any suitable values may be used to control the state of the switches. Furthermore, in some embodiments, a single control signal may be used to control all of the switches S1 and S2, e.g., by the control signal only having the values of 0s or 1s (i.e., LOWS or HIGHs), and the control signal being provided to all of the switches S2 while an inverted version of the control signal being provided to all of the switches S1, or vice versa. For example, the switches S2 may receive the values of 0 in the control signal, causing the switches S2 to be open, while the switches S1 receive the values of 1, causing the switches S1 to be closed, and vice versa. Such a single control signal may be referred to as a trigger signal (e.g., such a trigger signal may either be ON/HIGH or OFF/LOW).

Figure 26:
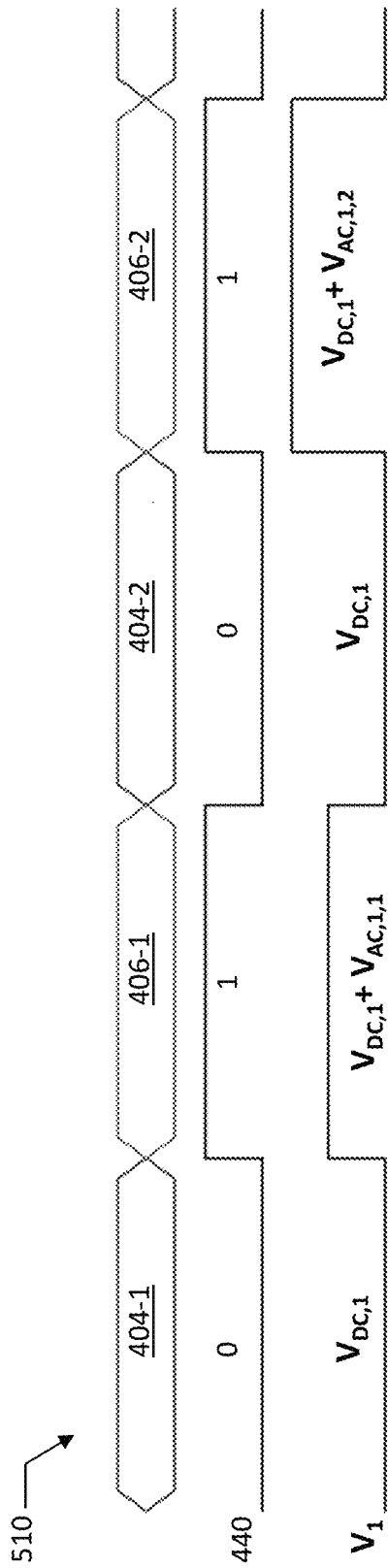
FIG. 26 illustrate various states of the switch arrangement of the quantum circuit assembly of FIG. 22B at different points in time when operating according to the method of FIG. 23 and corresponding voltages on one of the terminals, according to some embodiments of the present disclosure.

FIG. 26 illustrate a diagram 502 of various states of the switch arrangement 324 of the quantum circuit assembly of FIG. 22B at different points in time (time measured along the horizontal axis, same as for FIGS. 25A-25C) when operating according to the method of FIG. 23 and corresponding voltages on one of the terminals (in particular, the voltage $V_1$ on the terminal 312-1, as an example), according to some embodiments of the present disclosure.

As shown in FIG. 26, when the switch arrangement 324 is configured for the process 404, which may be generally described as "prepare voltages" (i.e., charge the second capacitors C2 of different signal paths 322 of the quantum circuit assembly 300B to their respective voltages $V_{AC,k}$), the control signal for the switches S1 and S2 may be 0 so that the switches S1 are closed and the switches S2 are open (the same as described above with reference to the process 404 of FIG. 25B), and the voltage $V_1$ on the terminal 312-1 may be the DC voltage of the first capacitor C1, $V_{DC,1}$. Because FIG. 26 illustrates multiple instances of the process 404, the first instance of the process 404 is labeled in FIG. 26 as "404-1" (during which the second capacitor C2 of the signal path 322-1 corresponding to the terminal 312-1 may be charged to a voltage $V_{AC,1,1}$), and the second instance of the process 404 is labeled in FIG. 26 as "404-2" (during which the second capacitor C2 of the signal path 322-1 corresponding to the terminal 312-1 may be charged to a voltage $V_{AC,1,2}$, where, in general, the voltages to which the second capacitor C2 corresponding to a given signal path 322 is charged at different instances of the process 404 may be different, e.g., the voltage $V_{AC,1,2}$ may, but does not have to, be the same as the voltage $V_{AC,1,1}$) Similarly, because FIG. 26 illustrates multiple instances of the process 406, the first instance of the process 406 is labeled in FIG. 26 as "406-1" and the second instance of the process 406 is labeled in FIG. 26 as "406-2."

After the process 404, when the switch arrangement 324 is configured for the process 406, which may be generally described as "execute" (i.e., the charges stored on the second capacitors C2 are applied to the terminals 312 coupled to the different signal paths 322 of the quantum circuit assembly 300B), the control signal for the switches S1 and S2 may be 1 so that the switches S2 are closed and the switches S1 are open (the same as described above with reference to the process 406 of FIG. 25C), and the voltage $V_1$ on the terminal 312-1 may be a combination of the voltage of the first capacitor C1, $V_{DC,1}$, and the voltage to which the second capacitor C2 was charged in the last instance of the process 404, i.e., the voltage $V_{AC,1,1}$ for the example shown. Thus, the voltage $V_1$ in the process 406-1 may be $V_{DC,1}+V_{AC,1,1}$.

FIG. 26 further illustrates that after the process 406-1, the method 400 may proceed with performing the process 404 again, i.e., the second instance of the process 404, shown in FIG. 26 as the process 404-2, in which the second capacitor C2 of the signal path 322-1 corresponding to the terminal 312-1 may be charged to a voltage $V_{AC,1,2}$. After that the process 406-2 may follow, in which the second capacitor C2 is coupled to the respective first capacitor C1 and the voltage $V_1$ on the terminal 312-1 may be a combination of the voltage due to the charge stored on the first capacitor C1, $V_{DC,1}$, and the voltage due to the charge to which the second capacitor C2 was charged in the last instance of the process 404, i.e., the voltage $V_{AC,1,2}$ for the example shown. Thus, the voltage $V_1$ in the process 406-2 may be $V_{DC,1}+V_{AC,1,2}$.

Figures 28A, 28B, 28C:
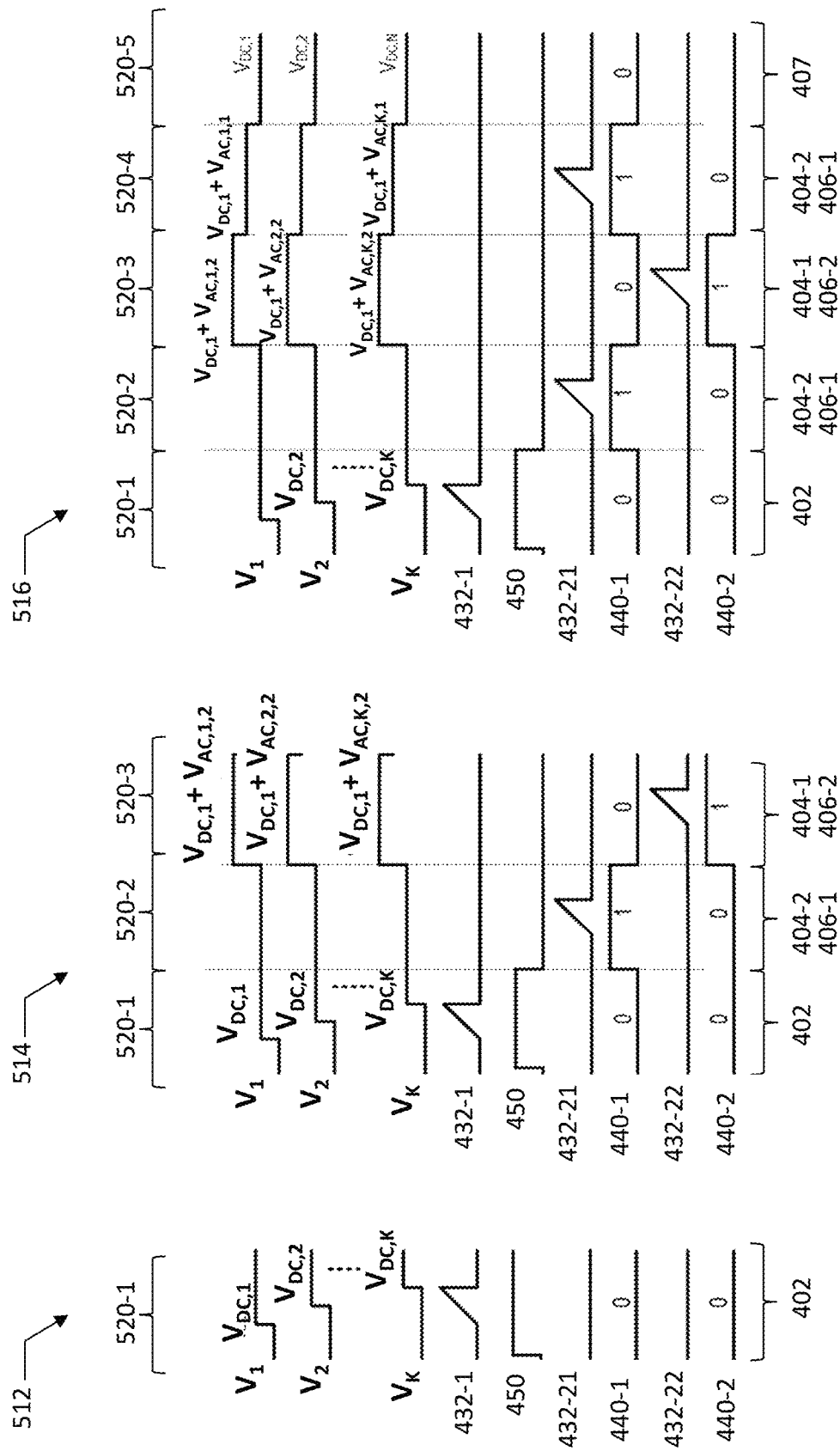
FIGS. 28A-28C illustrate various signals in the quantum circuit assembly of FIG. 22A at different points in time when operating according to the method of FIG. 23, according to some embodiments of the present disclosure.
Figure 29:
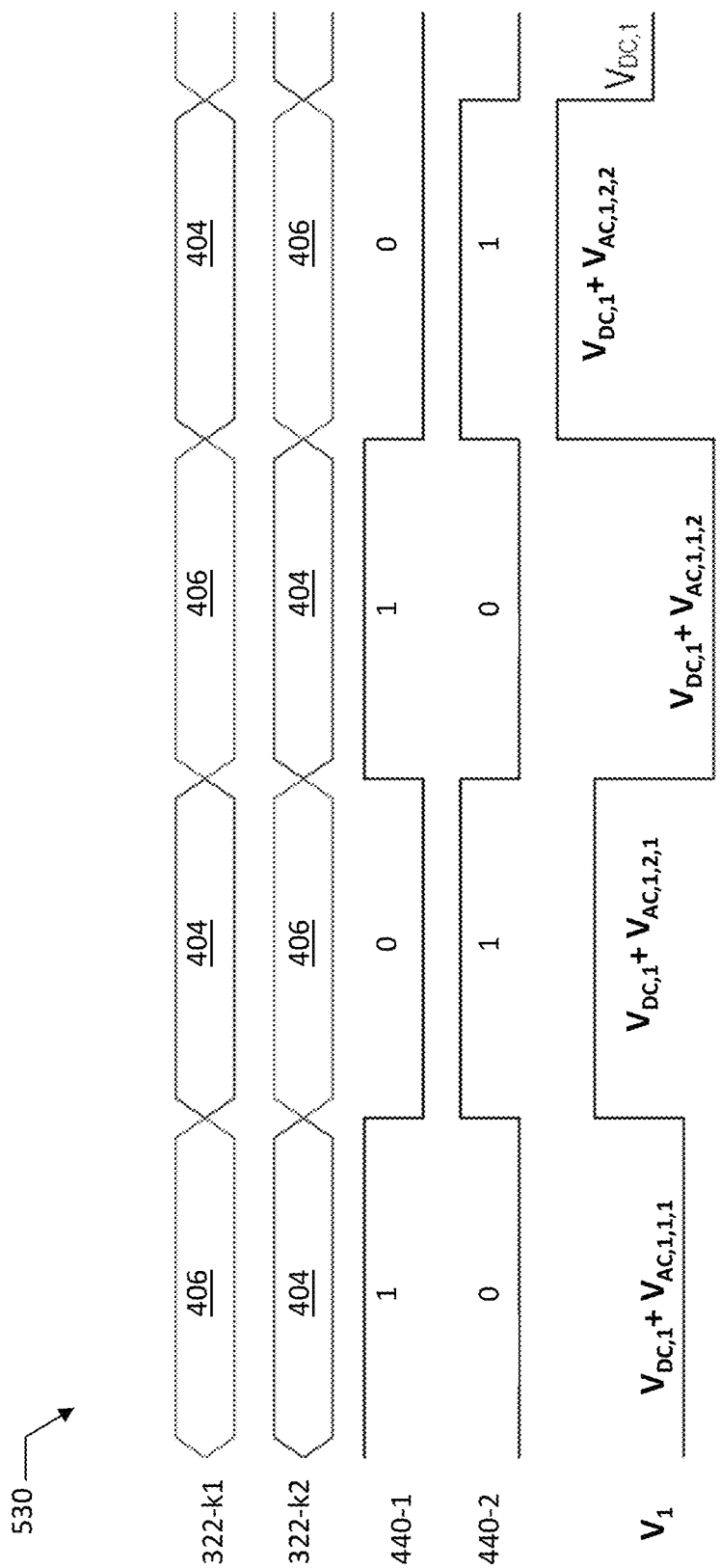
FIG. 29 illustrate various states of the switch arrangement of the quantum circuit assembly of FIG. 22A at different points in time when operating according to the method of FIG. 23 and corresponding voltages on one of the terminals, according to some embodiments of the present disclosure.

Descriptions of the method 400, provided above, may be applied to embodiments of the quantum circuit assembly 300 where multiple signal paths 322 are provided for at least some of the terminals 312. Examples of such embodiments are illustrated in FIGS. 27-29, which are similar to FIGS. 24-26 except that FIGS. 27-29 apply to the embodiments of the quantum circuit assembly 300A of FIG. 22A with two paths 322 per terminal 312 (i.e., $L_1=L_2=\ldots=L_K=2$), instead of the quantum circuit assembly 300B of FIG. 22B. Therefore, in the interests of brevity, the full descriptions provided for FIGS. 24-26 are not repeated for FIGS. 27-29 and only the differences are described.

Figure 27A:
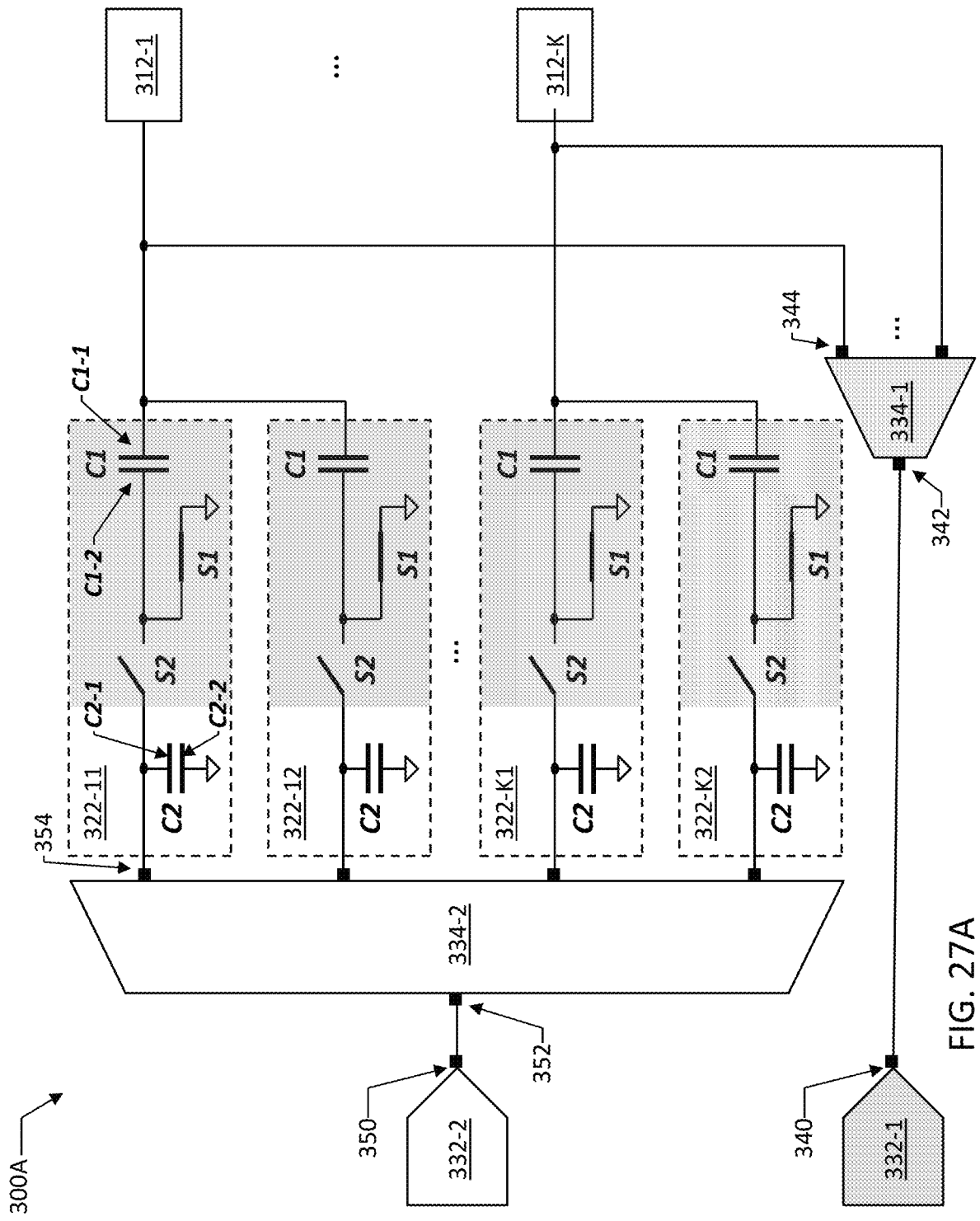
FIGS. 27A-27C provide schematic illustrations of the quantum circuit assembly of FIG. 22A at different points in time when operating according to the method of FIG. 23, according to some embodiments of the present disclosure.
Figure 27B:
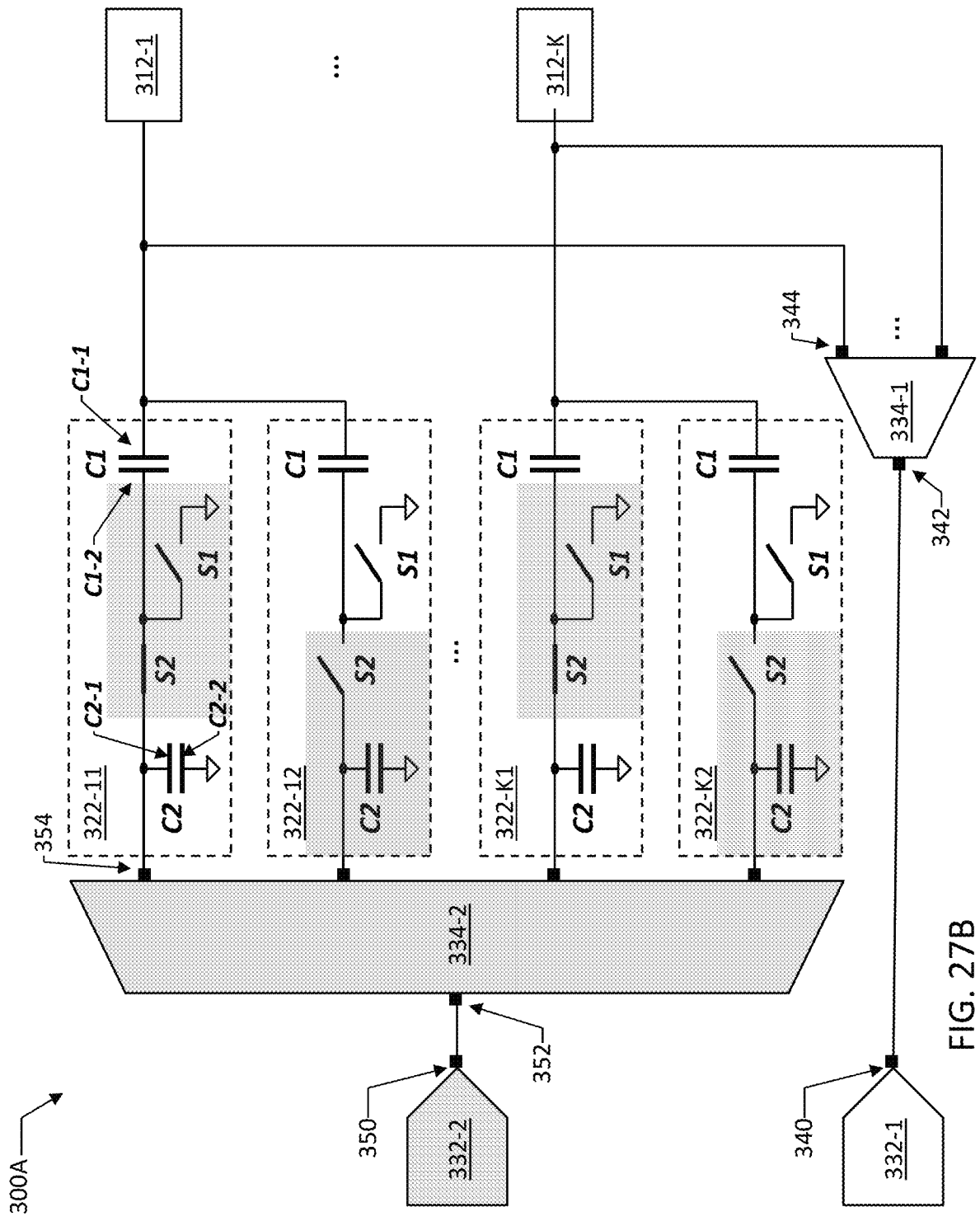
Figure 27C:
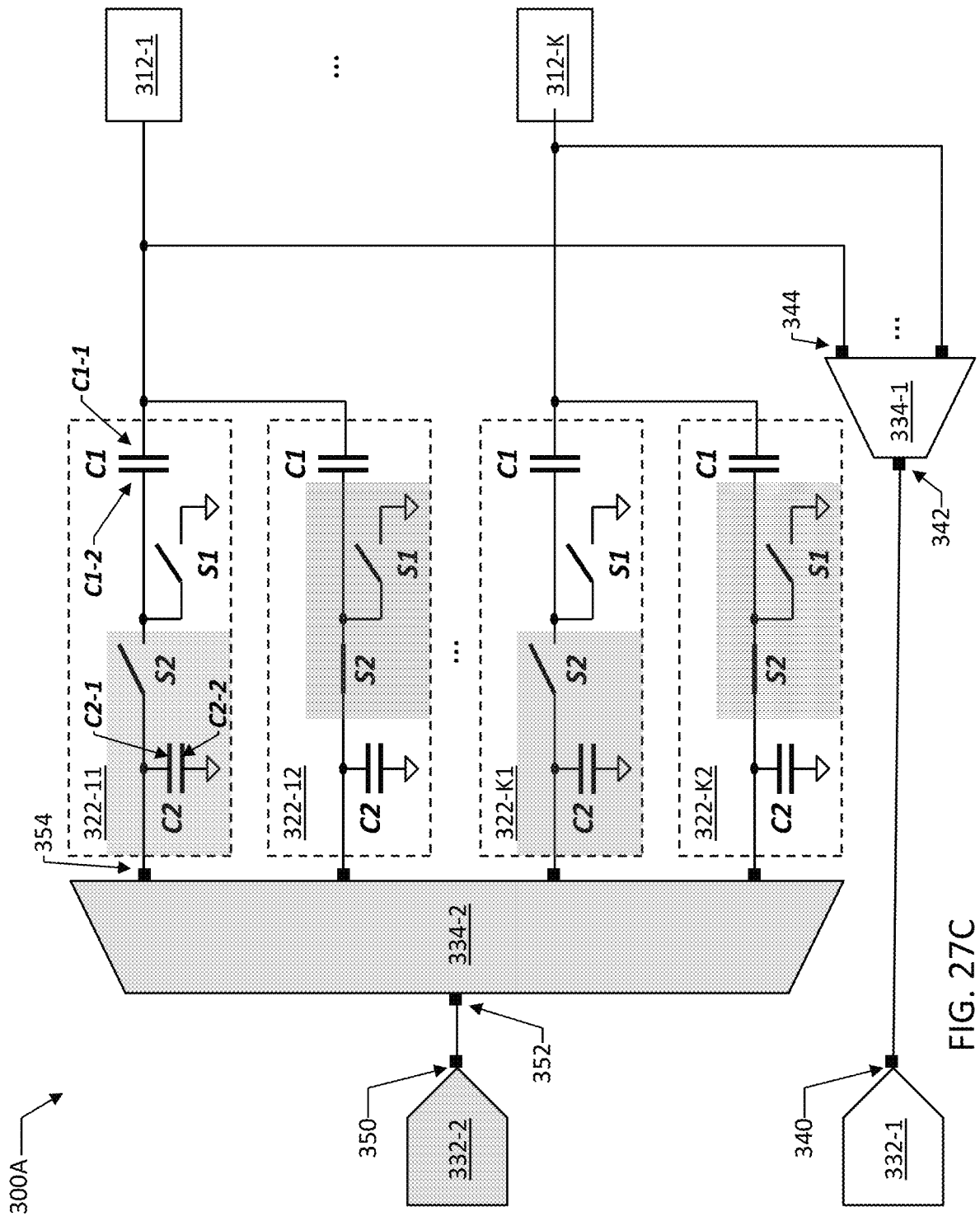

FIGS. 27A-27C provide schematic illustrations of the quantum circuit assembly 300A of FIG. 22A at different points in time when operating according to the method of FIG. 23, according to some embodiments of the present disclosure. FIGS. 28A-28C illustrate various signals in the quantum circuit assembly 300A of FIG. 22A at different points in time when operating according to the method of FIG. 23, according to some embodiments of the present disclosure.

Similar to FIG. 24A, FIG. 27A illustrates configuration of the pulse control assembly 320 in the process 402, where the first capacitors C1 are charged to their respective voltages provided by the first signal source 332-1 via the first multiplexer 334-1. Similar to FIG. 24A, in FIG. 27A, the switches S2 may be open, the switches S1 may be closed, and the process 402 includes sequentially operating different signals paths 322 in the first phase, where the first capacitors C1 of different signal paths 322 are charged to respective voltages so that respective DC voltages $V_{DC,1}, \ldots, V_{DC,K}$ are applied to corresponding different terminals 312-1, ..., 312-K. In the process 402, different first capacitors C1 may be charged so that, as a result of the first capacitors C1 of multiple paths 322-$k1$ associated with a given terminal 312-$k$, the voltage applied to the terminal 312-$k$ is a sum of the voltages on these first capacitors C1. This is illustrated in a diagram 512 of FIG. 28A, which is similar to the diagram 502 of FIG. 25A, and shows that, as a result of the process 402 for the arrangement of FIG. 27A in a time period labeled in FIG. 28A as a first time period 520-1, the voltages on the different terminals 312-1, . . . , 312-K are respective DC voltages $V_{DC,1}, \ldots, V_{DC,K}$. FIG. 28A illustrates the DC code 432-1 as described with reference to FIG. 25A. FIG. 28A further illustrates a control signal 450, which may, e.g., be HIGH in the process 402, to configure the first capacitors C1 of various signal paths 322 to be charged as described herein. The AC codes 432-2 are shown in FIGS. 28A-28C separately for the first signal paths 322-k1 and the second paths 322-k2 associated with different terminals 312-k—namely an AC code 432-21, shown in FIGS. 28A-28C, represents charging of the second capacitors C2 of the first signal paths 322-k1 corresponding to respective terminals 312-k, while an AC code 432-22 represents charging of the second capacitors C2 of the second signal paths 322-k2 corresponding to respective terminals 312-k. Similarly, the values 440 of the trigger signal are shown in FIGS. 28A-28C separately for the first signal paths 322-k1 and the second paths 322-k2 associated with different terminals 312-k—namely values 440-1, shown in FIGS. 28A-28C, correspond to the coupling the first capacitors C1 and the second capacitors C2 of the first signal paths 322-k1, while values 440-2 correspond to the coupling the first capacitors C1 and the second capacitors C2 of the second signal paths 322-k2. As shown in FIG. 28A, in the process 402 of the first time period 520-1, there are no AC code 432-21 or 432-22 and the values 440-1 and 440-2 are both 0 (i.e., all of the second capacitors C2 of the multiple paths 322 of the quantum circuit assembly 300A are decoupled from the first capacitors C1).

After the initial charging of the first capacitors C1, the quantum circuit assembly 300A with multiple signal paths 322 per terminal 312 proceeds to operate by interleaving the processes 404 and 406 for different signal paths 322 per terminal 312, so that, per terminal 312, at any given time, the second capacitor C2 of only one of the signal paths 322 may be coupled to the first capacitor C1 (i.e., that signal path is in the third phase of the process 406, as described above), while the second capacitors C2 of the other signal paths 322 may be charging (i.e., those signal paths may be sequentially charging in the second phase of the process 404, as described above). This is shown in FIG. 27B, illustrating that, in a time period after the process 402, the switch arrangement 324 may be configured to that the second signal paths 322-k2 are sequentially operated in the second phase of the process 404 where the second capacitors C2 of the second signal paths 322-k2 are charged to AC voltages $V_{AC,1,2}, \ldots, V_{AC,K,2}$ (where the last, third, digit is added in the subscript of these voltages, compared to those described for the embodiment of the quantum circuit assembly 300B, the last digit indicating the number of the signal paths per terminal 312 operated in the second phase of the process 404). At the same time, as shown in FIG. 27B, the first signal paths 322-k1 are operated in the third phase of the process 406 where the second capacitors C2 of the first signal paths 322-k1 are applying their AC voltages $V_{AC,1,1}, \ldots, V_{AC,K,1}$. After that, the second and first signal paths 322-k2 and 322-k1 switch, as shown in FIG. 27C, illustrating that, in a time period after that of FIG. 27B, the switch arrangement 324 may be configured to that the first signal paths 322-k1 are sequentially operated in the second phase of the process 404 where the second capacitors C2 of the first signal paths 322-k1 are charged to AC voltages $V_{AC,1,1}, \ldots, V_{AC,K,1}$, while, at the same time, as shown in FIG. 27C, the second signal paths 322-k2 are operated in the third phase of the process 406 where the second capacitors C2 of the second signal paths 322-k2 are applying their AC voltages $V_{AC,1,2}, \ldots, V_{AC,K,2}$.

Such interleaving is shown in FIG. 28B, illustrating that, after the first time period 520-1 of the process 402, there is a second time period 520-2, labeled as both 404-2 and 406-1, indicating that, in this time period, the second signal paths 322-k2 are operated in the second phase of the process 404 (hence 404-2, where the number after the dash indicates the number of the second signal paths 322-k2 per terminal 312-k), while the first signal paths 322-k1 are operated in the third phase of the process 406 (hence 406-1, where the number after the dash indicates the number of the first signal paths 322-k1 per terminal 312-k), corresponding to the configuration of FIG. 27B. In the example shown in FIG. 28B, operating the first signal paths 322-k1 in the third phase of the process 406-1 of the second time period 520-2 does not change the voltage on the terminals 312 because at that time the second capacitors C2 of the first signal paths 322-k1 have not been charged yet, so there may be no charge to change the voltage. In the second time period 520-2, the AC code 432-21 is present, and the AC code 432-22 is absent, and the value 440-1 is 1, while the value 440-2 is 0.

FIG. 28B further illustrates a third time period 520-3 labeled as both 404-1 and 406-2, indicating that, in this time period, the first signal paths 322-k1 are operated in the second phase of the process 404 (hence 404-1, where the number after the dash indicates the number of the first signal paths 322-k1 per terminal 312-k), while the second signal paths 322-k2 are operated in the third phase of the process 406 (hence 406-2, where the number after the dash indicates the number of the second signal paths 322-k2 per terminal 312-k), corresponding to the configuration of FIG. 27C. In the example shown in FIG. 28B, operating the second signal paths 322-k2 in the third phase of the process 406-2 in the third time period 520-3 changes the voltage on the terminals 312, causing the application of the AC pulse signal to the terminals 312, because at that time the second capacitors C2 of the second signal paths 322-k2 have been charged to their respective voltages $V_{AC,1,2}, \ldots, V_{AC,K,2}$ in the second time period 520-2 (the one corresponding to FIG. 27B), which are now being applied. As a result, in the third time period 520-3, the voltage $V_1$ applied to the first terminal 312-1 may be $V_{DC,1}+V_{AC,1,2}$, the voltage $V_2$ applied to the second terminal 312-1 may be $V_{DC,1}+V_Ac_{2,2}$, and so on, with the voltage $V_K$ applied to the Kth terminal 312-K being $V_{DC,1}+V_{AC,K,2}$. In the third time period 520-3, the AC code 432-22 is present, and the AC code 432-21 is absent, and the value 440-2 is 1, while the value 440-1 is 0, as shown in FIG. 28B.

The interleaving may continue in this manner, as is shown in FIG. 28C, illustrating that the quantum circuit assembly 300A with two signal paths per terminal 312 is again operated in the configuration of FIG. 27B (a fourth time period 520-4 shown in FIG. 28C, the one labeled as 404-2 and 406-1 after the third time period 520-3). In the example shown in FIG. 28C, operating the first signal paths 322-k1 in the third phase of the process 406-1 in the fourth time period 520-4 changes the voltage on the terminals 312, causing the application of the AC pulse signal to the terminals 312, because at that time the second capacitors C2 of the first signal paths 322-k1 have been charged to their respective voltages $V_{AC,1,1}, \ldots, V_{AC,K,1}$ in the third period 520-3 (the one corresponding to FIG. 27C), which are now being applied. As a result, in the fourth time period 520-4, the voltage $V_1$ applied to the first terminal 312-1 may be $V_{DC,1}+V_{AC,1,1}$, the voltage $V_2$ applied to the second terminal 312-1 may be $V_{DC,1}+V_{AC,2,1}$, and so on, with the voltage $V_K$ applied to the Kth terminal 312-K being $V_{DC,1}+V_{AC,2,1}$. In the fourth time period 520-4, the AC code 432-21 is present, and the AC code 432-22 is absent, and the value 440-1 is 1, while the value 440-2 is 0, as shown in FIG. 28C.

A fifth time period 520-5, shown in FIG. 28C, may be analogous to the time period 407 shown in FIG. 25C, described above.

FIG. 29 illustrates a diagram 530 with the interleaving as described with reference to FIG. 27 and, in an illustration similar to that of FIG. 26. As shown in FIG. 29, when the first signal paths 322-$k1$ of the switch arrangement 324 of the quantum circuit assembly 300A are configured for the process 406 ("execute") and the second signal paths 322-$k2$ are configured to the process 404 ("prepare voltages"), the value 440-1 may be 1, the value 440-2 may be 0, and the voltage $V_1$ on the terminal 312-1 may be $V_{DC,1}+V_{AC1,1,1}$ (where the last digit in the AC voltage represents the instance when the first signal paths 322-$k1$ of the switch arrangement 324 of the quantum circuit assembly 300A are configured for the process 406 and the second signal paths 322-$k2$ are configured to the process 404). After that, when the second signal paths 322-$k2$ of the switch arrangement 324 of the quantum circuit assembly 300A are configured for the process 406 ("execute") and the first signal paths 322-$k1$ are configured to the process 404 ("prepare voltages"), the value 440-2 may be 1, the value 440-1 may be 0, and the voltage $V_1$ on the terminal 312-1 may be $V_{DC,1}+V_{AC,1,2,1}$. Next, as further shown in FIG. 29, when the first signal paths 322-$k1$ of the switch arrangement 324 of the quantum circuit assembly 300A are again configured for the process 406 ("execute") and the second signal paths 322-$k2$ are again configured to the process 404 ("prepare voltages"), the value 440-1 may be 1, the value 440-2 may be 0, and the voltage $V_1$ on the terminal 312-1 may be $V_{DC,1}+V_{AC1,1,2}$, where, in various embodiments, the values $V_{AC1,1,2}$ and $V_{AC,1,1,1}$ may be the same or different. Next, as also shown in FIG. 29, when the second signal paths 322-$k2$ of the switch arrangement 324 of the quantum circuit assembly 300A are again configured for the process 406 ("execute") and the first signal paths 322-$k1$ are again configured to the process 404 ("prepare voltages"), the value 440-2 may be 1, the value 440-1 may be 0, and the voltage $V_1$ on the terminal 312-1 may be $V_{DC,1}+V_{AC,1,2,2}$, where, in various embodiments, the values $V_{AC,1,2,2}$ and $V_{AC,1,2,1}$ may be the same or different.

Figure 30A:
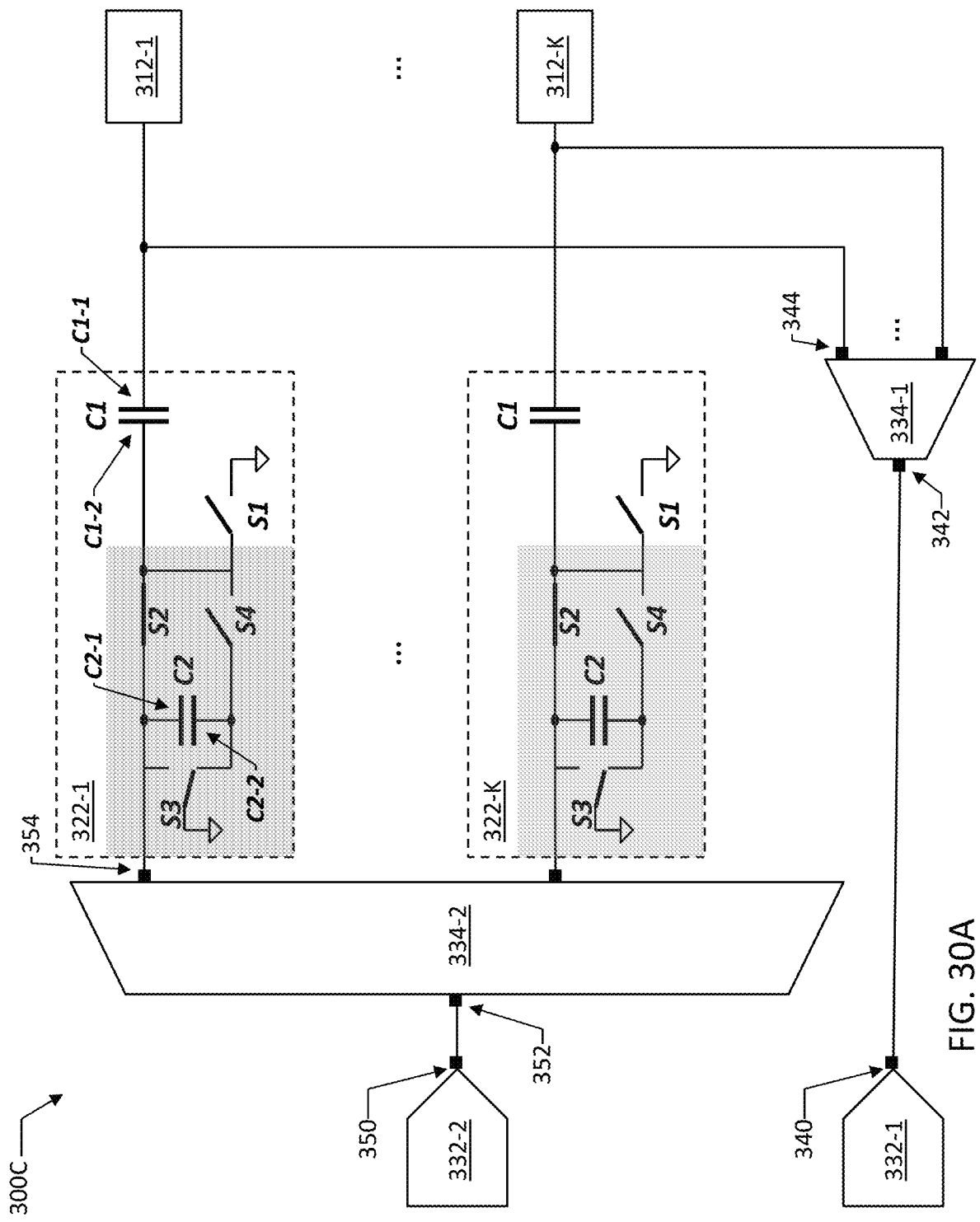
FIGS. 30A-30B provide schematic illustrations of the quantum circuit assembly of FIG. 22C at different points in time when operating according to the method of FIG. 23, according to some embodiments of the present disclosure.
Figure 30B:
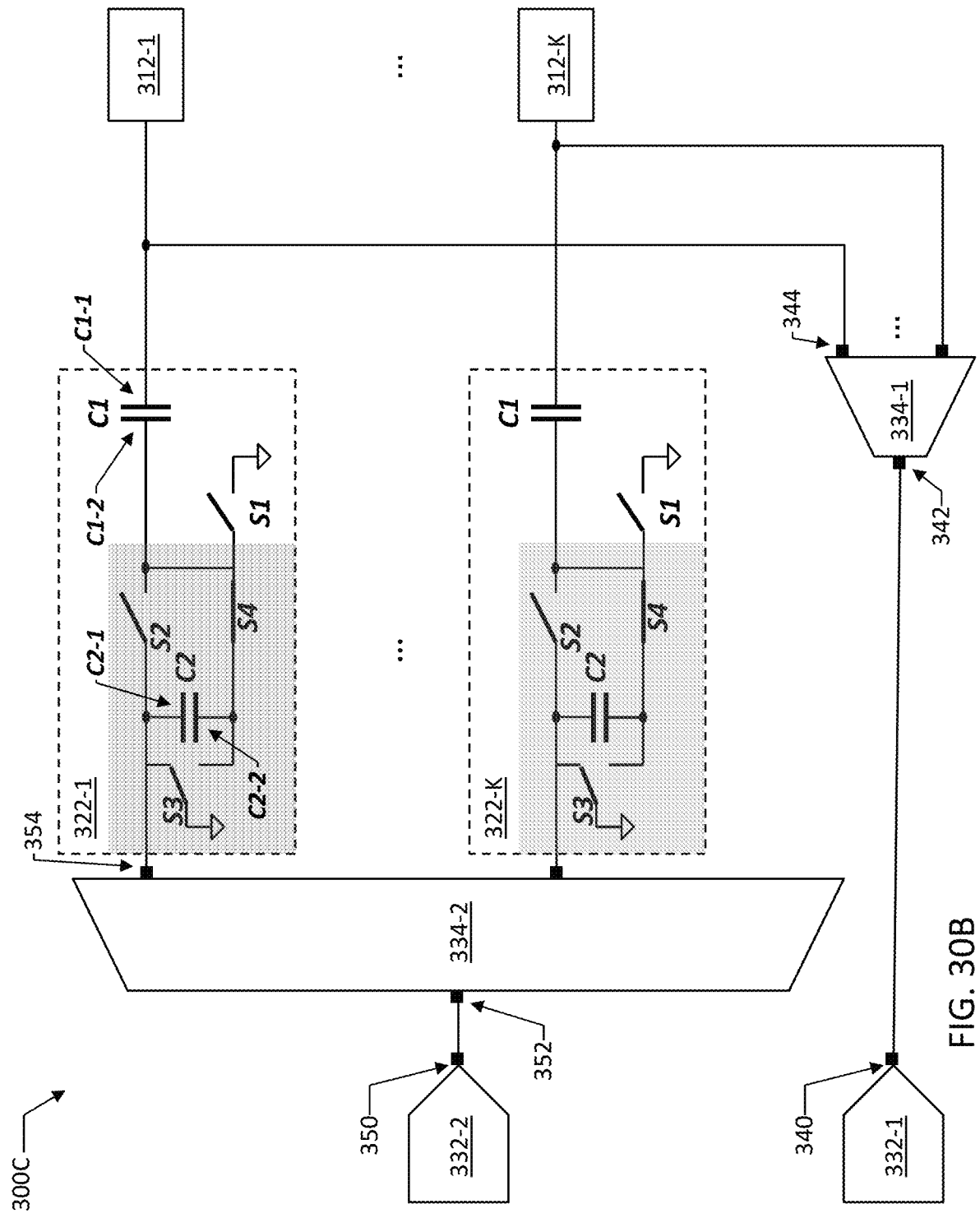

FIGS. 30A-30B provide schematic illustrations of the quantum circuit assembly of FIG. 22C at different points in time when operating according to the method of FIG. 23, according to some embodiments of the present disclosure. In particular, FIG. 30A illustrates the configuration of the switch arrangement 324 in a process 406 when voltages $V_{DC}+V_{AC}$ are to be applied to the respective terminals 312, while FIG. 30B illustrates the configuration of the switch arrangement 324 in a process 406 when voltages $V_{DC}-V_{AC}$ are to be applied to the respective terminals 312. In the process 406 for applying the voltages $V_{DC}+V_{AC}$ (i.e., shown in FIG. 30A), in each signal path 322, the first capacitor electrode C2-1 of the second capacitor C2 is coupled to the first capacitor C1 (i.e., the first and second capacitors C1 and C2 are connected in series by the switch S2 coupling the first capacitor electrode C2-1 of the second capacitor C2 and the second capacitor electrode C1-2 of the first capacitor C1, while the switch S4 is open), while the second capacitor electrode C2-2 is coupled to the reference potential (e.g., ground) using the switch S3, resulting in the charge stored on the second capacitor C2 being added to the voltage applied to the terminal 312 and resulting in a voltage pulse $V_{DC}+V_{AC}$ being applied to the terminal 312. In the process 406 for applying the voltages $V_{DC}-V_{AC}$ (i.e., shown in FIG. 30B), in each signal path 322, the second capacitor electrode C2-2 of the second capacitor C2 is coupled to the first capacitor C1 (i.e., the first and second capacitors C1 and C2 are connected in series by the switch S4 coupling the second capacitor electrode C2-2 of the second capacitor C2 and the second capacitor electrode C1-2 of the first capacitor C1, while the switch S2 is open), while the first capacitor electrode C2-1 is coupled to the reference potential (e.g., ground) using the switch S3, resulting in the charge stored on the second capacitor C2 being subtracted from the voltage applied to the terminal 312 and resulting in a voltage pulse $V_{DC}-V_{AC}$ being applied to the terminal 312.

Example Devices and Systems

Quantum circuit assemblies with scalable gate control as described above may be implemented using any kind of qubit devices or be included in any kind of quantum processing devices/structures. Some examples of such devices/structures are illustrated in FIGS. 31A-31B, 32, and 33.

Figure 31A:
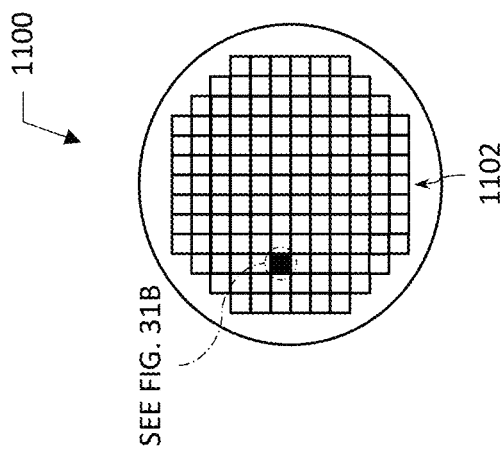
FIGS. 31A and 31B are top views of a wafer and dies that may include one or more of quantum circuit assemblies with scalable gate control disclosed herein, according to some embodiments of the present disclosure.
Figure 31B:
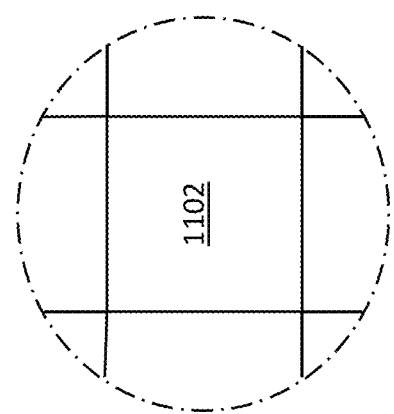

FIGS. 31A-31B are top views of a wafer 1100 and dies 1102 that may be formed from the wafer 1100, according to some embodiments of the present disclosure. Dies 1102 may include any of the quantum circuit assemblies with scalable gate control disclosed herein, or portions thereof, any embodiments of the quantum circuit assembly 300 or a portion thereof, or any combination of various embodiments of the quantum circuit assembly 300 or a portion thereof. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 33) or other logic that is configured to store information in the memory devices or execute instructions stored in the memory array.

Figure 32:
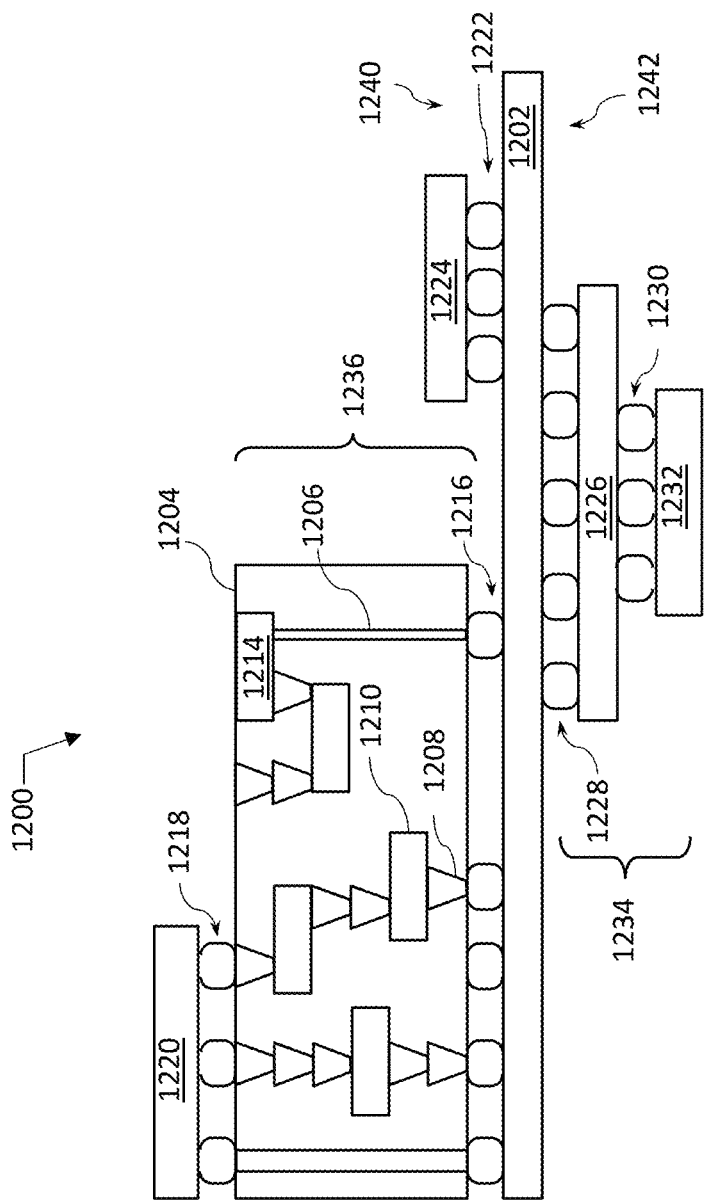
FIG. 32 is a cross-sectional side view of a device assembly that may include one or more of quantum circuit assemblies with scalable gate control disclosed herein, according to some embodiments of the present disclosure.

FIG. 32 is a cross-sectional side view of a device assembly 1200 that may include any of the embodiments of the quantum circuit assemblies with scalable gate control as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 32 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 32), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 32, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum circuit assemblies with scalable gate control as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 32, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum circuit assemblies with scalable gate control as disclosed herein; or may be a conventional IC package, for example.

The device assembly 1200 illustrated in FIG. 32 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

Figure 33:
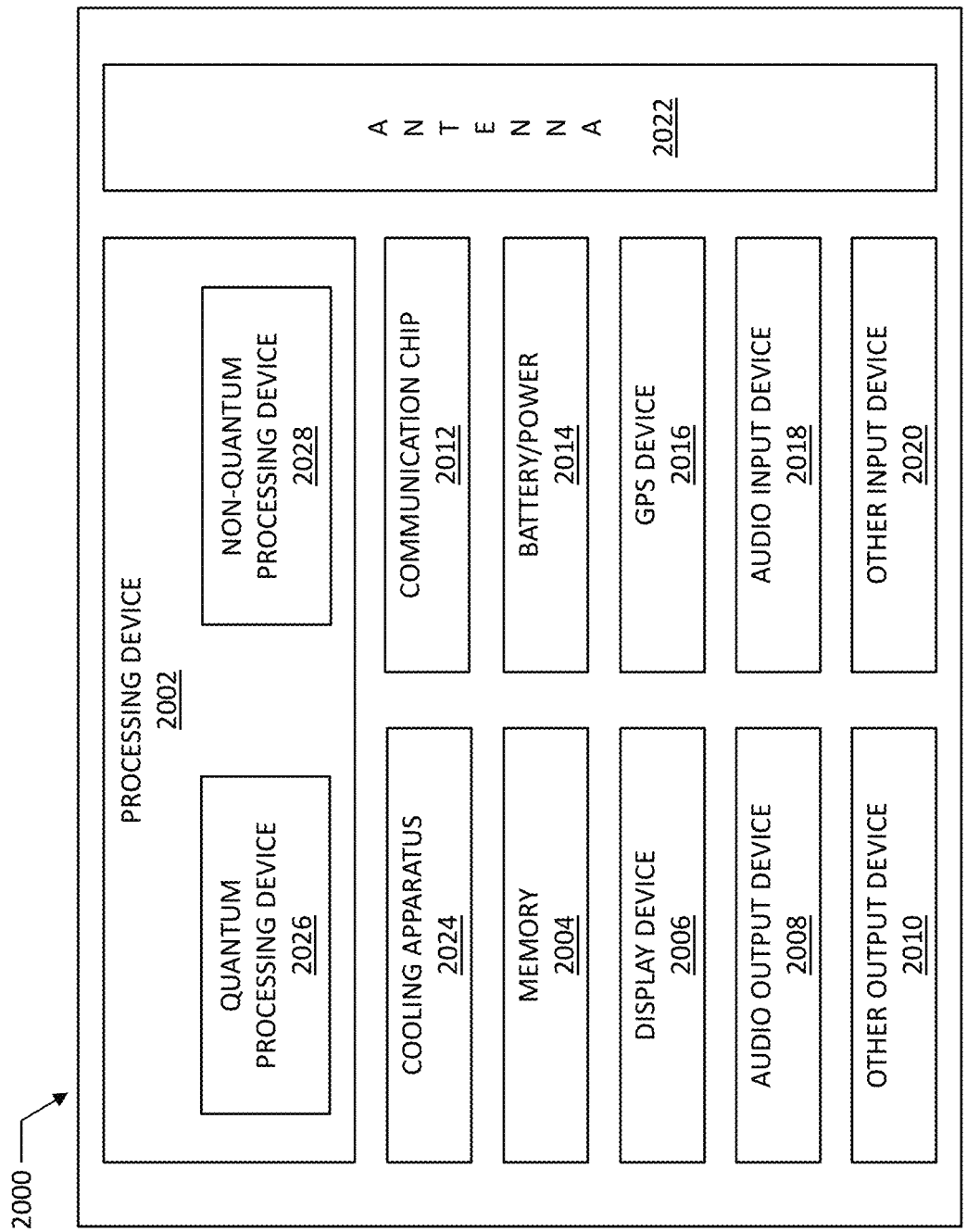
FIG. 33 is a block diagram of an example quantum computing device that may include one or more of quantum circuit assemblies with scalable gate control disclosed herein, in accordance with various embodiments.

FIG. 33 is a block diagram of an example quantum computing device 2000 that may include any of the quantum circuit assemblies with scalable gate control as disclosed herein, or any combinations of various embodiments of such quantum circuit assemblies or portions thereof. Several components are illustrated in FIG. 33 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuit assemblies with scalable gate control as described herein. In some embodiments, various ones of these components may be fabricated onto a single System-On-Chip (SOC) die. Additionally, in various embodiments, the quantum computing device 2000 may not include one or more of the components illustrated in FIG. 33, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum circuit assemblies with scalable gate control as disclosed herein and may perform data processing by performing operations on the qubits that may be generated in the quantum circuit assemblies 300 and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-M RAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum circuit assembly that includes a pulse control assembly. The pulse control assembly includes a signal path (e.g., one of the signal paths 322) for applying a signal pulse to a terminal (e.g., one of the terminals 312) of a qubit device (e.g., a qubit device 310), the signal path including a first capacitor (C1) and a second capacitor (C2), where the first capacitor is coupled to the terminal; and a switch arrangement (e.g., a configuration of the switches S, described herein), configured to operate the signal path in one of a first phase, a second phase, or a third phase. In such a pulse control assembly, in the first phase, the second capacitor is decoupled from the first capacitor and the first capacitor is configured to charge to a first voltage, the first voltage indicative of a static DC signal to be applied to the terminal; in the second phase, following the first phase, the second capacitor is decoupled from the first capacitor and the second capacitor is configured to charge to a second voltage, the second voltage indicative of the signal pulse to be applied to the terminal; and in the third phase, following the second phase, the second capacitor is coupled to the first capacitor to apply the signal pulse to the terminal by virtue of the first capacitor being coupled to the terminal.

Example 2 provides the quantum circuit assembly according to example 1, where, in the third phase, the second capacitor is coupled in electrical series with the first capacitor.

Example 3 provides the quantum circuit assembly according to examples 1 or 2, where the switch arrangement is configured to operate the signal path so that, in the first phase, a first capacitor electrode of the first capacitor is coupled to the terminal, a second capacitor electrode of the first capacitor is coupled to a reference potential (e.g., the ground potential), and a first signal source configured to provide a signal to charge the first capacitor to the first voltage is coupled to the first capacitor electrode of the first capacitor.

Example 4 provides the quantum circuit assembly according to example 3, where the first signal source is a first DAC.

Example 5 provides the quantum circuit assembly according to example 4, where the qubit device is one of one or more qubit devices that include a plurality of terminals, the terminal is a first terminal of the plurality of terminals, the signal path is one of a plurality of signal paths, each including a respective pair of the first capacitor and the second capacitor, the first capacitors of different ones of the plurality of signal paths are coupled to different (i.e., respective) ones of the plurality of terminals, the quantum circuit assembly further includes a first multiplexer having an input coupled to an output of the first DAC, and the first multiplexer is configured to couple the output of the first DAC to the first capacitor electrode of the first capacitor of one of the signal paths when the one of the signal paths is operated in the first phase.

Example 6 provides the quantum circuit assembly according to example 4, where the qubit device is one of one or more qubit devices that include a plurality of terminals, the terminal is a first terminal of the plurality of terminals, the plurality of terminals further includes a further terminal (which may be a terminal of the same qubit device as the first terminal, or of a different qubit device than the one with the first terminal), the quantum circuit assembly further includes a further signal path for applying a further signal pulse to the further terminal, the further signal path including a further first capacitor and a further second capacitor, where the further first capacitor is coupled to the further terminal, the switch arrangement is configured to operate the further signal path in one of the first phase, the second phase, or the third phase. In the first phase, the further second capacitor is decoupled from the further first capacitor and the further first capacitor is configured to charge to a further first voltage, the further first voltage indicative of a further static DC signal to be applied to the further terminal; in the second phase, following the first phase, the further second capacitor is decoupled from the further first capacitor and the further second capacitor is configured to charge to a further second voltage, the further second voltage indicative of the further signal pulse to be applied to the further terminal; and in the third phase, following the second phase, the further second capacitor is coupled to the further first capacitor to apply the further signal pulse to the further terminal by virtue of the further first capacitor being coupled to the further terminal. The quantum circuit assembly further includes a first multiplexer having an input coupled to an output of the first DAC, where the first multiplexer is configured to couple the output of the first DAC to the first capacitor electrode of the first capacitor when the signal path is operated in the first phase and couple the output of the first DAC to a first capacitor electrode of the further first capacitor when the further signal path is operated in the first phase.

Example 7 provides the quantum circuit assembly according to examples 5 or 6, further including one or more of the first signal source and the first multiplexer.

Example 8 provides the quantum circuit assembly according to example 6, where the signal path and the further signal path are signal paths of a plurality of signal paths that the switch arrangement is configured to operate in one of the first phase, the second phase, or the third phase, and the switch arrangement is configured to operate in the first phase a single signal path of the plurality of signal paths at a time (in this manner, a single first DAC may be re-used or shared, by means of the first multiplexer, to sequentially charge the first capacitors of different signal paths).

Example 9 provides the quantum circuit assembly according to example 4, where the qubit device is one of one or more qubit devices that include a plurality of terminals, the terminal is one of the plurality of terminals, the signal path is one of a plurality of signal paths that the switch arrangement is configured to operate in one of the first phase, the second phase, or the third phase, where each of the plurality of signal paths includes a respective pair of the first capacitor and the second capacitor and where the first capacitors of different ones of the plurality of signal paths are coupled to different (i.e., respective) ones of the plurality of terminals, the quantum circuit assembly further includes a first multiplexer having an input coupled to an output of the first DAC, and the first multiplexer is configured to selectively couple the output of the first DAC to the first capacitor of one of the plurality of signal paths at a time (in this manner, a single first DAC may be re-used or shared, by means of the first multiplexer, to sequentially charge the first capacitors of different signal paths).

Example 10 provides the quantum circuit assembly according to any one of the preceding examples, where the switch arrangement is configured to operate the signal path so that, in the second phase, a second signal source configured to provide a signal to charge the second capacitor to the second voltage is coupled to a first capacitor electrode of the second capacitor, and a second capacitor electrode of the second capacitor is coupled to a reference potential (e.g., the ground potential).

Example 11 provides the quantum circuit assembly according to example 10, where the second signal source is a second DAC.

Example 12 provides the quantum circuit assembly according to example 11, where the qubit device is one of one or more qubit devices that include a plurality of terminals, the terminal is a first terminal of the plurality of terminals, the signal path is one of a plurality of signal paths, each including a respective pair of the first capacitor and the second capacitor, the first capacitors of different ones of the plurality of signal paths are coupled to different (i.e., respective) ones of the plurality of terminals, the quantum circuit assembly further includes a second multiplexer having an input coupled to an output of the second DAC, and the second multiplexer is configured to couple the output of the second DAC to the first capacitor electrode of the second capacitor of one of the signal paths when the one of the signal paths is operated in the second phase.

Example 13 provides the quantum circuit assembly according to example 11, where the qubit device is one of one or more qubit devices that include a plurality of terminals, the terminal is a first terminal of the plurality of terminals, the plurality of terminals further includes a further terminal (which may be a terminal of the same qubit device as the first terminal, or of a different qubit device than the one with the first terminal), the quantum circuit assembly further includes a further signal path for applying a further signal pulse to the further terminal, the further signal path including a further first capacitor and a further second capacitor, where the further first capacitor is coupled to the further terminal, the switch arrangement is configured to operate the further signal path in one of the first phase, the second phase, or the third phase. In the first phase, the further second capacitor is decoupled from the further first capacitor and the further first capacitor is configured to charge to a further first voltage, the further first voltage indicative of a further static DC signal to be applied to the further terminal; in the second phase, following the first phase, the further second capacitor is decoupled from the further first capacitor and the further second capacitor is configured to charge to a further second voltage, the further second voltage indicative of the further signal pulse to be applied to the further terminal; and, in the third phase, following the second phase, the further second capacitor is coupled to the further first capacitor to apply the further signal pulse to the further terminal by virtue of the further first capacitor being coupled to the further terminal. The quantum circuit assembly further includes a second multiplexer having an input coupled to an output of the second DAC, where the second multiplexer is configured to couple the output of the second DAC to the first capacitor electrode of the second capacitor when the signal path is operated in the second phase and couple the output of the second DAC to a first capacitor electrode of the further second capacitor when the further signal path is operated in the second phase.

Example 14 provides the quantum circuit assembly according to examples 12 or 13, further including one or more of the second signal source and the second multiplexer.

Example 15 provides the quantum circuit assembly according to example 13, where:
the signal path and the further signal path are signal paths of a plurality of signal paths that the switch arrangement is configured to operate in one of the first phase, the second phase, or the third phase, and the switch arrangement is configured to operate in the second phase a single signal path of the plurality of signal paths at a time (in this manner, a single second DAC may be re-used or shared, by means of the second multiplexer, to sequentially charge the second capacitors of different signal paths).

Example 16 provides the quantum circuit assembly according to example 11, where the qubit device is one of one or more qubit devices that include a plurality of terminals, the terminal is one of the plurality of terminals, the signal path is one of a plurality of signal paths that the switch arrangement is configured to operate in one of the first phase, the second phase, or the third phase, where each of the plurality of signal paths includes a respective pair of the first capacitor and the second capacitor and where the first capacitors of different ones of the plurality of signal paths are coupled to different (i.e., respective) ones of the plurality of terminals, the quantum circuit assembly further includes a second multiplexer having an input coupled to an output of the second DAC, and the second multiplexer is configured to selectively couple the output of the second DAC to the second capacitor of one of the plurality of signal paths at a time (in this manner, a single second DAC may be re-used or shared, by means of the second multiplexer, to sequentially charge the second capacitors of different signal paths).

Example 17 provides the quantum circuit assembly according to any one of the preceding examples, where the switch arrangement is configured to operate the signal path so that, in the second phase, a first capacitor electrode of the first capacitor is coupled to the terminal, and a second capacitor electrode of the first capacitor is coupled to a reference potential (e.g., the ground potential).

Example 18 provides the quantum circuit assembly according to any one of the preceding examples, where the switch arrangement is configured to operate the signal path so that, in the third phase, a first capacitor electrode of the first capacitor is coupled to the terminal, a second capacitor electrode of the first capacitor is coupled to a first capacitor electrode of the second capacitor, and a second capacitor electrode of the second capacitor is coupled to a reference potential (e.g., the ground potential).

Example 19 provides the quantum circuit assembly according to any one of the preceding examples, further including a further signal path for applying a further signal pulse to the terminal, the further signal path including a further first capacitor and a further second capacitor, where the further first capacitor is coupled to the terminal, where the switch arrangement is configured to operate the further signal path in one of the first phase, the second phase, or the third phase. In the first phase, the further second capacitor is decoupled from the further first capacitor and the further first capacitor is configured to charge to a further first voltage, the further first voltage indicative of a further static DC signal to be applied to the terminal; in the second phase, following the first phase, the further second capacitor is decoupled from the further first capacitor and the further second capacitor is configured to charge to a further second voltage, the further second voltage indicative of the further signal pulse to be applied to the terminal; and, in the third phase, following the second phase, the further second capacitor is coupled to the further first capacitor to apply the further signal pulse to the terminal by virtue of the further first capacitor being coupled to the terminal.

Example 20 provides the quantum circuit assembly according to example 19, where the switch arrangement is configured to operate the signal path and the further signal path so that at least one of a time when the signal path is operated in the first phase and a time when the signal path is operated in the second phase at least partially overlaps (or fully overlaps) with a time when the further signal path is operated in the third phase, and/or at least one of a time when the further signal path is operated in the first phase and a time when the further signal path is operated in the second phase at least partially overlaps (or fully overlaps) with a time when the signal path is operated in the third phase.

Example 21 provides a quantum circuit assembly that includes a first capacitor, coupled to a terminal of a qubit device; and a second capacitor, coupled to a switch arrangement. The switch arrangement is configured to, in a first state, decouple the second capacitor and the first capacitor from one another, and, in a second state, couple the second capacitor and the first capacitor. When the switch arrangement is in the first state, the first capacitor is configured to store a first charge and the second capacitor is configured to store a second charge. When the switch arrangement is in the second state, at least a portion of the second charge stored in the second capacitor is applied to the terminal.

Example 22 provides the quantum circuit assembly according to example 21, where, the portion of the second charge stored in the second capacitor is applied to the terminal by virtue of the second capacitor being coupled to the first capacitor.

Example 23 provides the quantum circuit assembly according to examples 21 or 22, where, when the switch arrangement is in the first state, a first capacitor electrode of the first capacitor is coupled to a first signal source configured to provide a signal to cause the first capacitor to store the first charge, and a second capacitor electrode of the first capacitor is coupled to a reference potential (e.g., the ground potential).

Example 24 provides the quantum circuit assembly according to any one of examples 21-23, where, when the switch arrangement is in the first state, a first capacitor electrode of the second capacitor is coupled to a second signal source configured to provide a signal to cause the second capacitor to store the second charge, and a second capacitor electrode of the second capacitor is coupled to a reference potential (e.g., the ground potential).

Example 25 provides the quantum circuit assembly according to any one of examples 21-23, where, when the switch arrangement is in the second state, a first capacitor electrode of the first capacitor is coupled to the terminal, a second capacitor electrode of the first capacitor is coupled to a first capacitor electrode of the second capacitor, and a second capacitor electrode of the second capacitor is coupled to a reference potential (e.g., the ground potential).

Example 26 provides a method of operating a quantum circuit assembly that includes a first capacitor and a second capacitor, where the first capacitor is coupled to a terminal of a qubit device. The method includes, in a first phase, ensuring that the second capacitor is decoupled from the first capacitor and configuring the first capacitor to charge to a first voltage; in a second phase, keeping the second capacitor decoupled from the first capacitor and configuring the second capacitor to charge to a second voltage; and, in the third phase, coupling the second capacitor and the first capacitor.

Example 27 provides the method according to claim 26, where, in the third phase, the second capacitor and the first capacitor are either coupled so as to apply a voltage indicative of a sum of the first voltage and the second voltage or are coupled so as to apply a voltage indicative of a difference between the first voltage and the second voltage.

Example 28 provides the method according to examples 26 or 27, further including processes for operating the quantum circuit assembly according to any one of the preceding examples.

Example 29 provides the method according to any one of the examples 26-29, wherein the quantum circuit assembly is the quantum circuit assembly according to any one of the preceding examples.

Example 30 provides a quantum computing device that includes a quantum processing device, where the quantum processing device includes a quantum circuit assembly according to any one of the preceding examples; a non-quantum processing device, coupled to the quantum processing device, to control voltages applied to a plurality of terminals of the quantum circuit assembly; and a memory device to store data generated during operation of the quantum processing device.

Example 31 provides the quantum computing device according to example 30, further including a cooling apparatus configured to maintain the temperature of the quantum processing device below 5 degrees Kelvin.

Example 32 provides the quantum computing device according to examples 30 or 31, where the memory device is configured to store instructions for a quantum computing algorithm to be executed by the quantum processing device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
   a signal path, comprising a first capacitor and a second capacitor, where the first capacitor is coupled to a terminal of a qubit device of the quantum circuit assembly; and
   a switch arrangement, to operate the signal path in one of a first phase, a second phase, or a third phase, wherein:
      in the first phase, the first capacitor is to charge to a first voltage, and the second capacitor is decoupled from the first capacitor,
      in the second phase, the second capacitor is to charge to a second voltage, and the second capacitor is decoupled from the first capacitor, and
      in the third phase, the second capacitor is coupled to the first capacitor.

2. The quantum circuit assembly according to claim 1, wherein, in the third phase, the second capacitor is coupled in series with the first capacitor.

3. The quantum circuit assembly according to claim 1, wherein, in the first phase:
   a first capacitor electrode of the first capacitor is coupled to the terminal,
   a second capacitor electrode of the first capacitor is coupled to a reference potential, and
   a first signal source is coupled to the first capacitor electrode of the first capacitor,
   wherein the first signal source is a signal source to provide a signal to charge the first capacitor to the first voltage.

4. The quantum circuit assembly according to claim 3, wherein the first signal source includes a first digital-to-analog converter (DAC).

5. The quantum circuit assembly according to claim 3, wherein:
   the qubit device is one of one or more qubit devices that include a plurality of terminals,
   the terminal is a first terminal of the plurality of terminals,
   the signal path is one of a plurality of signal paths, each comprising a respective pair of the first capacitor and the second capacitor,
   the first capacitors of different ones of the plurality of signal paths are coupled to different ones of the plurality of terminals,
   the quantum circuit assembly further includes a first multiplexer having an input coupled to an output of the first signal source, and
   the first multiplexer is to couple the output of the first signal source to the first capacitor electrode of the first capacitor of one of the signal paths when the one of the signal paths is operated in the first phase.

6. The quantum circuit assembly according to claim 3, wherein:
   the qubit device is one of one or more qubit devices that include a plurality of terminals,
   the terminal is one of the plurality of terminals,
   the signal path is one of a plurality of signal paths that the switch arrangement is to operate in one of the first phase, the second phase, or the third phase, where each of the plurality of signal paths includes a respective pair of the first capacitor and the second capacitor and where the first capacitors of different ones of the plurality of signal paths are coupled to different ones of the plurality of terminals,
   the quantum circuit assembly further includes a first multiplexer having an input coupled to an output of the first signal source, and
   the first multiplexer is to selectively couple the output of the first signal source to the first capacitor of one of the plurality of signal paths at a time.

7. The quantum circuit assembly according to claim 1, wherein, in the second phase:
   a second signal source is coupled to a first capacitor electrode of the second capacitor, and
   a second capacitor electrode of the second capacitor is coupled to a reference potential,
   wherein the second signal source is a signal source to provide a signal to charge the second capacitor to the second voltage.

8. The quantum circuit assembly according to claim 7, wherein the second signal source includes a second digital-to-analog converter (DAC).

9. The quantum circuit assembly according to claim 7, wherein:
   the qubit device is one of one or more qubit devices that include a plurality of terminals,
   the terminal is a first terminal of the plurality of terminals,
   the signal path is one of a plurality of signal paths, each comprising a respective pair of the first capacitor and the second capacitor,
   the first capacitors of different ones of the plurality of signal paths are coupled to different ones of the plurality of terminals,
   the quantum circuit assembly further includes a second multiplexer having an input coupled to an output of the second signal source, and
   the second multiplexer is to couple the output of the second signal source to the first capacitor electrode of the second capacitor of one of the signal paths when the one of the signal paths is operated in the second phase.

10. The quantum circuit assembly according to claim 7, wherein:
    the qubit device is one of one or more qubit devices that include a plurality of terminals,
    the terminal is one of the plurality of terminals,
    the signal path is one of a plurality of signal paths that the switch arrangement is to operate in one of the first phase, the second phase, or the third phase, where each of the plurality of signal paths includes a respective pair of the first capacitor and the second capacitor and where the first capacitors of different ones of the plurality of signal paths are coupled to different ones of the plurality of terminals,
    the quantum circuit assembly further includes a second multiplexer having an input coupled to an output of the second signal source, and
    the second multiplexer is to selectively couple the output of the second signal source to the second capacitor of one of the plurality of signal paths at a time.

11. The quantum circuit assembly according to claim 1, wherein, in the second phase:
    a first capacitor electrode of the first capacitor is coupled to the terminal, and
    a second capacitor electrode of the first capacitor is coupled to a reference potential.

12. The quantum circuit assembly according to claim 1, wherein, in the third phase:
- a first capacitor electrode of the first capacitor is coupled to the terminal,
- a second capacitor electrode of the first capacitor is coupled to a first capacitor electrode of the second capacitor, and
- a second capacitor electrode of the second capacitor is coupled to a reference potential.

13. The quantum circuit assembly according to claim 1, further comprising a further signal path for applying a further signal pulse to the terminal, the further signal path comprising a further first capacitor and a further second capacitor, where the further first capacitor is coupled to the terminal, wherein the switch arrangement is to operate the further signal path in one of the first phase, the second phase, or the third phase, and wherein:
- in the first phase, the further first capacitor is to charge to a further first voltage, and the further second capacitor is decoupled from the further first capacitor,
- in the second phase, the further second capacitor is to charge to a further second voltage, and the further second capacitor is decoupled from the further first capacitor, and
- in the third phase, the further second capacitor is coupled to the further first capacitor.

14. The quantum circuit assembly according to claim 13, wherein:
- at least one of a time when the signal path is in the first phase and a time when the signal path is in the second phase at least partially overlaps with a time when the further signal path is in the third phase, or
- at least one of a time when the further signal path is in the first phase and a time when the further signal path is in the second phase at least partially overlaps with a time when the signal path is in the third phase.

15. A quantum circuit assembly, comprising:
- a first capacitor, coupled to a terminal of a qubit device; and
- a second capacitor, coupled to a switch arrangement that is to, in a first state, decouple the second capacitor and the first capacitor from one another, and, in a second state, couple the second capacitor and the first capacitor, wherein:
- when the switch arrangement is in the first state, the first capacitor is to store a first charge and the second capacitor is to store a second charge, and
- when the switch arrangement is in the second state, at least a portion of the second charge stored in the second capacitor is to be applied to the terminal.

16. The quantum circuit assembly according to claim 15, wherein, when the switch arrangement is in the first state;
- a first capacitor electrode of the first capacitor is coupled to a first signal source, wherein the first signal source is to provide a signal to cause the first capacitor to store the first charge, and
- a second capacitor electrode of the first capacitor is coupled to a reference potential.

17. The quantum circuit assembly according to claim 15, wherein, when the switch arrangement is in the first state;
- a first capacitor electrode of the second capacitor is coupled to a second signal source, wherein the second signal source is to provide a signal to cause the second capacitor to store the second charge, and
- a second capacitor electrode of the second capacitor is coupled to a reference potential.

18. The quantum circuit assembly according to claim 15, wherein, when the switch arrangement is in the second state:
- a first capacitor electrode of the first capacitor is coupled to the terminal,
- a second capacitor electrode of the first capacitor is coupled to a first capacitor electrode of the second capacitor, and
- a second capacitor electrode of the second capacitor is coupled to a reference potential.

19. A method of operating a quantum circuit assembly that includes a first capacitor and a second capacitor, where the first capacitor is coupled to a terminal of a qubit device, the method comprising:
- in a first phase, decoupling the second capacitor and the first capacitor, and configuring the first capacitor to charge to a first voltage;
- in a second phase, decoupling the second capacitor and the first capacitor, and configuring the second capacitor to charge to a second voltage;
- in a third phase, coupling the second capacitor and the first capacitor.

20. The method according to claim 19, wherein, in the third phase, the second capacitor and the first capacitor are:
- either coupled to apply a voltage indicative of a sum of the first voltage and the second voltage,
- or coupled to apply a voltage indicative of a difference between the first voltage and the second voltage.

* * * * *

UNITED STATES PATENT AND TRADEMARK OFFICE
CERTIFICATE OF CORRECTION

| | |
|---|---|
| PATENT NO. | : 12,248,848 B2 |
| APPLICATION NO. | : 17/340173 |
| DATED | : March 11, 2025 |
| INVENTOR(S) | : Sushil Subramanian et al. |

It is certified that error appears in the above-identified patent and that said Letters Patent is hereby corrected as shown below:

On the Title Page

On Page 2, in Item (56), under "Other Publications", in Column 2, Line 10, delete "Ofengineering" and insert -- of engineering --, therefor.

In the Claims

In Column 54, Claim 16, Line 5, delete "state;" and insert -- state: --, therefor.

In Column 54, Claim 17, Line 13, delete "state;" and insert -- state: --, therefor.

Signed and Sealed this
Fifteenth Day of April, 2025

Coke Morgan Stewart
*Acting Director of the United States Patent and Trademark Office*